United States Patent
Jinbo et al.

(10) Patent No.: US 8,187,956 B2
(45) Date of Patent: May 29, 2012

(54) METHOD FOR MANUFACTURING MICROCRYSTALLINE SEMICONDUCTOR FILM, THIN FILM TRANSISTOR HAVING MICROCRYSTALLINE SEMICONDUCTOR FILM, AND PHOTOELECTRIC CONVERSION DEVICE HAVING MICROCRYSTALLINE SEMICONDUCTOR FILM

(75) Inventors: Yasuhiro Jinbo, Atsugi (JP); Hidekazu Miyairi, Isehara (JP); Koji Dairiki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 190 days.

(21) Appl. No.: 12/277,378

(22) Filed: Nov. 25, 2008

(65) Prior Publication Data
US 2009/0142909 A1 Jun. 4, 2009

(30) Foreign Application Priority Data
Dec. 3, 2007 (JP) ................. 2007-312670

(51) Int. Cl.
*C30B 25/00* (2006.01)
*H01L 21/20* (2006.01)
(52) U.S. Cl. .......... 438/486; 438/719; 438/507; 117/97; 117/103
(58) Field of Classification Search ................. 438/726, 438/486–487, 507–509, 719, 729, 705; 117/97, 117/10, 951
See application file for complete search history.

(56) References Cited

U.S. PATENT DOCUMENTS

| | | | | |
|---|---|---|---|---|
| 2,968,866 | A | * | 1/1961 | Soper et al. ............... 438/465 |
| 4,251,287 | A | * | 2/1981 | Dalal ........................ 136/258 |
| 4,345,248 | A | | 8/1982 | Togashi et al. |
| 4,409,134 | A | | 10/1983 | Yamazaki |
| 4,727,044 | A | * | 2/1988 | Yamazaki ................. 438/166 |
| 4,859,553 | A | * | 8/1989 | Jansen et al. ............. 430/57.4 |

(Continued)

FOREIGN PATENT DOCUMENTS
EP 1 505 174 2/2005
(Continued)

OTHER PUBLICATIONS

"Hydrogen elimination and phase transitions in pulsed-gas plasma deposition of amorphous and microcrystalline silicon" by Srinivasan et al. Published J. Appl. Phys. 81 (6) p. 2847 Mar. 15, 1997.*

(Continued)

*Primary Examiner* — Thao Le
*Assistant Examiner* — Allen Parker
(74) *Attorney, Agent, or Firm* — Eric J. Robinson; Robinson Intellectual Property Law Office, P.C.

(57) ABSTRACT

A method for forming a microcrystalline semiconductor film over a base formed of a different material, which has high crystallinity in the entire film and at an interface with the base, is proposed. Further, a method for manufacturing a thin film transistor including a microcrystalline semiconductor film with high crystallinity is proposed. Furthermore, a method for manufacturing a photoelectric conversion device including a microcrystalline semiconductor film with high crystallinity is proposed. By forming crystal nuclei with high density and high crystallinity over a base film and then growing crystals in a semiconductor from the crystal nuclei, a microcrystalline semiconductor film which has high crystallinity at an interface with the base film, which has high crystallinity in crystal grains, and which has high adhesion between the adjacent crystal grains is formed.

8 Claims, 33 Drawing Sheets

U.S. PATENT DOCUMENTS

| | | |
|---|---|---|
| RE34,658 E | 7/1994 | Yamazaki et al. |
| 5,453,858 A | 9/1995 | Yamazaki |
| 5,514,879 A | 5/1996 | Yamazaki |
| 5,614,732 A | 3/1997 | Yamazaki |
| 5,701,167 A | 12/1997 | Yamazaki |
| 5,766,989 A | 6/1998 | Maegawa et al. |
| 5,843,225 A | 12/1998 | Takayama et al. |
| 5,849,601 A | 12/1998 | Yamazaki |
| 5,859,445 A | 1/1999 | Yamazaki |
| 5,932,302 A | 8/1999 | Yamazaki et al. |
| 6,011,277 A | 1/2000 | Yamazaki |
| 6,023,075 A | 2/2000 | Yamazaki |
| 6,171,674 B1 | 1/2001 | Yamazaki et al. |
| 6,183,816 B1 | 2/2001 | Yamazaki et al. |
| 6,218,702 B1 | 4/2001 | Yamazaki et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,410,372 B2 | 6/2002 | Flewitt |
| 6,468,617 B1 | 10/2002 | Yamazaki et al. |
| 6,483,124 B2 | 11/2002 | Flewitt |
| 6,589,822 B1 | 7/2003 | Yamazaki et al. |
| 6,610,142 B1 | 8/2003 | Takayama et al. |
| 6,737,676 B2 | 5/2004 | Yamazaki |
| 6,835,523 B1 | 12/2004 | Yamazaki et al. |
| 6,855,621 B2 | 2/2005 | Kondo et al. |
| 7,067,844 B2 | 6/2006 | Yamazaki |
| 7,098,479 B1 | 8/2006 | Yamazaki |
| 7,115,902 B1 | 10/2006 | Yamazaki |
| 2003/0162373 A1 | 8/2003 | Goto et al. |
| 2003/0234369 A1 | 12/2003 | Glukhoy |
| 2005/0022864 A1 | 2/2005 | Fujioka et al. |
| 2005/0089648 A1 | 4/2005 | Yamazaki et al. |
| 2005/0205880 A1* | 9/2005 | Anzai et al. .................. 257/83 |
| 2006/0119554 A1* | 6/2006 | Kawae .......................... 345/77 |
| 2006/0238132 A1 | 10/2006 | Kitamura et al. |
| 2006/0240602 A1 | 10/2006 | Roca I Cabarrocas et al. |
| 2007/0004220 A1* | 1/2007 | Tran Quoc et al. .......... 438/758 |
| 2007/0013842 A1* | 1/2007 | Yang et al. ................... 349/114 |
| 2007/0018165 A1 | 1/2007 | Yamazaki |
| 2007/0138475 A1 | 6/2007 | Kitakado et al. |
| 2008/0308807 A1 | 12/2008 | Yamazaki et al. |
| 2009/0023236 A1 | 1/2009 | Miyairi et al. |
| 2009/0072237 A1 | 3/2009 | Yamazaki et al. |
| 2009/0139447 A1 | 6/2009 | Toriumi |

FOREIGN PATENT DOCUMENTS

| | | |
|---|---|---|
| JP | 62-062073 | 12/1987 |
| JP | 02-053941 | 11/1990 |
| JP | 04-242724 | 8/1992 |
| JP | 11-121761 | 4/1999 |
| JP | 2000-277439 | 10/2000 |
| JP | 2004-014958 | 1/2004 |
| JP | 2005-049832 | 2/2005 |
| JP | 2005-049832 A | 2/2005 |
| JP | 2005-050905 | 2/2005 |
| JP | 2005-167051 | 6/2005 |
| JP | 2007-005705 | 1/2007 |
| JP | 2007-048982 | 2/2007 |

OTHER PUBLICATIONS

Arai et al., "41.2: Micro Silicon Technology for Active Matrix OLED Display," SID Digest '07: SID International Symposium Digest of Technical Papers, 2007, vol. XXXVIII pp. 1370-1373.

Sazonov et al., "Low-Temperature Materials and Thin Film Transistors for Flexible Electronics," Proceedings of the IEEE, Aug. 2005, vol. 93, No. 8, pp. 1420-1428.

Lee, et al., "Top-Gate TFTs Using 13.56MHz PECVD Microcrystalline Silicon," IEEE Electron Device Letters, vol. 26, No. 9, Sep. 5, 2005, pp. 637-639.

Lee, et al., "Postdeposition Thermal Annealing and Material Stability of 75° C. Hydrogenated Nanocrystalline Silicon Plasma-Enhanced Chemical Vapor Deposition Films," Journal of Applied Physics, Aug. 4, 2005, vol. 98, pp. 034305-1-034305-7.

Esmaeili-Rad, et al., "Stability of Nanocrystalline Silicon Bottom-Gate Thin Film Transistors with Silicon Nitride Gate Dielectric," Journal of Applied Physics, Sep. 28, 2007, vol. 102, pp. 064512-1-064512-7.

Esmaeili-Rad, et al., "Absence of Defect State Creation in Nanocrystalline Silicon Thin Film Transistors Deduced from Constant Current Stress Measurements," Applied Physics Letters, Sep. 12, 2007, vol. 91, pp. 113511-1-113511-3.

Lee, et al., "Leakage Current Mechanisms in Top-Gate Nanocrystalline Silicon Thin Film Transistors," Applied Physics Letters, Feb. 28, 2008, vol. 92, pp. 083509-1-083509-3.

Lee, et al., "Stability of nc-Si:H TFTs with Silicon Nitride Gate Dielectric," IEEE Transactions on Electron Devices, Jan. 2007, vol. 54, No. 1, pp. 45-51.

* cited by examiner

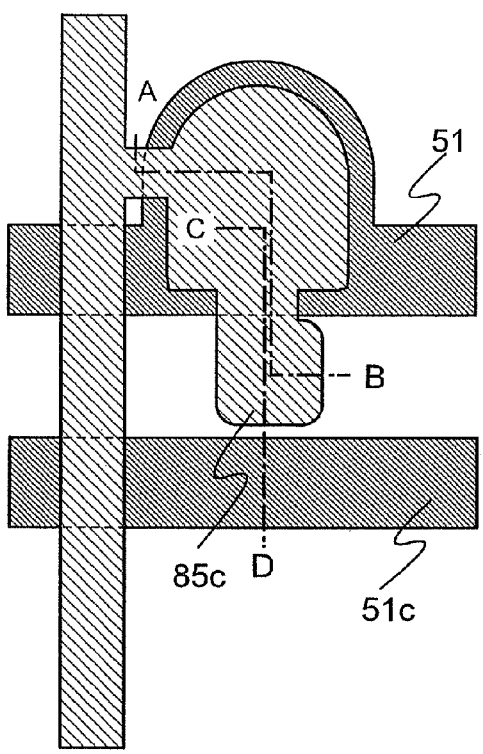
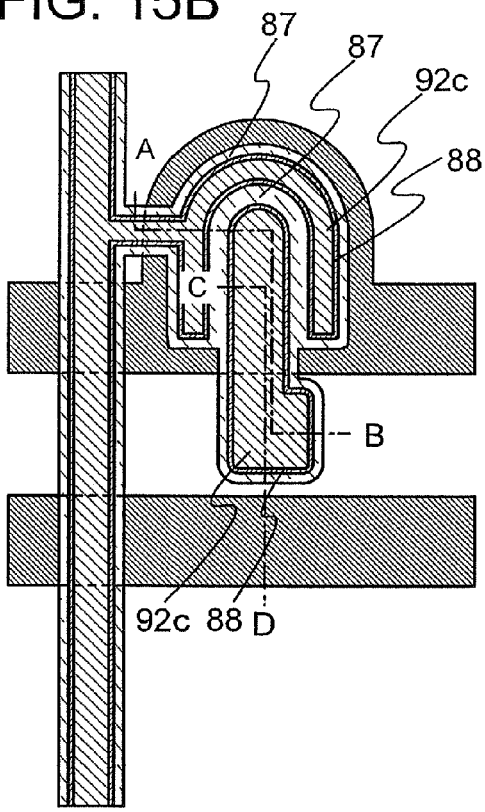
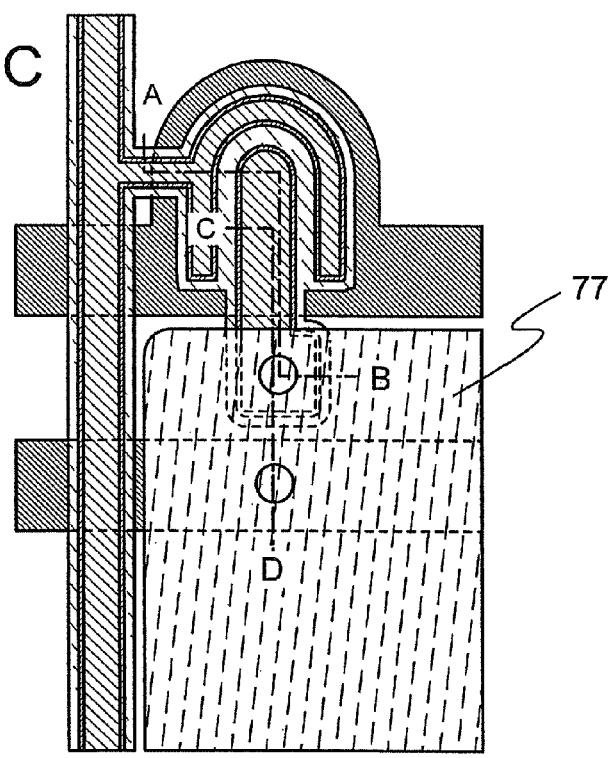

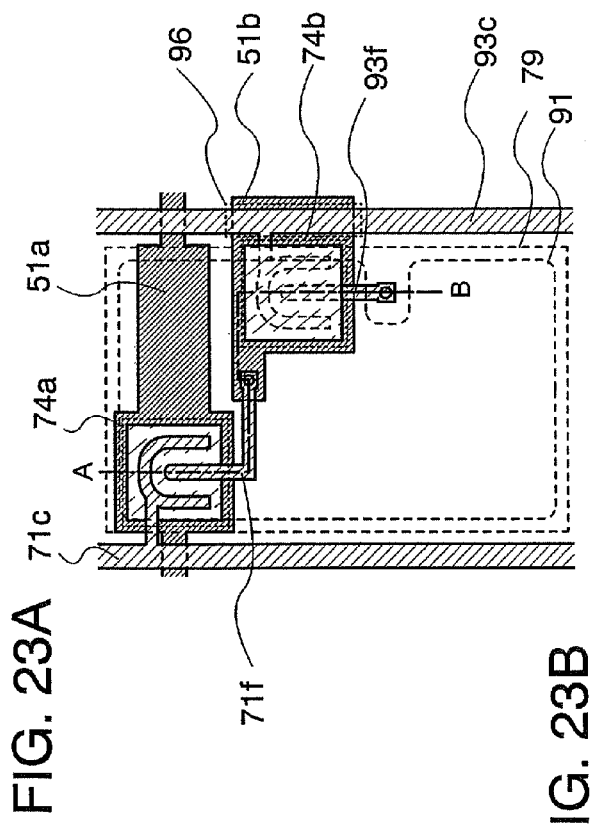
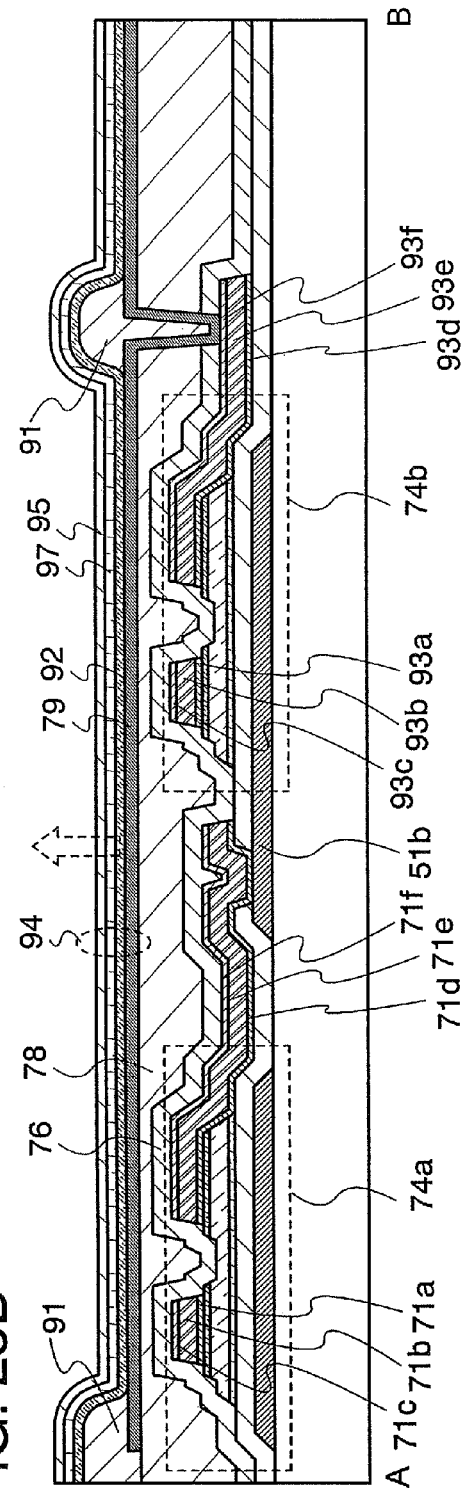
FIG. 23A
FIG. 23B

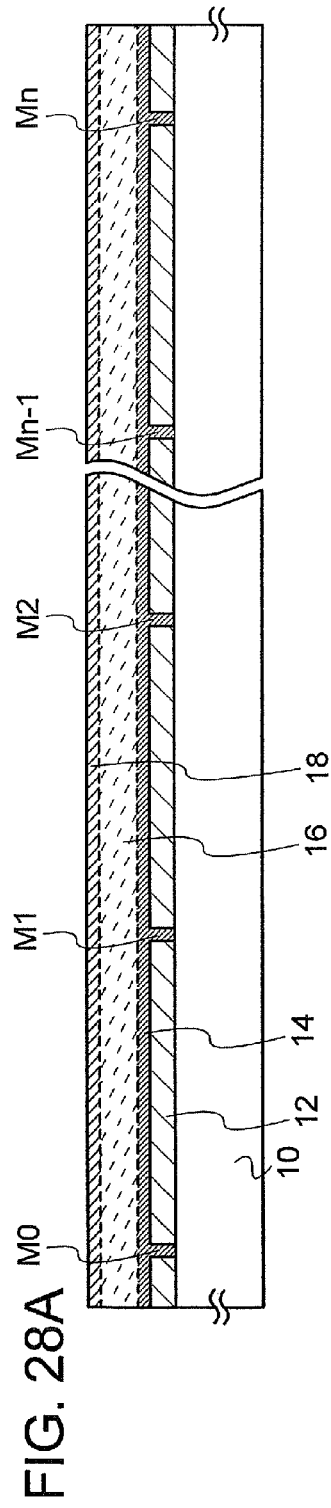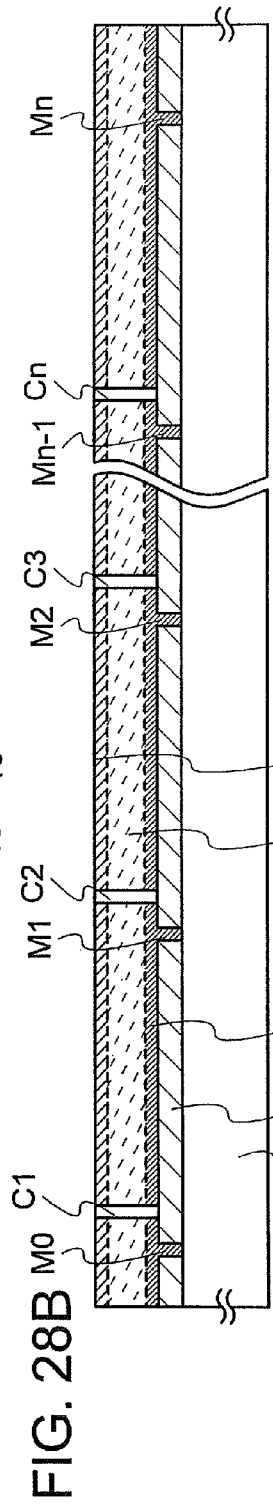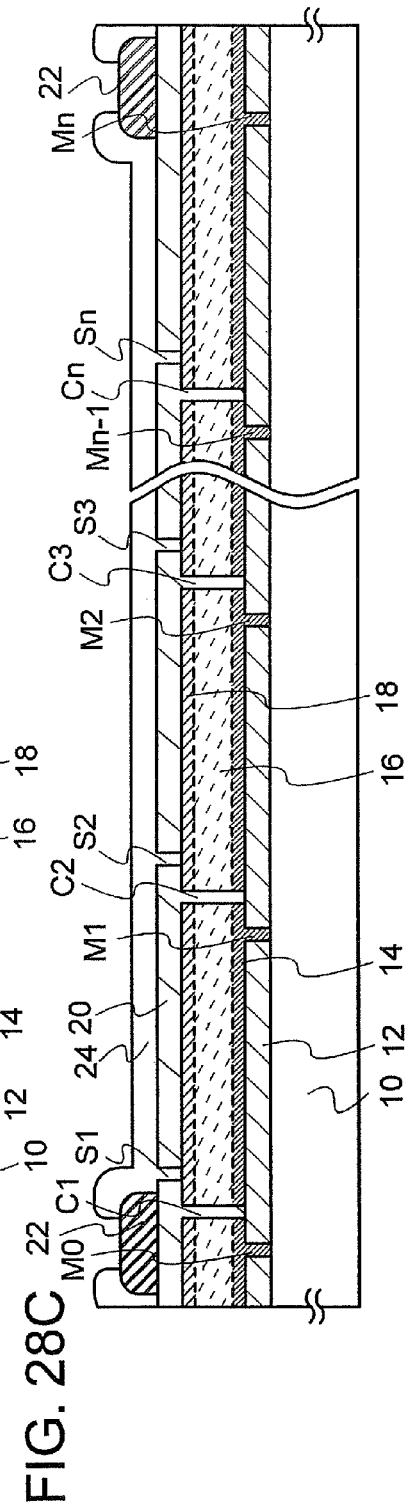

METHOD FOR MANUFACTURING MICROCRYSTALLINE SEMICONDUCTOR FILM, THIN FILM TRANSISTOR HAVING MICROCRYSTALLINE SEMICONDUCTOR FILM, AND PHOTOELECTRIC CONVERSION DEVICE HAVING MICROCRYSTALLINE SEMICONDUCTOR FILM

BACKGROUND OF THE INVENTION

1. Field of the Invention

The present invention relates to a method for manufacturing a microcrystalline semiconductor film, a method for manufacturing a thin film transistor having the microcrystalline semiconductor film, and a method for manufacturing a photoelectric conversion device having at least one pair of semiconductor junctions in the microcrystalline semiconductor film.

2. Description of the Related Art

In recent years, technology for forming thin film transistors using a thin semiconductor film (with a thickness of from several tens of nanometers to several hundred nanometers, approximately) formed over a substrate having an insulating surface has been attracting attention. Thin film transistors are applied to a wide range of electronic devices such as ICs or electro-optical devices, and prompt development of thin film transistors that are to be used as switching elements in image display devices, in particular, is being pushed.

As a switching element in an image display device, a thin film transistor including an amorphous semiconductor film, a thin film transistor including a polycrystalline semiconductor film having a crystal grain of 100 nm or more, or the like is used. As a method for forming a polycrystalline semiconductor film, a technique is known in which a pulsed excimer laser beam is processed into a linear shape with an optical system, and an amorphous silicon film is scanned and irradiated with the linear beam to be crystallized.

In addition, as a switching element in an image display device, a thin film transistor using a microcrystalline semiconductor film is used (Reference 1: Japanese Published Patent Application No. H4-242724 and Reference 2: Japanese Published Patent Application No. 2005-49832).

Further, development of a photoelectric conversion device has been proceeding, in which microcrystalline silicon as crystal-system silicon capable of being manufactured by a plasma CVD method is used as a photoelectric conversion layer (e.g., see Reference 3: Japanese Published Patent Application No. 2000-277439).

SUMMARY OF THE INVENTION

A thin film transistor including a polycrystalline semiconductor film has advantages that the mobility thereof is two or more orders of magnitude higher than that of a thin film transistor including an amorphous semiconductor film, and that a pixel portion and a peripheral driver circuit of a semiconductor display device can be formed over one substrate. However, the thin film transistor including a polycrystalline semiconductor film requires a more complicated process than the thin film transistor including an amorphous semiconductor film because of crystallization of the semiconductor film. Thus, there are problems such as reduction in yield and increase in cost.

Furthermore, in the case where a microcrystalline semiconductor film is formed over a different material, crystallinity of the microcrystalline semiconductor film is low at an interface. Thus, an inverted staggered thin film transistor including the microcrystalline semiconductor film has a problem in that the crystallinity of an interface region between a gate insulating film and the microcrystalline semiconductor film is low. In addition, a photoelectric conversion device has a problem in that the crystallinity of an interface between an electrode and the microcrystalline semiconductor film is low.

In view of the problems, it is an object of the present invention to propose a method for forming a microcrystalline semiconductor film, over a base formed of a different material, which has high crystallinity in the entire film and at an interface with the base. In addition, it is another object to propose a method for manufacturing a thin film transistor including a microcrystalline semiconductor film having high crystallinity. Furthermore, it is another object to propose a method for manufacturing a photoelectric conversion device including a microcrystalline semiconductor film having high crystallinity.

After crystal nuclei having high density and high crystallinity are formed over a base film, crystals of a semiconductor are grown from crystal nuclei, so that a microcrystalline semiconductor film having high crystallinity at an interface with the base film, high adhesion between adjacent crystal grains, and high crystallinity of crystal grains is formed.

A semiconductor film is formed over a base film, and then the semiconductor film is irradiated with plasma, whereby the semiconductor film is partly etched, so that crystal nuclei having high crystallinity can be formed at high density. Then, a microcrystalline semiconductor film is formed, over the base film, which has high adhesion at an interface with the base film, high adhesion between crystal grains, and high crystallinity is formed by a plasma CVD method using a deposition gas including silicon or germanium, a fluoride gas or fluorine, and hydrogen as a source gas.

As a semiconductor film formed over a base film, an amorphous semiconductor film or a microcrystalline semiconductor film is formed by a sputtering method, a CVD method, or the like.

As for plasma for irradiating a semiconductor film, at least one of hydrogen, fluorine, and fluoride is introduced into a reaction chamber of a plasma CVD apparatus, and high-frequency power is applied, whereby plasma is generated. The plasma at least includes hydrogen plasma or fluorine plasma, and an amorphous semiconductor component in a semiconductor film formed over a base film is etched. In particular, in the case where a semiconductor film is a microcrystalline semiconductor film, crystal grains of the microcrystalline semiconductor film are small. Accordingly, an amorphous semiconductor component which fills a space between the crystal grains is etched so that crystal nuclei having high crystallinity can be left at high density. In addition, in the case where a semiconductor film formed over a base film is an amorphous semiconductor film, an amorphous semiconductor component is etched and the amorphous semiconductor component is partly crystallized so that fine crystal nuclei can be formed at high density. Thus, an amorphous semiconductor component at an interface with the base film is also etched by plasma. Accordingly, crystal nuclei having high crystallinity can be formed at high density over the base film.

Crystals are grown from crystal nuclei by a plasma CVD method using a deposition gas including silicon or germanium; a fluoride gas or fluorine; and hydrogen as a source gas. If a fluoride gas or fluorine is used in addition to hydrogen and a deposition gas including silicon or germanium, an amorphous semiconductor component in a region where crystals grow is etched by fluorine radicals when crystals grow from crystal nuclei. Thus, crystals with high crystallinity grow. In this case, if the density of crystal nuclei is high, a distance between adjacent crystal nuclei is short and crystal grains are connected with each other when crystals grow. After that, crystals grow in the direction of a normal line with respect to a surface of a base film, and thus a microcrystalline semiconductor film which has column-like crystal grains closely connected with each other can be formed. Further, because crystals grow from crystal nuclei over the base film, a microcrystalline semiconductor film which has high crystallinity in the entire film and at an interface with the base film can be formed.

Note that, before a semiconductor film is formed over a base film, at least one of fluorine, a fluoride gas, and hydrogen is introduced into a reaction chamber of a plasma CVD apparatus, and high-frequency power is applied, whereby plasma is generated, so that the base film may be partly etched. Through the etching, the base film can have an uneven surface. A semiconductor film is formed over the base film having the uneven surface and the semiconductor film is exposed to plasma, whereby the plasma density is likely to be distributed. Thus, the density of crystal nuclei is easily increased, whereby a microcrystalline semiconductor film which has column-like crystal grains closely connected with each other can be formed.

In addition, an impurity element which serves as a donor may be added to a microcrystalline semiconductor film. By adding an impurity element which serves as a donor to a microcrystalline semiconductor film, the crystallinity of the microcrystalline semiconductor film is improved, the conductivity of the microcrystalline semiconductor film is improved, and the crystallinity of the microcrystalline semiconductor film at an interface with a base film can be improved.

As a method for adding an impurity element which serves as a donor to a microcrystalline semiconductor film, the impurity element which serves as a donor may be added to a base film, a semiconductor film, or a microcrystalline semiconductor film. In the case where an impurity element which serves as a donor is added to a base film, before the base film is formed, a gas including an impurity element which serves as a donor is supplied into a reaction chamber, whereby the impurity element which serves as a donor is adsorbed onto an inner wall of the reaction chamber and a base member of a base film. Alternatively, in addition to a source gas of a base film, a gas including an impurity element which serves as a donor may be introduced.

In the case where an impurity element which serves as a donor is added to a semiconductor film, before the semiconductor film is formed, a gas including an impurity element which serves as a donor is supplied into a reaction chamber, whereby the impurity element which serves as a donor may be adsorbed onto an inner wall of the reaction chamber and a base member of a base film. Alternatively, in addition to a source gas of a semiconductor film, a gas including an impurity element which serves as a donor may be introduced. Further, when a semiconductor film is etched, plasma is generated using a gas including an impurity element which serves as a donor in addition to at least one of fluorine, a fluoride gas, and hydrogen, so that an amorphous semiconductor component in the semiconductor film may be etched by hydrogen radicals or fluorine radicals and the impurity element which serves as a donor may be added to a semiconductor film which is etched.

In the case where an impurity element which serves as a donor is added to a microcrystalline semiconductor film, before the microcrystalline semiconductor film is formed, a gas including an impurity element which serves as a donor is supplied into a reaction chamber, whereby the impurity element which serves as a donor may be adsorbed onto an inner wall of the reaction chamber, a base film, and a semiconductor film which is etched. Alternatively, in addition to a source gas of a microcrystalline semiconductor film, a gas including an impurity element which serves as a donor may be introduced.

Note that the term "base film" means a film which is to be provided with the microcrystalline semiconductor film over its surface, namely, an underlined film of the microcrystalline semiconductor film.

In addition, a thin film transistor (TFT) is manufactured using the microcrystalline semiconductor film of the present invention, and a display device is manufactured using the thin film transistor for a pixel portion, and further, for a driver circuit. Because the microcrystalline semiconductor film of the present invention has high crystallinity at an interface with a gate insulating film, the thin film transistor using the microcrystalline semiconductor film has a mobility of 1 $cm^2/V \cdot sec$ to 10 $cm^2/V \cdot sec$, preferably, 2.5 $cm^2/V \cdot sec$ to 10 $cm^2/V \cdot sec$, which is 2 times to 20 times higher than that of the thin film transistor using an amorphous semiconductor film. Thus, a part of the driver circuit or the entire driver circuit and the pixel portion can be formed over one substrate, so that a system-on-panel can be manufactured.

Examples of a display device include a light-emitting device and a liquid crystal display device. The light-emitting device includes a light-emitting element, and the liquid crystal display device includes a liquid crystal element. A light-emitting element includes, in its category, an element whose luminance is controlled by a current or a voltage, and specifically includes an organic electroluminescent (EL) element, an inorganic EL element, and the like.

In addition, the display devices include a panel in which a display element is sealed and a module in which an IC and the like including a controller are mounted on the panel. The present invention relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

Note that a display device in this specification means an image display device, a light-emitting device, or a light source (including a lighting device). Further, the display device includes any of the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

Further, a photoelectric conversion device is manufactured using the above microcrystalline semiconductor film which has high crystallinity as a photoelectric conversion layer In accordance with the present invention, a microcrystalline semiconductor film which has high crystallinity at an interface with a base film can be formed. In addition, a microcrystalline semiconductor film which has crystal grains closely contacted with the adjacent crystal grains and which has high crystallinity can be formed. Further, a thin film transistor using the microcrystalline semiconductor film which has high crystallinity in a channel formation region can be manufactured. Furthermore, a photoelectric conversion device using the microcrystalline semiconductor film which has high crystallinity can be manufactured.

BRIEF DESCRIPTION OF THE DRAWINGS

FIGS. 15A to 15C are top views illustrating a method for manufacturing a thin film transistor of the present invention;

FIGS. 23A and 23B are a top view and a cross-sectional view illustrating a display device to which a thin film transistor of the present invention can be applied;

FIGS. 28A to 28C are diagrams illustrating a photoelectric conversion device of the present invention;

DETAILED DESCRIPTION OF THE INVENTION

Embodiment Mode

Figure 1A:
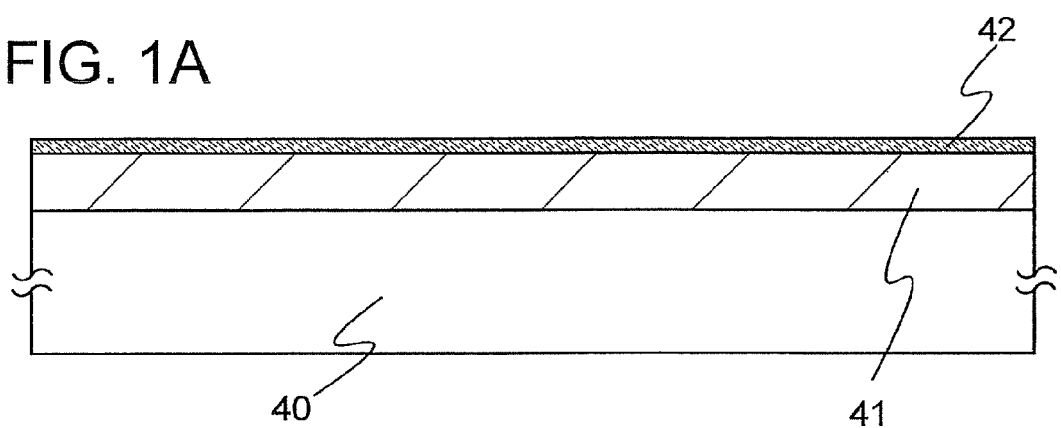
FIGS. 1A to 1D are cross-sectional views illustrating a process for forming a microcrystalline semiconductor film of the present invention.

Hereinafter, embodiment modes and embodiments of the present invention will be described with reference to the drawings. Note that the present invention is not limited to the following description, and it is easily understood by those skilled in the art that the modes and details disclosed herein can be modified in various ways without departing from the spirit and scope of the present invention. Therefore, the present invention should not be interpreted as being limited to the description of the embodiment modes and embodiments to be given below. In the structures of the present invention to be described hereinafter, reference numerals which designate the same parts are used in common in different drawings.

(Embodiment Mode 1)

Here, a method for manufacturing a microcrystalline semiconductor film which has high crystallinity at an interface with a base film and has high adhesion between adjacent crystal grains, namely, a microcrystalline semiconductor film which has fewer defects is described with reference to FIGS. 1A to 1D.

As illustrated in FIG. 1A, a base film 41 is formed over a substrate 40 so that a semiconductor film 42 is formed over the base film 41.

As the substrate 40, a plastic substrate having heat resistance that can withstand a processing temperature of the manufacturing process or the like can be used in addition to a non-alkaline glass substrate manufactured by a fusion method or a float method such as a substrate of a barium borosilicate glass, an aluminoborosilicate glass, or an aluminosilicate glass, or a ceramic substrate. Alternatively, a metal substrate such as a stainless steel alloy substrate, which is provided with an insulating film over the surface, may also be used. When the substrate 40 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

The base film 41 can be formed by using a CVD method, a sputtering method, a printing method, a coating method, or the like, as appropriate. As the base film, an insulating film, a conductive film, or the like can be formed, as appropriate. As an example of the insulating film, a silicon oxide film, a silicon nitride film, a silicon oxynitride film, a silicon nitride oxide film, and the like are given; however, the present invention is not limited thereto. Here, as the base film 41, a silicon nitride oxide film with a thickness of from 50 nm to 200 nm is formed by a plasma CVD method.

Here, a silicon oxynitride film means a film which has a larger number of oxygen atoms than that of nitrogen atoms and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film which has a larger number of nitrogen atoms than that of oxygen atoms and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

As the semiconductor film 42, an amorphous semiconductor film including silicon, germanium, or the like or a microcrystalline semiconductor film including silicon, germanium, or the like is formed. As a microcrystalline semiconductor film, a microcrystalline semiconductor film whose size of a crystal grain is in the range of from 0.5 nm to 100 nm, preferably from 1 nm to 20 nm can be used. Note that, in the case where the semiconductor film 42 is a microcrystalline semiconductor film, the microcrystalline semiconductor film may include an amorphous semiconductor component. The thickness of the semiconductor film 42 is in the range of from 1 nm to 100 nm, preferably from 2 nm to 20 nm, and more preferably from 5 nm to 10 nm.

Here, a microcrystalline semiconductor film means a film which includes a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with a grain size of from 0.5 nm to 100 nm, preferably from 1 nm to 20 nm grown in the direction of a normal line with respect to the surface of the substrate. In addition, there is an amorphous semiconductor between a plurality of microcrystalline semiconductors. Further, microcrystalline silicon, which is a typical example of a microcrystalline semiconductor, has a Raman spectrum which is shifted to a lower wave number side than 520 cm$^{-1}$ that is a feature of single crystalline silicon. That is, the peak of a Raman spectrum of microcrystalline silicon is within the range of from 480 cm$^{-1}$ (that is a feature of amorphous silicon) to 520 cm$^{-1}$ (that is a feature of single crystalline silicon). In addition, microcrystalline silicon is made to contain hydrogen or halogen at least 1 at. % for termination of dangling bonds. Moreover, microcrystalline silicon is made to contain a rare gas element such as helium, argon, krypton, or neon to further enhance its lattice distortion, whereby its stability is increased and a favorable microcrystalline semiconductor film can be obtained. Such a microcrystalline semiconductor film is disclosed in, for example, U.S. Pat. No. 4,409,134.

The semiconductor film 42 can be formed by a sputtering method or a CVD method. In the case where the semiconductor film 42 is formed by a sputtering method, sputtering is performed on a silicon target using hydrogen or a rare gas, whereby an amorphous semiconductor film is formed over the base film as the semiconductor film. In the case where the semiconductor film 42 is formed by a CVD method, hydrogen is introduced into a reaction chamber of a plasma CVD apparatus in addition to a deposition gas including silicon or germanium, and high-frequency power is applied, whereby plasma is generated, so that an amorphous semiconductor film or a microcrystalline semiconductor film is formed over the base film as the semiconductor film 42.

As examples of the deposition gas including silicon or germanium, $SiH_4$, $Si_2H_6$, $GeH_4$, $Ge_2H_6$, and the like are given.

Note that one mode for forming an amorphous semiconductor film as a semiconductor film is that an amorphous semiconductor film can be formed by glow discharge plasma using a deposition gas including silicon or germanium in a reaction chamber. Alternatively, a deposition gas including silicon or germanium is diluted with one or plural kinds of rare gas elements selected from helium, argon, krypton, and neon, and an amorphous semiconductor film can be formed by glow discharge plasma. Further alternatively, an amorphous semiconductor film can be formed by glow discharge plasma using hydrogen with a flow ratio of 1 to 10 times, preferably 1 to 5 times as high as that of a silane gas.

Another mode for forming a microcrystalline semiconductor film as a semiconductor film is that a deposition gas including silicon or germanium, which is silane here, hydrogen, and/or a rare gas are mixed in a reaction chamber, and a microcrystalline semiconductor film is formed by glow discharge plasma. Silane is diluted 10-fold to 2000-fold with hydrogen, and/or a rare gas. Thus, a large amount of hydrogen and/or a rare gas is necessary. The substrate heating temperature is in the range of from 100° C. to 300° C., preferably 120° C. to 220° C. It is preferable that the film be formed at temperatures ranging from 120° C. to 220° C. so that a growing surface of the microcrystalline semiconductor film is inactivated with hydrogen, and growth of microcrystalline silicon is promoted.

In a formation process of the semiconductor film 42, glow discharge plasma is generated by applying high-frequency power with a frequency of from 1 MHz to 20 MHz, typically 13.56 MHz, or high-frequency power with a frequency in the VHF band of from 20 MHz to approximately 120 MHz, typically 27.12 MHz or 60 MHz.

Figure 1B:
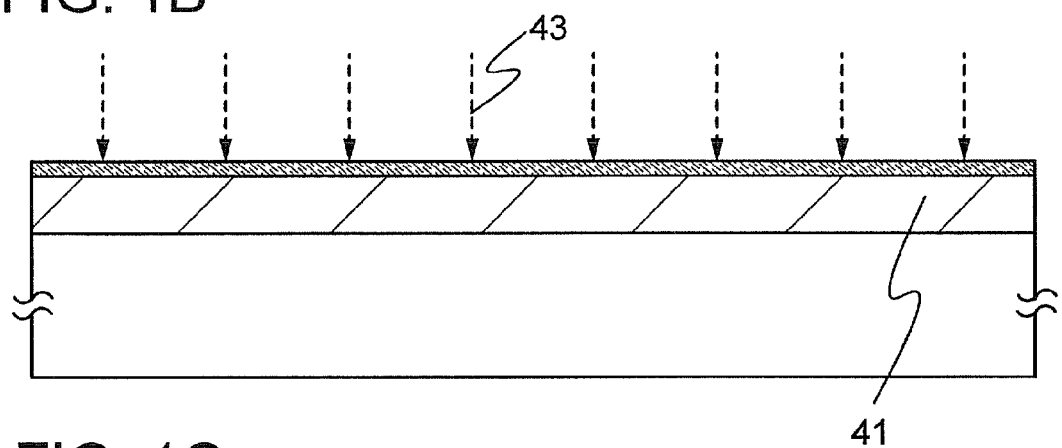
Figure 1C:
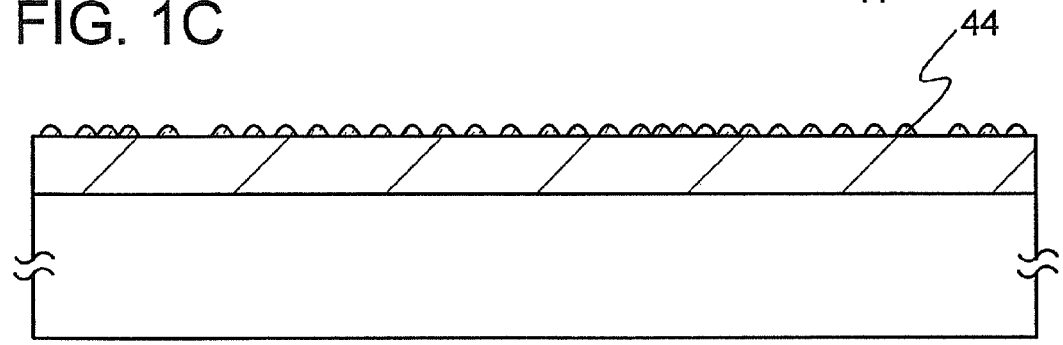

Next, a process for forming crystal nuclei which have high crystallinity at high density is performed. Here, at least one of fluorine, a fluoride gas, and hydrogen is introduced into a reaction chamber of a plasma CVD apparatus, and high-frequency power is applied, whereby plasma 43 is generated. As illustrated in FIG. 1B, the semiconductor film 42 is exposed to the plasma 43 so that a part of the semiconductor film 42, typically an amorphous semiconductor component is etched.

At least one of fluorine, a fluoride gas, and hydrogen is introduced, and high-frequency power is applied, whereby hydrogen plasma or fluorine plasma is generated. The hydrogen plasma is generated by introducing hydrogen to a reaction chamber. The fluorine plasma is generated by introducing fluorine or a fluoride gas to a reaction chamber. As examples of a fluoride gas, HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, and the like are given. Note that, in addition to fluorine, a fluoride gas, or hydrogen, a rare gas may be introduced into a reaction chamber so that rare gas plasma is generated.

Hydrogen radicals or fluorine radicals are generated in plasma by hydrogen plasma, fluorine plasma, or the like. The hydrogen radicals react with an amorphous semiconductor film to crystallize a part of the amorphous semiconductor film and to etch an amorphous semiconductor component. The fluorine radicals etch an amorphous semiconductor component of a semiconductor film. Accordingly, in the case where the semiconductor film 42 is a microcrystalline semiconductor film, crystal grains included in the microcrystalline semiconductor film are small, and crystal nuclei having high crystallinity can be left at high density by etching an amorphous semiconductor component which fills a space between the crystal grains. In the case where the semiconductor film formed over the base film is an amorphous semiconductor film, an amorphous semiconductor component is etched but partly crystallized so that fine crystal nuclei can be formed at high density. Thus, an amorphous semiconductor component at an interface with the base film is also etched by plasma. Accordingly, crystal nuclei having high crystallinity can be formed at high density over the base film.

When the size of crystal nuclei at this time is set to be from 5 nm to 30 nm, the density at this time is set to be from $1 \times 10^{10}$ atoms/cm$^3$ to $1 \times 10^{12}$ atoms/cm$^3$, fine crystal nuclei can be formed at high density and crystallinity of a microcrystalline semiconductor film to be formed later can be improved.

As a method for generating plasma, the HF band (from 3 MHz to 30 MHz, typically 13.56 MHz) is preferably used. In particular, by using high-frequency power of 13.56 MHz, uniformity of plasma can be increased. Thus, a semiconductor film can be exposed to plasma with high uniformity even over a large-sized substrate of the sixth to tenth generations. Accordingly, the high-frequency power of 13.56 MHz is favorable for mass production.

Figure 1D:
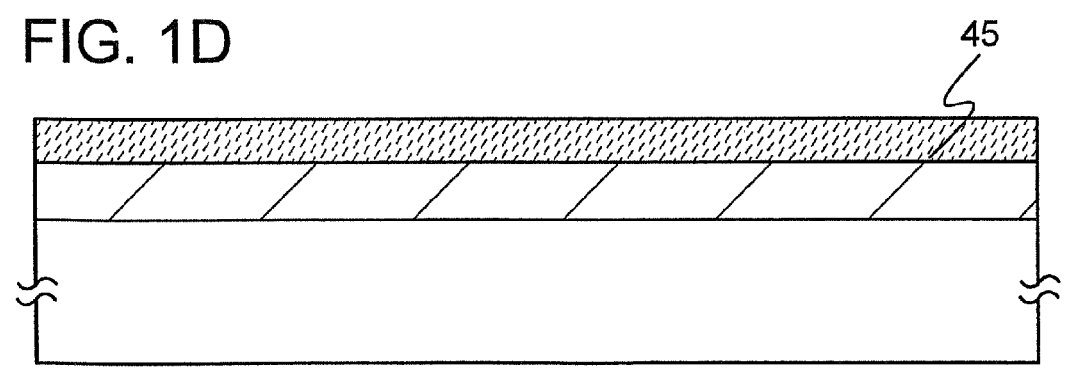

Next, crystals grow using crystal nuclei 44 by using a deposition gas including silicon or germanium, fluorine or a fluoride gas, and hydrogen, and a microcrystalline semiconductor film 45 is formed as illustrated in FIG. 1D. As examples of the fluoride gas, HF, $SiF_4$, $SiHF_3$, $SiH_2F_2$, $SiH_3F$, $Si_2F_6$, $GeF_4$, $GeHF_3$, $GeH_2F_2$, $GeH_2F$, $Ge_2F_6$, and the like are given. Here, silane, fluorosilane, hydrogen, and/or a rare gas are mixed, and the microcrystalline semiconductor film 45 is formed by glow discharge plasma.

In addition to a deposition gas including silicon or germanium, a fluoride gas including silicon or germanium is used in order to form a microcrystalline semiconductor film. Thus, an amorphous semiconductor component in a region where crystals grow is etched by fluorine radicals when crystals grow from crystal nuclei. Accordingly, crystals with high crystallinity grow. That is, crystal grains which have high crystallinity can be formed. In addition, if the density of crystal nuclei is high, a distance between adjacent crystal nuclei is short and crystal grains are connected with each other when crystals grow. After that, crystals grow in the direction of a normal line with respect to a surface of a base film, and thus a microcrystalline semiconductor film which has column-like crystal grains closely connected with each other can be formed. Further, because crystals grow from crystal nuclei over the base film 41, a microcrystalline semiconductor film which has high crystallinity in the entire film and at an interface with the base film can be formed. Furthermore, by using such a microcrystalline semiconductor film in a channel formation region of a thin film transistor, a thin film transistor including a microcrystalline semiconductor film which has high crystallinity in the channel formation region can be manufactured.

Note that, in a formation process of the microcrystalline semiconductor film, glow discharge plasma is generated by applying high-frequency power with a frequency of from 1 MHz to 20 MHz, typically 13.56 MHz, or high-frequency power with a frequency in the VHF band of from 20 MHz to approximately 120 MHz, typically 27.12 MHz or 60 MHz.

Note that, before the semiconductor film 42 is formed, an amorphous semiconductor film or a microcrystalline semiconductor film is preferably formed on an inner wall of a reaction chamber of a film formation apparatus. Further, an amorphous semiconductor film or a microcrystalline semiconductor film is preferably formed on an inner wall of a reaction chamber after the inner wall of the reaction chamber is cleaned by fluorine plasma or the like. Through such treatment, when the semiconductor film 42 or the microcrystalline semiconductor film 45 is formed, mixture of a material of the inner wall of the reaction chamber and fluorine used for cleaning into the semiconductor film 42 or the microcrystalline semiconductor film 45 can be suppressed.

Through the above process, a microcrystalline semiconductor film which has high crystallinity in the entire film and at an interface with a base film can be formed.
(Embodiment Mode 2)

This embodiment mode describes a process for forming a microcrystalline semiconductor film which has high crystallinity in the entire film and at an interface with a base film with reference to FIGS. 2A to 2D, as in Embodiment Mode 1.

Figure 2A:
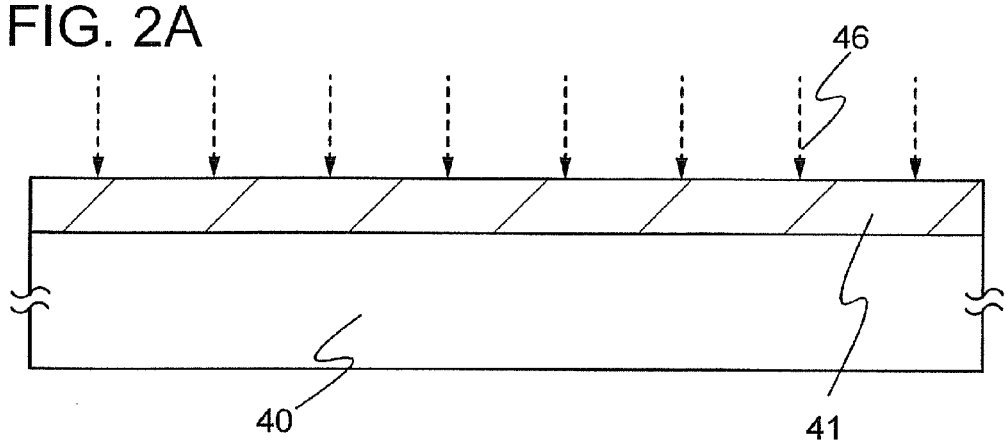
FIGS. 2A to 2D are cross-sectional views illustrating a process for forming a microcrystalline semiconductor film of the present invention.

As illustrate in FIG. 2A, the base film 41 is formed over the substrate 40.

Figure 2B:
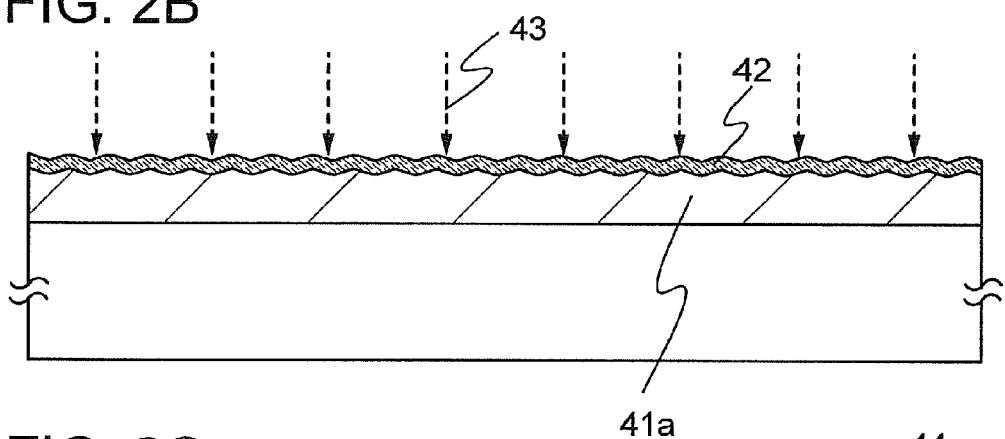

Next, the surface of the base film 41 is exposed to plasma 46, whereby a base film 41a having an uneven surface with projections and depressions is formed as illustrated in FIG. 2B. Each of the projections and depressions may have a wavelike shape with a gentle curve to form the uneven shape. Alternatively, the projections may have a sharp needle-like shape and the depressions may have a gently curved shape. With small spaces between the projections and depressions, crystal nuclei can be formed at high density later, which is preferable.

The base film 41 is exposed to the plasma 46 which makes the surface of the base film 41 uneven. Such plasma 46 is generated by introducing at least one of fluorine, a fluoride gas, and hydrogen into a reaction chamber and applying high-frequency power. By being exposed to the plasma 46, the surface of the base film 41 is etched, whereby the uneven base film 41a is formed.

Next, the semiconductor film 42 is formed over the base film 41a. Since the surface of the base film 41a is uneven, the semiconductor film 42 also has an uneven surface. Then, as in Embodiment Mode 1, crystal nuclei with high crystallinity are formed at high density. Here, also, the plasma 43 is generated by introducing at least one of fluorine, a fluoride gas, and hydrogen into the reaction chamber of a plasma CVD apparatus and applying high-frequency power, and the semiconductor film 42 is exposed to the plasma 43, whereby a part of the semiconductor film 42, typically, an amorphous semiconductor component thereof is etched. In this embodiment mode, since the surface of the semiconductor film 42 is uneven, crystal nuclei can more easily be formed owing to stress concentration at the semiconductor film 42. Further, since dangling bonds of Si in the semiconductor film 42 are bonded at a (110) plane and/or at another plane as well, the bonding strength increases, whereby adhesiveness between the base film and the crystal grains, and further between the gate insulating film and the microcrystalline semiconductor film is improved.

Figure 2C:
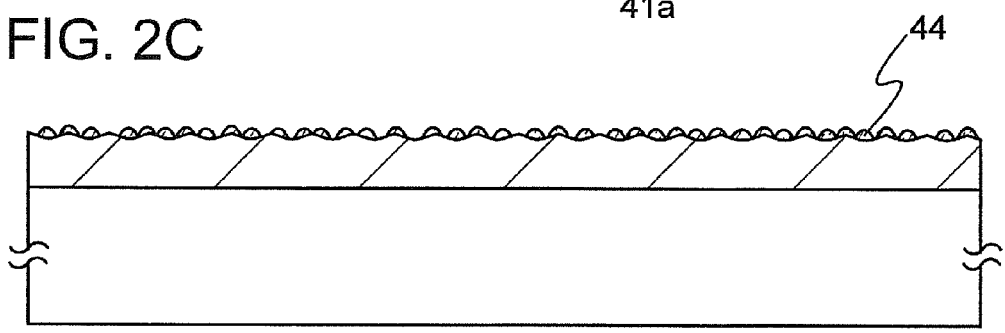

As a result, the crystal nuclei 44 with high crystallinity, which is illustrated in FIG. 2C, can be formed.

Figure 2D:
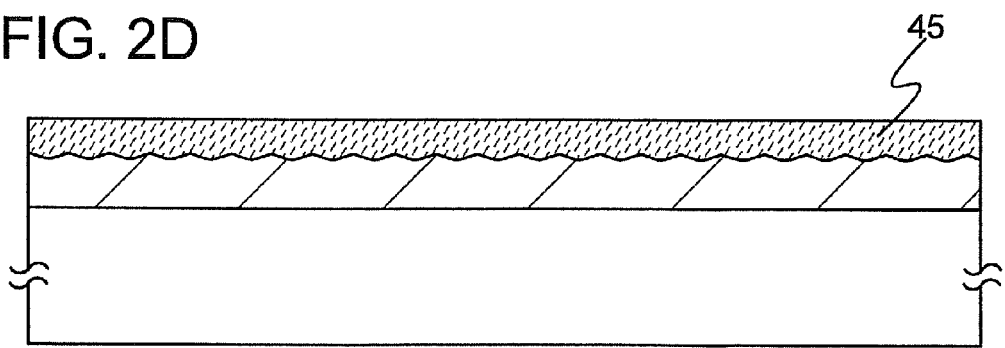

Next, by introducing a deposition gas including silicon or germanium, a fluoride gas or fluorine, and hydrogen into a reaction chamber and applying high-frequency power, crystals grow using the crystal nuclei 44, whereby the microcrystalline semiconductor film 45 is formed as illustrated in FIG. 2D. As examples of the fluoride gas, HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, and the like are given. Here, silane, fluorosilane, hydrogen, and/or a rare gas are mixed, and the microcrystalline semiconductor film is formed by glow discharge plasma.

Note that, before the semiconductor film 42 is formed, an amorphous semiconductor film or a microcrystalline semiconductor film is preferably formed on an inner wall of a reaction chamber of a film formation apparatus. Further, an amorphous semiconductor film or a microcrystalline semiconductor film is preferably formed on an inner wall of a reaction chamber after the inner wall of the reaction chamber is cleaned by fluorine plasma or the like. Through such treatment, when the semiconductor film 42 or the microcrystalline semiconductor film 45 is formed, mixture of a material of an inner wall of a reaction chamber and fluorine used for cleaning into the semiconductor film 42 or the microcrystalline semiconductor film 45 can be suppressed.

Through the above process, a microcrystalline semiconductor film which has high crystallinity in the entire film and at an interface with a base film can be formed.

(Embodiment Mode 3)

This embodiment mode describes a method for manufacturing a microcrystalline semiconductor film which has high crystallinity at an interface with a base film and high adhesion between adjacent crystal grains, namely, a microcrystalline semiconductor film which has fewer defects, with reference to FIGS. 3A to 3D.

Figure 3A:
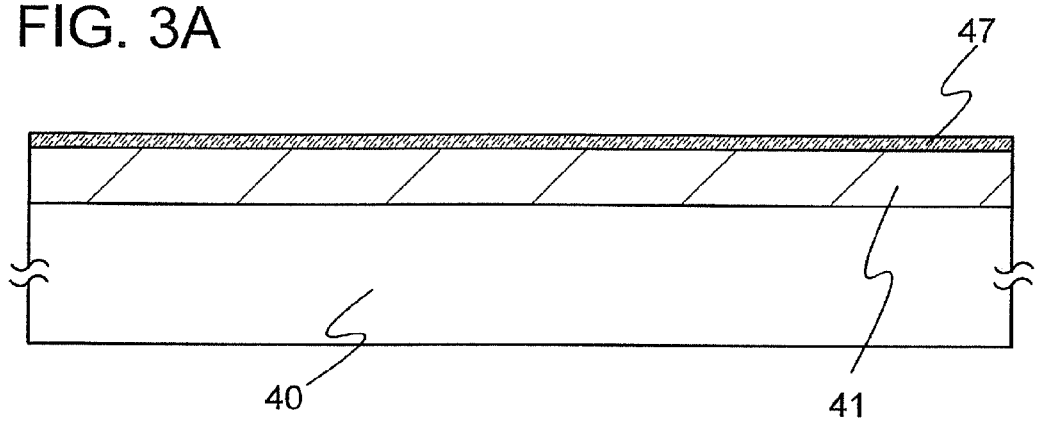
FIGS. 3A to 3D are cross-sectional views illustrating a method for manufacturing a thin film transistor of the present invention.

As illustrated in FIG. 3A, the base film 41 is formed over the substrate 40, and then the semiconductor film 47 is formed over the base film 41.

Here, as the semiconductor film 47, a semiconductor film including an impurity element which serves as a donor is formed. The semiconductor film including an impurity element which serves as a donor is formed by a plasma CVD method or a sputtering method. As an impurity element which serves as a donor, phosphorus, arsenic, or antimony is used. Further, as a semiconductor film, an amorphous semiconductor film or a microcrystalline semiconductor film is formed. Furthermore, as an amorphous semiconductor film or a microcrystalline semiconductor film, an amorphous semiconductor film including silicon or germanium or a microcrystalline semiconductor film including silicon or germanium is formed.

As a method for forming a semiconductor film including an impurity element which serves as a donor, a semiconductor film may be formed using a gas including an impurity element which serves as a donor in addition to a source gas of the semiconductor film. For example, an amorphous silicon film including phosphorus or a microcrystalline silicon film including phosphorus can be formed by a plasma CVD method using phosphine in addition to silane and hydrogen.

The concentration of the impurity element which serves as a donor is from $6 \times 10^{15}$ atoms/cm$^3$ to $3 \times 10^{18}$ atoms/cm$^3$ inclusive, preferably from $1 \times 10^{16}$ atoms/cm$^3$ to $3 \times 10^{18}$ atoms/cm$^3$ inclusive, more preferably from $3 \times 10^{16}$ atoms/cm$^3$ to $3 \times 10^{17}$ atoms/cm$^3$ inclusive. The concentration of the impurity element which serves as a donor is set to be in the above range, whereby an interface between the base film 41 and a microcrystalline semiconductor film including an impurity element which serves as a donor to be formed later can have improved crystallinity. In addition, the microcrystalline semiconductor film including an impurity element which serves as a donor to be formed later can have reduced resistivity.

Before forming the semiconductor film 47, a gas including an impurity element which serves as a donor is supplied into a reaction chamber of a film formation apparatus, whereby an impurity element which serves as a donor may be adsorbed onto an inner wall of the reaction chamber and a surface of the base film 41. After that, by forming the semiconductor film 47, the semiconductor film is deposited while taking in the impurity element which serves a donor, whereby the semiconductor film 47 including an impurity element which serves as a donor can be formed.

Figure 3B:
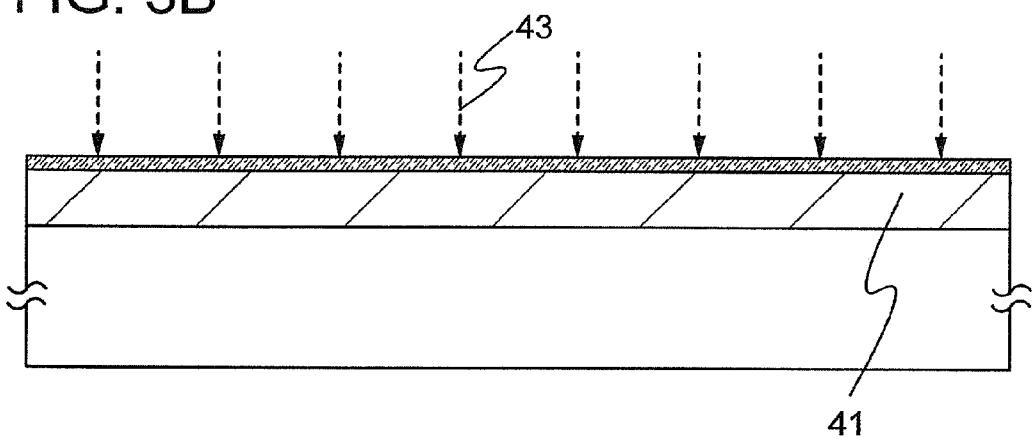
Figure 3C:
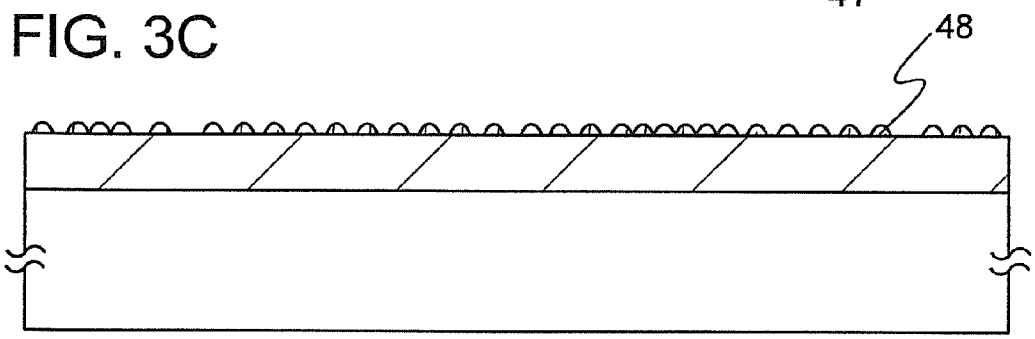

Next, a process is performed in which crystal nuclei with high crystallinity can be formed at high density with the use of the semiconductor film 47. Here, as illustrated in FIG. 3B, the semiconductor film 47 is also irradiated with the plasma 43. As a result, as illustrated in FIG. 3C, crystal nuclei 48 including an impurity element which serves as a donor are formed over the base film 41. As the plasma 43, the plasma 43 described in Embodiment Mode 1 can be used as appropriate.

Further, as the plasma 43, a gas including an impurity element which serves as a donor is introduced into a reaction chamber in addition to hydrogen, fluorine, or fluoride so that plasma may be generated. By etching an amorphous semiconductor component in the semiconductor film 47 with hydrogen, fluorine, or fluoride and adding an impurity element which serves as a donor to the semiconductor film which is left, the crystal nuclei 48 including an impurity element which serves as a donor can be formed.

Figure 3D:
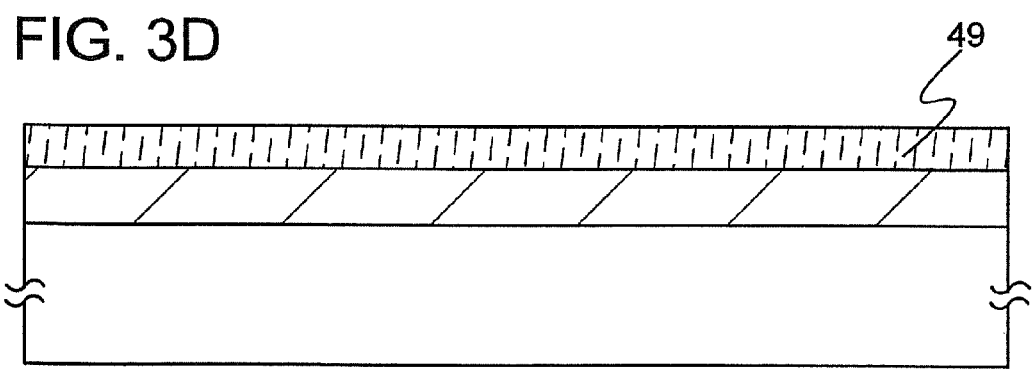

Next, by introducing a deposition gas including silicon or germanium, a fluoride gas including silicon or germanium, and hydrogen into a reaction chamber and applying high-frequency power, crystals grow using the crystal nuclei 48, whereby a microcrystalline semiconductor film 49 including an impurity element which serves as a donor is formed as illustrated in FIG. 3D. As examples of the deposition gas including silicon or germanium, $SiH_4$, $Si_2H_6$, $GeH_4$, $Ge_2H_6$, and the like are given. As examples of the fluoride gas including silicon or germanium, HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, and the like are given. Here, silane, fluorosilane, hydrogen, and/or a rare gas are mixed, and the microcrystalline semiconductor film including an impurity element which serves as a donor is formed by glow discharge plasma.

In order to form a microcrystalline semiconductor film, a fluoride gas including silicon or germanium is used in addition to a deposition gas including silicon or germanium, so that an amorphous semiconductor component in a region where crystals grow is etched by fluorine radicals when crystals grow from crystal nuclei, and thus crystals with high crystallinity grow. That is, crystal grains which have high crystallinity can be formed. In addition, if the density of crystal nuclei is high, a distance between adjacent crystal nuclei is short and crystal grains are connected with each other when crystals grow. After that, crystals grow in the direction of a normal line with respect to a surface of a base film, and thus a microcrystalline semiconductor film which has column-like crystal grains closely connected with each other can be formed. Further, because crystals grow from crystal nuclei over the base film, a microcrystalline semiconductor film which has high crystallinity in the entire film and at an interface with the base film can be formed. Furthermore, because the microcrystalline semiconductor film includes an impurity element which serves as a donor, the resistivity of the microcrystalline semiconductor film can be reduced.

Before formation of the semiconductor film 47, an amorphous semiconductor film or a microcrystalline semiconductor film is preferably formed on the inner wall of the reaction chamber of the film formation apparatus. It is preferable that the inner wall of the reaction chamber be cleaned with fluorine plasma or the like, and then an amorphous semiconductor film or a microcrystalline semiconductor film be formed on the inner wall of the reaction chamber. By such treatment, when the semiconductor film 47 is formed, mixture of a material of the inner wall of the reaction chamber and fluorine used for the cleaning into the semiconductor film 47 can be suppressed. Further, the impurity element which serves as a donor may be added to the amorphous semiconductor film or the microcrystalline semiconductor film formed on the inner wall of the reaction chamber. The concentration of the impurity element which serves as a donor is from $6\times10^{15}$ atoms/cm$^3$ to $3\times10^{18}$ atoms/cm$^3$ inclusive, preferably from $1\times10^{16}$ atoms/cm$^3$ to $3\times10^{18}$ atoms/cm$^3$ inclusive, more preferably from $3\times10^{16}$ atoms/cm$^3$ to $3\times10^{17}$ atoms/cm$^3$ inclusive. By such treatment, when the reaction chamber is vacuum-evacuated, the impurity element which serves as a donor and is attached to the inner wall of the reaction chamber is released in the reaction chamber. The released impurity element which serves as a donor is mixed into the semiconductor film 47, and thus, the semiconductor film 47 including the impurity element which serves as a donor can be formed.

Instead of forming the semiconductor film 47 including the impurity element which serves as a donor, a semiconductor film which does not include the impurity element which serves as a donor may be formed, and an insulating film including the impurity element which serves as a donor may be formed as the base film 41. For example, a silicon oxide film, a silicon nitride film, a silicon oxynitride film, a silicon nitride oxide film, or the like including the impurity element which serves as a donor (phosphorus, arsenic, or antimony) can be used. In the case of employing a stacked-layer structure for the base film 41, the impurity element which serves as a donor may be added to a layer in contact with the semiconductor film 47 or a layer in contact with the substrate 40.

In a method for forming the insulating film including the impurity element which serves as a donor as the base film 41, the insulating film may be formed using a gas including the impurity element which serves as a donor in addition to a source gas of the insulating film. For example, a silicon nitride film including phosphorus can be formed by a plasma CVD method using silane, ammonia, and phosphine. Further, a silicon oxynitride film including phosphorus can be formed by a plasma CVD method using silane, dinitrogen monoxide, ammonia, and phosphine.

Before formation of the base film 41, a gas including the impurity element which serves as a donor may be supplied into the reaction chamber of the film formation apparatus, and the impurity element which serves as a donor may be adsorbed onto the surface of the substrate 40 and the inner wall of the reaction chamber. After that, the semiconductor film 47 including the impurity element which serves as a donor can be formed by forming the base film 41 because the semiconductor film 47 can be deposited while taking in the impurity element which serves as a donor.

Further, as the microcrystalline semiconductor film 49, a microcrystalline semiconductor film including the impurity element which serves as a donor may be formed. As for a method for forming the microcrystalline semiconductor film including the impurity element which serves as a donor, a gas including the impurity element which serves as a donor may be used, in addition to the source gas of the microcrystalline semiconductor film. For example, a microcrystalline silicon film including phosphorus can be formed by a plasma CVD method using silane, fluorosilane, hydrogen, and phosphine.

Alternatively, before formation of the microcrystalline semiconductor film 49, a gas including the impurity element which serves as a donor may be supplied into the reaction chamber of the film formation apparatus, and the impurity element which serves as a donor may be adsorbed onto the surfaces of the base film 41 and the crystal nuclei 48 and the inner wall of the reaction chamber. After that, the microcrystalline semiconductor film 49 may be deposited. Accordingly, because the microcrystalline semiconductor film can be deposited while taking in the impurity element which serves as a donor, the microcrystalline semiconductor film 49 including the impurity element which serves as a donor can be formed.

Further, the impurity element which serves as a donor may be added to two or more of the base film 41, the semiconductor film 47, the crystal nuclei 48, and the microcrystalline semiconductor film 49.

Through the above process, a microcrystalline semiconductor film which has high crystallinity in the entire film and at an interface with a base film and which has low resistivity can be formed.

(Embodiment Mode 4)

This embodiment mode describes a method for manufacturing a thin film transistor using the microcrystalline semiconductor film described in Embodiment Modes 1 to 3. Although, in this embodiment mode, description is given using Embodiment Mode 1 as a method for manufacturing a microcrystalline semiconductor film, Embodiment Modes 2 and 3 can be employed as appropriate.

A thin film transistor having a microcrystalline semiconductor film, which is of an n-type, is more suitable for use in a driver circuit than that of a p-type because the n-type thin film transistor has higher mobility. It is desired that all thin film transistors formed over the same substrate have the same polarity, in order to reduce the number of manufacturing steps. Here, description is given using an n-channel thin film transistor.

Figure 4A:
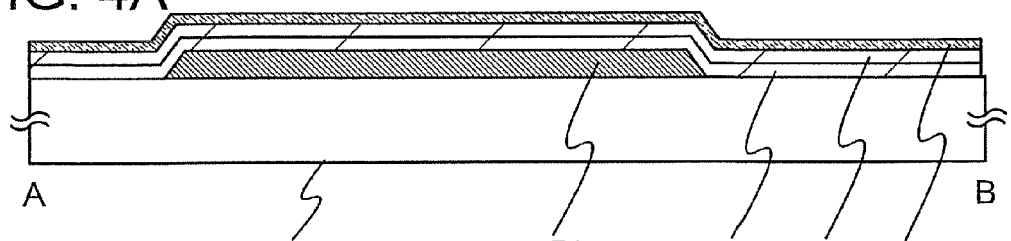
FIGS. 4A to 4E are cross-sectional views illustrating a method for manufacturing a thin film transistor of the present invention.

As illustrated in FIG. 4A, a gate electrode 51 is formed over a substrate 50, and gate insulating films 52a and 52b are formed over the gate electrode 51.

The gate electrode 51 is formed of a metal material. As a metal material, aluminum, chromium, titanium, tantalum, molybdenum, copper, or the like is used. The gate electrode 51 is preferably formed of aluminum or a stacked-layer structure of aluminum and a barrier metal. As a barrier metal, a metal with a high melting point, such as titanium, molybdenum, or chromium, is used. A barrier metal is preferably provided in order to prevent hillocks and oxidation of aluminum.

The gate electrode 51 is formed to a thickness of from 50 nm to 300 nm inclusive. The thickness of from 50 nm to 100 nm inclusive of the gate electrode 51 can prevent break, due to a step, of a semiconductor film and a wiring, which are formed later. Further, the thickness of from 150 nm to 300 nm inclusive of the gate electrode 51 can reduce the resistivity of the gate electrode 51, and can increase the area of the substrate.

Since the semiconductor film and the wiring are formed over the gate electrode 51, the gate electrode 51 is preferably processed to have tapered end portions so that the semiconductor film and the wiring thereover are not broken due to a step. Further, although not illustrated, a wiring or a capacitor wiring which is connected to the gate electrode can also be formed in this step, at the same time.

The gate electrode 51 is formed by a sputtering method, a CVD method, a plating method, a printing method, a droplet discharge method, or the like. In this embodiment mode, a molybdenum film is formed as a conductive film over the substrate 50 by a sputtering method and is etched with the use of a resist mask which is formed using a first photomask, whereby the gate electrode 51 is formed.

Each of the gate insulating films 52a and 52b can be formed by a CVD method, a sputtering method, or the like using a silicon oxide film, a silicon nitride film, a silicon oxynitride film, or a silicon nitride oxide film. The gate insulating films 52a and 52b can each be formed using a silicon oxide film, a silicon nitride film, a silicon oxynitride film, or a silicon nitride oxide film with a thickness of from 50 nm to 150 nm. This mode shows an example in which a silicon nitride film or a silicon nitride oxide film is formed as the gate insulating film 52a, and a silicon oxide film or a silicon oxynitride film is formed as the gate insulating film 52b to form a stacked-layer structure. Instead of a two-layer structure, the gate insulating film can be formed using a single layer of a silicon oxide film, a silicon nitride film, a silicon oxynitride film, or a silicon nitride oxide film.

By forming the gate insulating film 52a using a silicon nitride film or a silicon nitride oxide film, adhesion between the substrate 50 and the gate insulating film 52a is increased, and further, an impurity from the substrate 50 can be prevented from diffusing into the microcrystalline semiconductor film when a glass substrate is used for the substrate 50. Furthermore, oxidation of the gate electrode 51 can be prevented. That is, film peeling can be prevented, and electric characteristics of the thin film transistor to be formed later can be improved. Further, the gate insulating films 52a and 52b each having a thickness of greater than or equal to 50 nm are preferable because the gate insulating films 52a and 52b having the above thickness can alleviate reduction in coverage which is caused by unevenness due to the gate electrode 51.

Next, the semiconductor film 42 is formed over the gate insulating film 52b by a plasma CVD method using a deposition gas including silicon or germanium, and hydrogen.

As one mode, this embodiment mode describes a mode for forming a microcrystalline silicon film as the semiconductor film 42 in a reaction chamber of a plasma CVD apparatus. A deposition gas including silicon or germanium, which is silane here, hydrogen, and/or a rare gas are mixed, and a microcrystalline silicon film is formed by glow discharge plasma. Silane is diluted 10-fold to 2000-fold with hydrogen and/or a rare gas. The substrate heating temperature is in the range of from 100° C. to 300° C., preferably from 120° C. to 220° C.

Figure 4B:
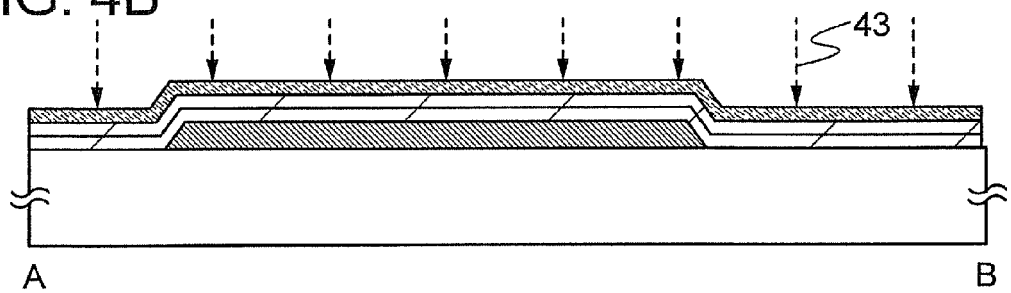
Figure 4C:
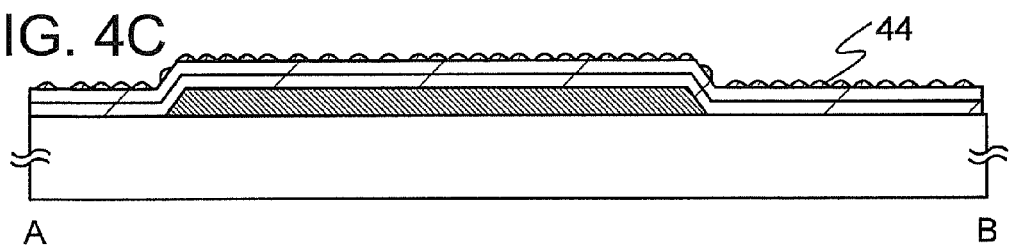
Figure 4D:
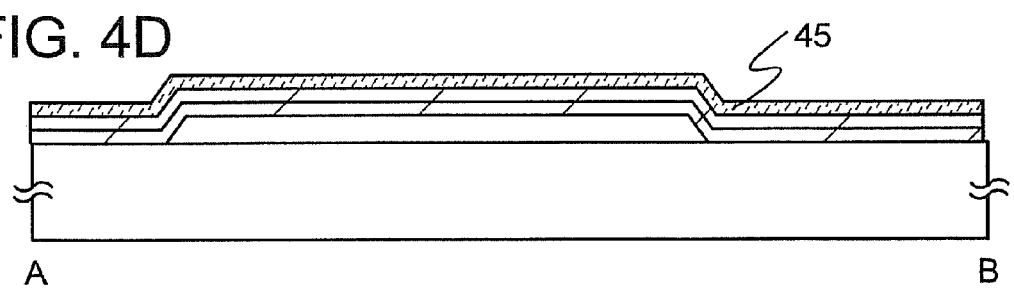

Next, as illustrated in FIG. 4B, the semiconductor film 42 is exposed to the plasma 43 so as to form the crystal nuclei 44 as illustrated in FIG. 4C. As one mode, this embodiment mode describes a mode in which, in a reaction chamber of a plasma CVD apparatus, hydrogen and/or a rare gas is mixed, hydrogen plasma is generated by glow discharge plasma, the semiconductor film 42 is exposed to the hydrogen plasma, and an amorphous semiconductor component in the semiconductor film 42 is etched, whereby the crystal nuclei 44 are formed.

Then, crystals grow using the crystal nuclei 44 so that the microcrystalline semiconductor film 45 is formed. As one mode, this embodiment mode describes a mode in which a microcrystalline silicon film is formed.

In a reaction chamber of a plasma CVD apparatus, a deposition gas including silicon or germanium, which is silane here, a fluoride gas or fluorine, which is fluorosilane here, hydrogen, and/or a rare gas are mixed, and a microcrystalline silicon film is formed by glow discharge plasma. When a microcrystalline silicon film is formed with silane diluted with fluorosilane and hydrogen with the flow ratio of fluorosilane to silane set to be 0.1:1 to 50:1, preferably 1:1 to 10:1, and the flow ratio of hydrogen to silane set to be 10:1 to 2000:1, preferably 50:1 to 200:1. The substrate heating temperature is in the range of from 100° C. to 300° C., preferably from 120° C. to 220° C.

In addition to a deposition gas including silicon or germanium, a fluoride gas including silicon or germanium is used in order to form a microcrystalline semiconductor film. Thus, an amorphous semiconductor component in a region where crystals grow is etched by fluorine radicals when crystals grow from crystal nuclei. Accordingly, crystals with high crystallinity grow. That is, crystal grains which have high crystallinity can be formed.

Further, an energy band width may be adjusted to be from 0.9 eV to 1.1 eV by mixing germanium hydride or germanium fluoride such as $GeH_4$ or $GeF_4$ into a gas such as silane. By adding germanium to silicon, the temperature characteristic of a thin film transistor can be changed.

The microcrystalline semiconductor film 45 is formed to a thickness of from 5 nm to 200 nm inclusive, preferably from 5 nm to 100 nm inclusive, more preferably from 5 nm to 50 nm inclusive, still more preferably from 10 nm to 25 nm inclusive. When the microcrystalline semiconductor film 45 is formed to a thickness of from 5 nm to 50 nm inclusive, the thin film transistor can be a complete depletion type.

Further, it is preferable that, in the microcrystalline semiconductor film 45, the concentration of oxygen and the concentration of nitrogen be lower than $3 \times 10^{19}$ atoms/cm$^3$, preferably lower than $3 \times 10^{18}$ atoms/cm$^3$, and that the concentration of carbon be less than or equal to $3 \times 10^{18}$ atoms/cm$^3$. Reducing concentrations of oxygen, nitrogen, and carbon mixed in the microcrystalline semiconductor film can suppress generation of defects in the microcrystalline semiconductor film. Furthermore, oxygen and nitrogen included in the microcrystalline semiconductor film hinder crystallization. Therefore, when the microcrystalline semiconductor film includes oxygen and nitrogen at comparatively low concentrations, the crystallinity of the microcrystalline semiconductor film can be improved. Note that the microcrystalline semiconductor film includes fluorine at the concentration of from $1 \times 10^{17}$ atoms/cm$^3$ to $1 \times 10^{20}$ atoms/cm$^3$, preferably lower than $1 \times 10^{19}$ atoms/cm$^3$.

As for the microcrystalline semiconductor film, by adding an impurity element which serves as an acceptor to the microcrystalline semiconductor film which serves as a channel formation region of the thin film transistor at the same time as or after formation of the microcrystalline semiconductor film, the threshold can be controlled. A typical example of the impurity element which serves as an acceptor is boron, and an impurity gas such as $B_2H_6$ or $BF_3$ is mixed at from 1 ppm to 1000 ppm, preferably from 1 ppm to 100 ppm into a deposition gas including silicon or germanium. Further, the concentration of boron is preferably set to be approximately one tenth that of the impurity element which serves as a donor, e.g., from $1 \times 10^{14}$ atoms/cm$^3$ to $6 \times 10^{16}$ atoms/cm$^3$.

In a conventional method for forming a microcrystalline semiconductor film, an amorphous semiconductor layer is formed in an early stage of deposition due to an impurity, lattice mismatch, or the like. In an inverted staggered thin film transistor, carriers flow in a region of a semiconductor film around a gate insulating film. Thus, when an amorphous semiconductor layer is formed at an interface between the gate insulating film and the microcrystalline semiconductor film, the mobility is decreased, and further, the amount of current is reduced, so that electric characteristics of the thin film transistor are lowered.

However, when crystal nuclei having high crystallinity are formed at high density and a microcrystalline semiconductor film is formed with crystal nuclei by a plasma CVD method using a fluoride gas or fluorine as a source gas in addition to a deposition gas including silicon or germanium and hydrogen, crystals grow from the crystal nuclei. Accordingly, formation of an amorphous semiconductor at an interface with a gate insulating film can be suppressed.

As a result, by forming the microcrystalline semiconductor film over the gate insulating film as in this mode, crystallinity in a film thickness direction can be improved, and crystallinity at the interface between the gate insulating film and the microcrystalline semiconductor film can be improved.

Figure 4E:
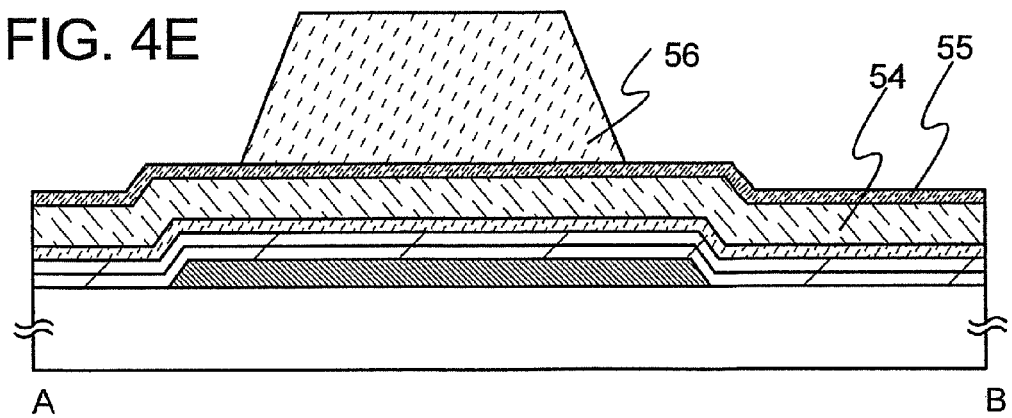

Next, as illustrated in FIG. 4E, a buffer layer 54 and a semiconductor film 55 to which the impurity element imparting one conductivity type is added are formed over the microcrystalline semiconductor film 45. Then, a resist mask 56 is formed over the semiconductor film 55 to which the impurity element imparting one conductivity type is added.

As the buffer layer 54, an amorphous semiconductor film can be formed by a plasma CVD method using a deposition gas including silicon or germanium. Alternatively, by dilution of a deposition gas including silicon or germanium with one or plural kinds of rare gas elements selected from helium, argon, krypton, and neon, an amorphous semiconductor film can be formed. Furthermore, an amorphous semiconductor film including hydrogen can be formed using hydrogen with a flow ratio of 1 to 10 times, preferably 1 to 5 times as high as that of a silane gas. In addition, halogen such as fluorine, chlorine, bromine, or iodine may be added to the above hydrogenated semiconductor film.

In addition, as the buffer layer 54, an amorphous semiconductor film can be formed by sputtering using hydrogen or a rare gas with the use of a semiconductor such as silicon or germanium as a target.

The buffer layer 54 is preferably formed using an amorphous semiconductor film which does not include crystal grains.

In some cases, the buffer layer 54 is partly etched in a later step for forming source and drain regions. Thus, the buffer layer 54 is preferably formed with such a thickness that a part thereof is left at that time. Typically, it is preferable to form the buffer layer 54 with a thickness of from 30 nm to 500 nm inclusive, preferably from 50 nm to 200 nm inclusive. In a display device including a thin film transistor to which a high voltage (e.g., approximately 15 V) is applied, typically, in a liquid crystal display device, if the buffer layer 54 is formed thickly, withstand voltage is increased, so that deterioration of the thin film transistor can be prevented even if a high voltage is applied to the thin film transistor.

Formation of an amorphous semiconductor film or an amorphous semiconductor film including hydrogen, nitrogen, or halogen over the surface of the microcrystalline semiconductor film 45 can prevent a surface of a crystal grain included in the microcrystalline semiconductor film 45 from being naturally oxidized. In particular, in a region where an amorphous semiconductor is in contact with microcrystal grains, a crack is likely to be caused due to local stress. When this crack is exposed to oxygen, the crystal grains are oxidized, whereby silicon oxide is formed. However, by formation of the buffer layer 54 over the surface of the microcrystalline semiconductor film 45, the microcrystal grains can be prevented from being oxidized.

Since the buffer layer 54 is formed using an amorphous semiconductor film or an amorphous semiconductor film including hydrogen or halogen, the buffer layer 54 has a larger energy gap and higher resistivity than the microcrystalline semiconductor film 45 and low mobility which is one fifth to one tenth that of the microcrystalline semiconductor film 45. Therefore, in a thin film transistor to be formed later, the buffer layer 54 formed between source and drain regions and the microcrystalline semiconductor film 45 serves as a high-resistance region and the microcrystalline semiconductor film 45 serves as a channel formation region. Accordingly, off current of the thin film transistor can be reduced. When the thin film transistor is used as a switching element of a display device, the display device can have an improved contrast.

The buffer layer 54 is preferably formed at temperatures of from 300° C. to 400° C. by a plasma CVD method after the microcrystalline semiconductor film 45 is formed. By this film formation treatment, hydrogen is supplied to the microcrystalline semiconductor film 45, and the same effect as when the microcrystalline semiconductor film 45 is hydrogenated can be obtained. In other words, by depositing the buffer layer 54 over the microcrystalline semiconductor film 45, hydrogen is diffused into the microcrystalline semiconductor film 45, and a dangling bond can be terminated.

In the case where an n-channel thin film transistor is formed, phosphorus may be added as a typical impurity element to the semiconductor film 55 to which the impurity element imparting one conductivity type is added, and an impurity gas such as $PH_3$ may be added to a deposition gas including silicon or germanium. In the case where a p-channel thin film transistor is formed, boron may be added as a typical impurity element; for example, an impurity gas such as $B_2H_6$ may be added to a deposition gas including silicon or germanium. The semiconductor film 55 to which the impurity element imparting one conductivity type is added include phosphorus or boron at a concentration of from $1 \times 10^{19}$ atoms/$cm^3$ to $1 \times 10^{21}$ atoms/$cm^3$, thereby having ohmic contact with wirings 71a to 71c, and the semiconductor film 55 to which the impurity element imparting one conductivity type is added serves as the source and drain regions. The semiconductor film 55 to which the impurity element imparting one conductivity type is added can be formed of a microcrystalline semiconductor or an amorphous semiconductor. The semiconductor film 55 to which the impurity element imparting one conductivity type is added is formed to a thickness of from 2 nm to 50 nm inclusive. By formation of the semiconductor film to which the impurity element imparting one conductivity type is added with a small thickness, throughput can be improved.

Then, the resist mask 56 is formed over the semiconductor film 55 to which the impurity element imparting one conductivity type is added.

The resist mask 56 is formed by a photolithography technique. Here, using a second photomask, the resist mask 56 is formed by exposing a resist that is applied on the semiconductor film 55 to which the impurity element imparting one conductivity type is added to light and developing the resist.

Figure 5A:
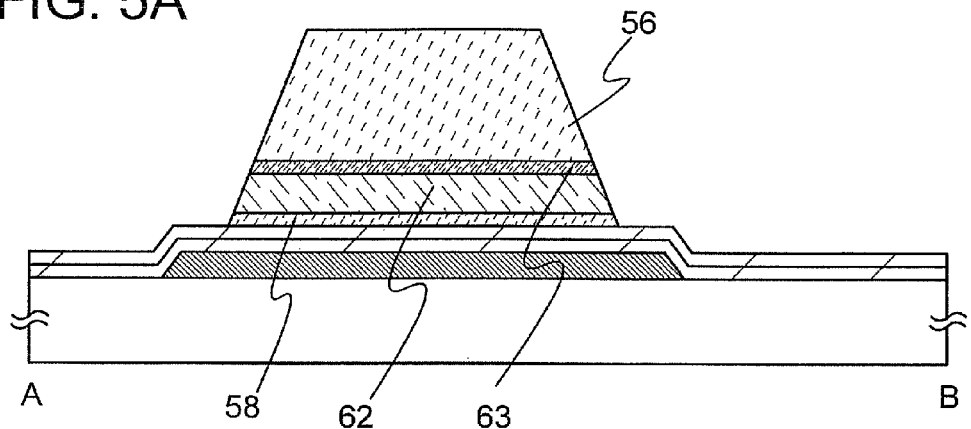
FIGS. 5A to 5C are cross-sectional views illustrating a method for manufacturing a thin film transistor of the present invention.

Next, the microcrystalline semiconductor film 45, the buffer layer 54, and the semiconductor film 55 to which the impurity element imparting one conductivity type is added are etched to be separated using the resist mask 56, whereby a microcrystalline semiconductor film 58, a buffer layer 62, and a semiconductor film 63 to which the impurity element imparting one conductivity type is added are formed as illustrated in FIG. 5A. After that, the resist mask 56 is removed.

Figure 7A:
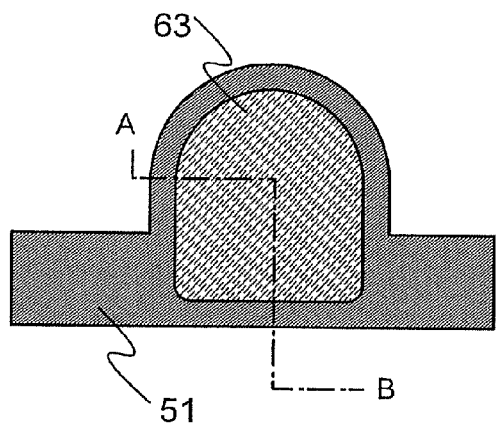
FIGS. 7A to 7C are top views illustrating a method for manufacturing a thin film transistor of the present invention.

FIG. 5A illustrates a cross-sectional view taken along a line A-B in FIG. 7A (excluding the resist mask 56).

With side surfaces of end portions of the microcrystalline semiconductor film 58 and the buffer layer 62 having inclines, leakage between the microcrystalline semiconductor film 58 and the source and drain regions formed over the buffer layer 62 can be prevented. In addition, leakage between wirings and the microcrystalline semiconductor film 58 can also be prevented. The inclination angle of the side surfaces of the end portions of the microcrystalline semiconductor film 58 and the buffer layer 62 is from 30° to 90°, preferably from 45° to 80°. With such an angle, break of the wirings due to a step shape can be prevented.

Figure 5B:
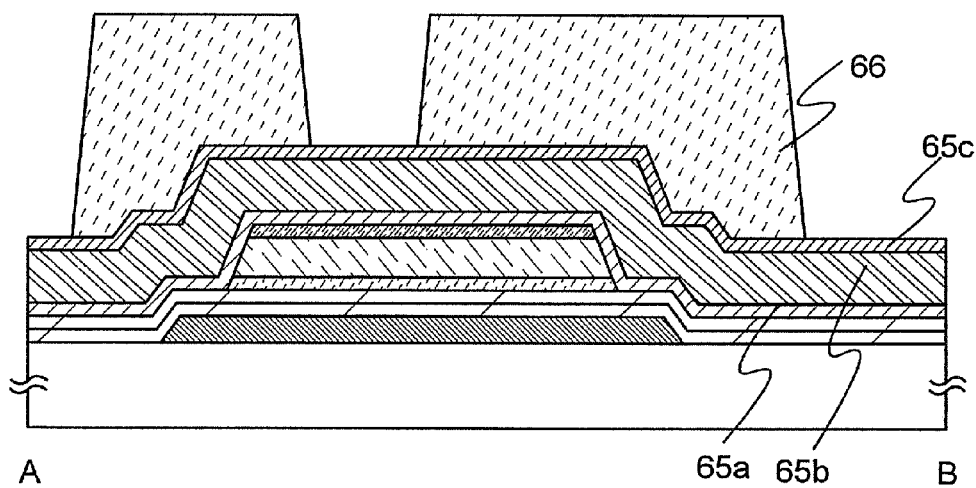

Next, as illustrated in FIG. 5B, conductive films 65a to 65c are formed over the semiconductor film 63 to which the impurity element imparting one conductivity type is added and the gate insulating film 52b, and then a resist mask 66 is formed over the conductive films 65a to 65c. The conductive films 65a to 65c are formed by a sputtering method, a CVD method, a printing method, a droplet discharge method, an evaporation method, or the like. Here, as the conductive film, a conductive film having a three-layer structure in which the conductive films 65a to 65c are stacked is illustrated, and a molybdenum film may be used for each of the conductive films 65a and 65c and an aluminum film may be used for the conductive film 65b, or a titanium film may be used for each of the conductive films 65a and 65c and an aluminum film may be used for the conductive film 65b. The conductive films 65a to 65c are formed by a sputtering method or a vacuum evaporation method.

The conductive films 65a to 65c are preferably formed with a single layer or stacked layers using aluminum; copper; or an aluminum alloy to which an element for preventing migration, an element for preventing hillocks, or an element for improving a heat resistance property, such as silicon, titanium, neodymium, scandium, or molybdenum, is added. Alternatively, a film in contact with the semiconductor film to which the impurity element imparting one conductivity type is added may be formed of titanium, tantalum, molybdenum, or tungsten, or a nitride thereof; and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or a nitride thereof to form a stacked-layer structure.

The resist mask 66 can be formed in a manner similar to the resist mask 56.

Figure 5C:
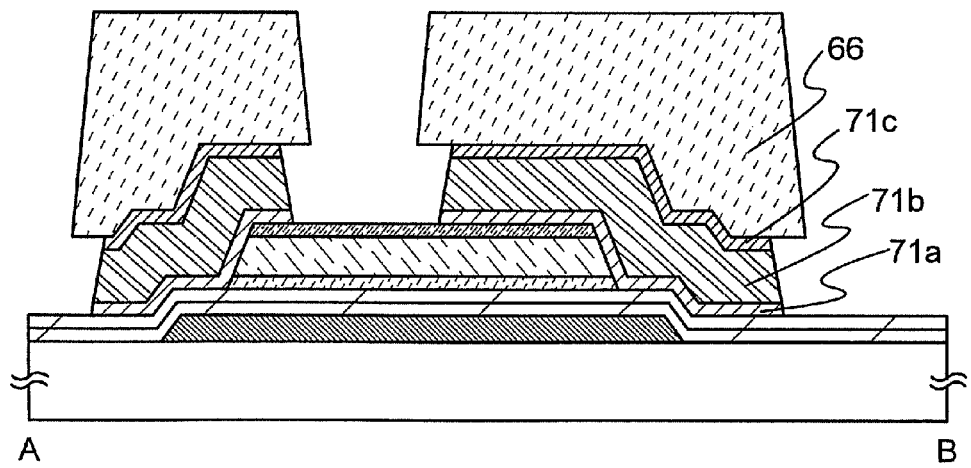

Next, as illustrated in FIG. 5C, the conductive films 65a to 65c are partly etched to form pairs of the wirings 71a to 71c (serving as source and drain electrodes). Here, the conductive films 65a to 65c are etched by wet etching using the resist mask 66 that is formed by a photolithography process using a third photomask, so that the conductive films 65a to 65c are isotropically etched. Consequently, the wirings 71a to 71c, which have smaller areas than the resist mask 66, can be formed.

Figure 6A:
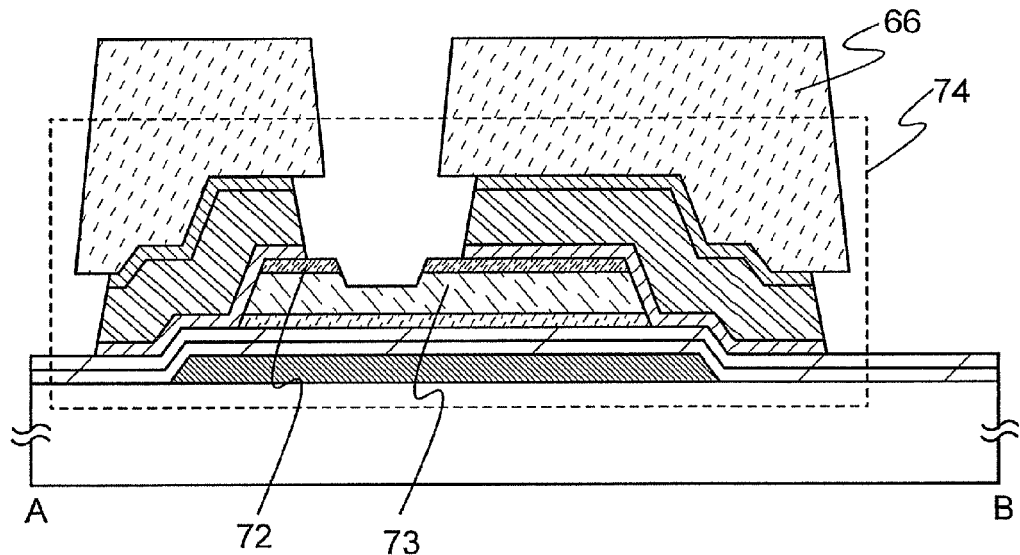
FIGS. 6A to 6C are cross-sectional views illustrating a method for manufacturing a thin film transistor of the present invention.

Then, the semiconductor film 63 to which the impurity element imparting one conductivity type is added is etched to be separated using the resist mask 66. As a result, a pair of source and drain regions 72 can be formed as illustrated in FIG. 6A. In the etching process, the buffer layer 62 is also partly etched. The buffer layer which is etched partly and has a recessed portion is referred to as a buffer layer 73. The source and drain regions and the recessed portion of the buffer layer can be formed in the same process. The depth of the recessed portion in the buffer layer is set to be half to one third of the thickness of the thickest region in the buffer layer, so that the source and drain regions can have a distance therebetween. Accordingly, leakage between the source and drain regions can be reduced. After that, the resist mask 66 is removed.

Next, dry etching is performed under such a condition that the buffer layer which is exposed is not damaged and an etching rate with respect to the buffer layer is low. Through this dry etching process, an etching residue on the buffer layer between the source and drain regions, a residue of the resist mask, and a contamination source in an apparatus used for removal of the resist mask can be removed, whereby the source and drain regions can be certainly insulated. As a result, leakage of the thin film transistor can be reduced, so that a thin film transistor with small off current and high withstand voltage can be manufactured. A chlorine gas can be used for an etching gas, for example.

Figure 7B:
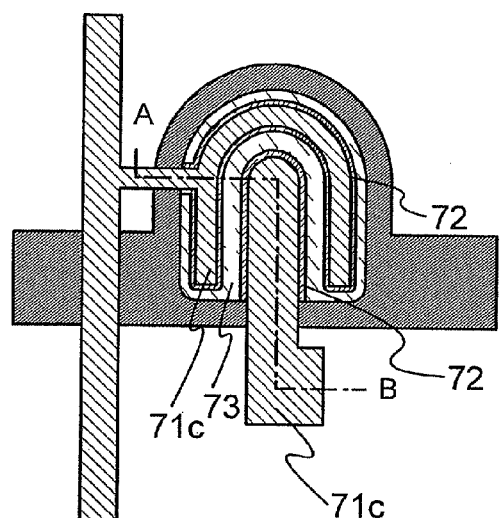

FIG. 6A illustrates a cross-sectional view taken along a line A-B in FIG. 7B (excluding the resist mask 66). As illustrated in FIG. 7B, end portions of the source and drain regions 72 are located outside end portions of the wirings 71c. Further, end portions of the buffer layer 73 are located outside end portions of the wirings 71c and end portions of the source and drain regions 72. Furthermore, one of the wirings surrounds the other (specifically, the former wiring is in a U-shape or a C-shape). Thus, an area of a region in which carriers travel can be increased, and thus, the amount of current can be increased and an area of a thin film transistor can be reduced. Over the gate electrode, the microcrystalline semiconductor film and the wirings are overlapped, and thus, an influence by unevenness due to the gate electrode is small and reduction in coverage and generation of leakage can be suppressed.

Through the above process, a channel-etched thin film transistor 74 can be formed.

Figure 6B:
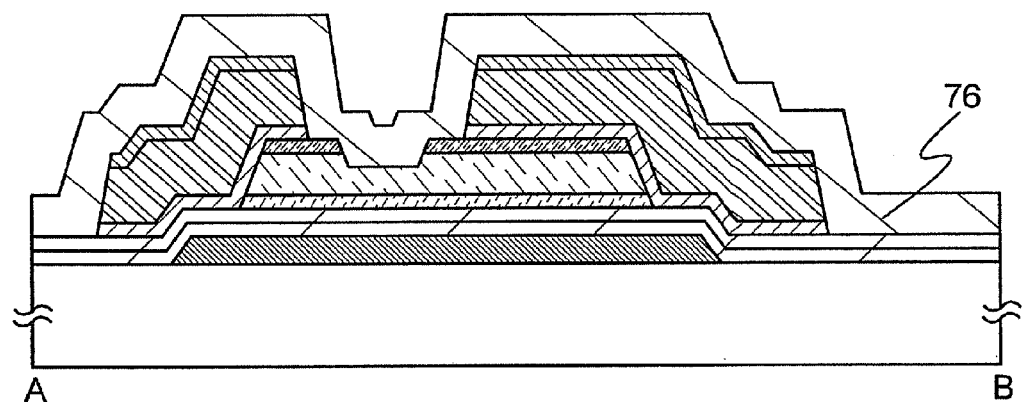

Next, as illustrated in FIG. 6B, a protective insulating film 76 is formed over the wirings 71a to 71c, the source and drain regions 72, the buffer layer 73, the microcrystalline semiconductor film 58, and the gate insulating film 52b. The protective insulating film 76 can be formed in a similar manner to the gate insulating films 52a and 52b. The protective insulating film 76 prevents penetration of a contaminating impurity such as an organic matter, a metal, or water vapor included in the air; thus, a dense film is preferably used for the protective insulating film 76. Further, by using a silicon nitride film as the protective insulating film 76, the oxygen concentration in the buffer layer 73 can be set at less than or equal to $5 \times 10^{19}$ atoms/cm$^3$, preferably less than or equal to $1 \times 10^{19}$ atoms/cm$^3$, so that the buffer layer 73 can be prevented from being oxidized.

Figure 6C:
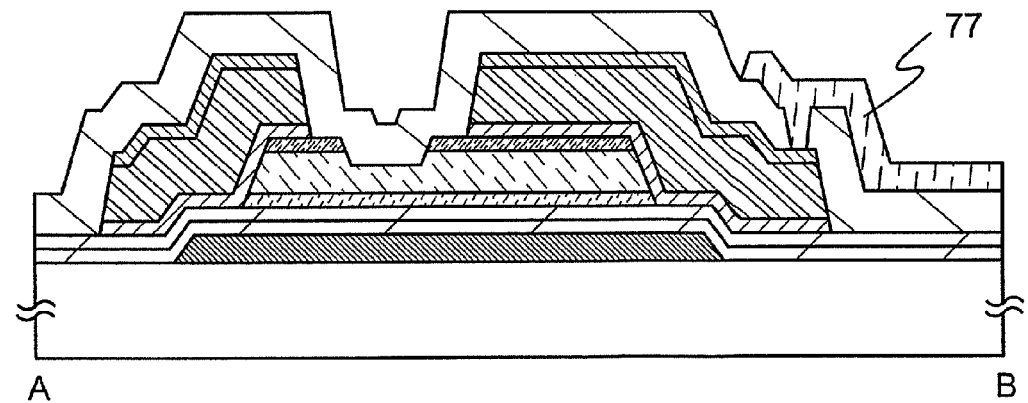
Figure 7C:
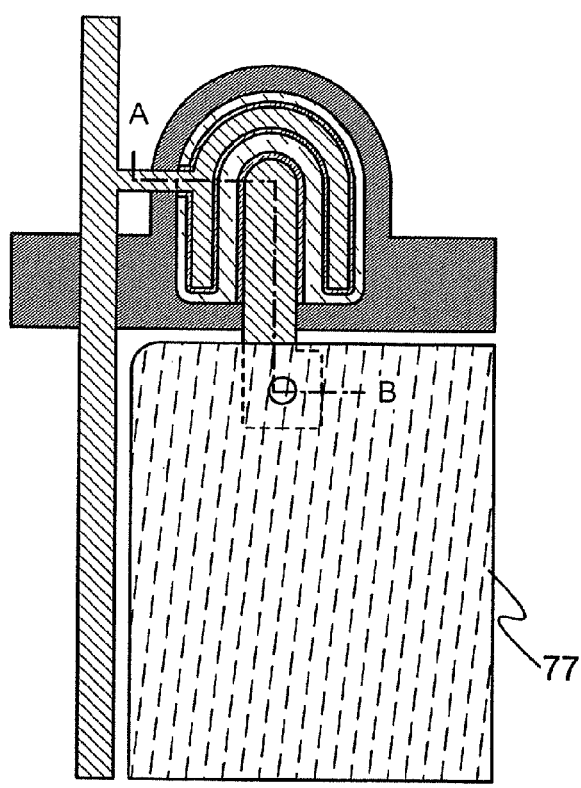

Next, as illustrated in FIG. 6C, a contact hole is formed in the protective insulating film 76 by partly etching the protective insulating film 76 using a resist mask formed using a fourth photomask. Then, a pixel electrode 77 that is in contact with the wiring 71c in the contact hole is formed. FIG. 6C illustrates a cross-sectional view taken along a line A-B in FIG. 7C. When one of the wirings 71a to 71c in contact with the pixel electrode 77 of a display element, are used as drain electrodes and the other wirings 71a to 71c facing the wirings 71a to 71c used as drain electrodes are used as source electrodes (source wirings), on current of a thin film transistor can be increased. In addition, deterioration due to repeated operation can be suppressed. Further, parasitic capacitance caused between the gate electrode 51 and the wirings 71a to 71c serving as drain electrodes is hardly generated and charges are easily stored in the pixel electrode 77. Thus, in the case where the thin film transistor is used for a liquid crystal display device, high speed operation can be achieved.

The pixel electrode 77 can be formed of a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

The pixel electrode 77 can be formed using a conductive composition including a conductive high-molecular compound (also referred to as a conductive polymer). It is preferable that a pixel electrode formed using a conductive composition have sheet resistance of less than or equal to 10000 Ω/square, and light transmittance of greater than or equal to 70% at a wavelength of 550 nm. In addition, the resistivity of the conductive high-molecular compound which is included in the conductive composition is preferably less than or equal to 0.1 Ω·cm.

As the conductive high-molecular compound, a so-called π electron conjugated conductive high-molecular compound can be used. Examples thereof include polyaniline and its derivatives, polypyrrole and its derivatives, polythiophene and its derivatives, and copolymers of two or more kinds of them.

Here, the pixel electrode 77 is formed as follows: an ITO film is formed by a sputtering method, a resist is applied on the ITO film and exposed to light and developed using a fifth photomask, thereby forming a resist mask, and then the ITO film is etched using the resist mask.

Accordingly, a thin film transistor and an element substrate that can be used for a display device can be formed.

In the film formation treatment of the microcrystalline semiconductor film, helium may be added to a reaction gas in addition to silane and hydrogen. Since helium has an ionization energy of 24.5 eV that is the largest among all gases, and has a metastable state in the level of approximately 20 eV that is a little lower than the ionization energy, only the difference of approximately 4 eV is necessary for ionization while keeping discharge. Therefore, the discharge starting voltage also shows the lowest value among all gases. By such characteristics, plasma can be held stably with helium. Further, since uniform plasma can be formed with helium, even if the area of a substrate over which a microcrystalline silicon film is deposited is large, an effect of making plasma density uniform can be obtained.

In accordance with this embodiment mode, a thin film transistor using a microcrystalline semiconductor film which has high crystallinity in a channel formation region can be manufactured.

In addition, a channel formation region of the thin film transistor which is manufactured in this embodiment mode is formed of a microcrystalline semiconductor film with high crystallinity. Thus, a driving frequency of a display device can be increased, whereby the panel size can be increased and high density of pixels in the display device can be achieved. Furthermore, the thin film transistor can be manufactured over a large-sized substrate.

Further, in the thin film transistor manufactured in this embodiment mode, an amorphous semiconductor film with high resistivity is formed as the buffer layer between the microcrystalline semiconductor film which serves as a channel formation region and the semiconductor films to which the impurity element imparting one conductivity type is added and which serve as source and drain regions. Off current flows through the buffer region. However, because the buffer layer is a high-resistance region, off current can be suppressed, and furthermore, the microcrystalline semiconductor film can be prevented from being oxidized. Accordingly, off current can be suppressed, and increase in on current can be realized because defects in the channel formation region are reduced.

Next, a method for manufacturing a thin film transistor, which is different from that in the above modes, is described with reference to FIGS. 9A and 9B, FIGS. 10A to 10D, FIGS. 11A to 11C, FIGS. 12A and 12B, FIGS. 13A and 13B, FIGS. 14A to 14C, and FIGS. 15A to 15C. Here, a process is shown through which the number of photomasks can be smaller than in the above modes and through which a thin film transistor can be manufactured.

Figure 9A:
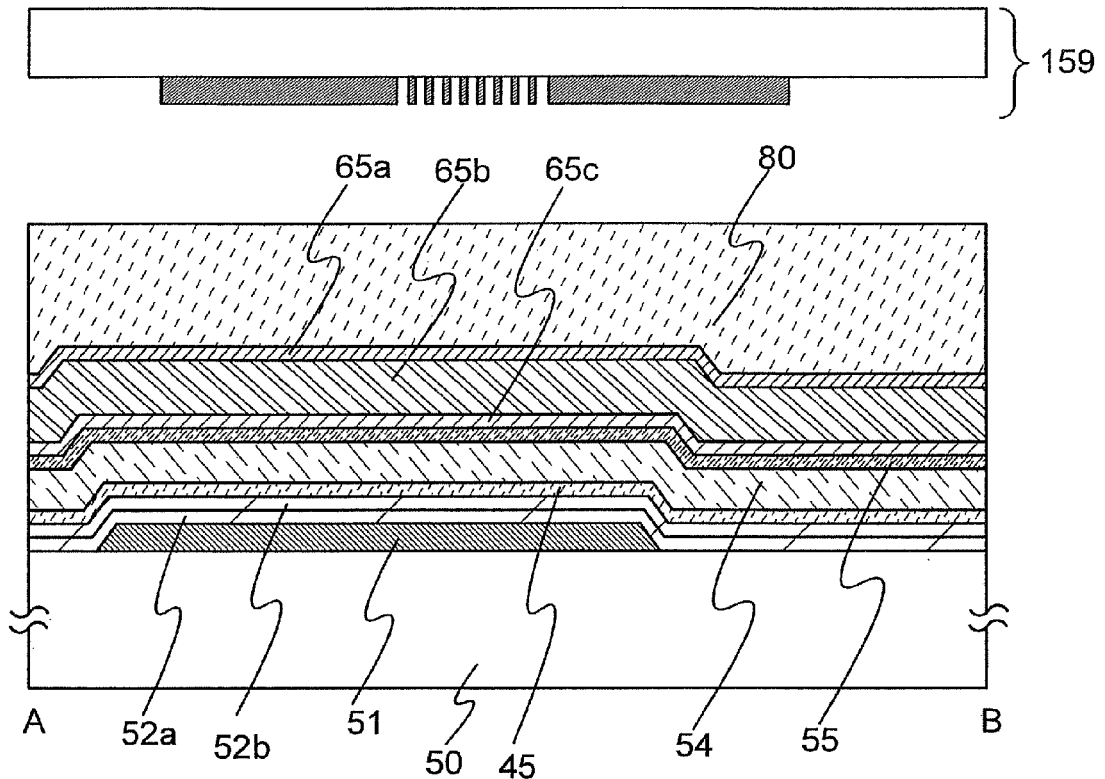
FIGS. 9A and 9B are cross-sectional views illustrating a method for manufacturing a thin film transistor of the present invention.

In a similar manner to FIG. 4A, a conductive film is formed over the substrate 50, a resist is applied on the conductive film, and a part of the conductive film is etched using a resist mask which is formed by a photolithography process using the first photomask, so that the gate electrode 51 is formed. Then, as illustrated in FIG. 9A, the gate insulating films 52a and 52b are formed over the gate electrode 51. Then, the microcrystalline semiconductor film 45, the buffer layer 54, the semiconductor film 55 to which an impurity element imparting one conductivity type is added, and the conductive films 65a to 65c are formed in this order. Then, a resist 80 is applied on the conductive film 65c.

The resist 80 can be a positive type resist or a negative type resist. In this case, a positive type resist is used.

Next, a multi-tone mask 159 is used as the second photomask and the resist 80 is irradiated with light, whereby the resist 80 is exposed to light.

Now, light exposure using the multi-tone mask 159 is described with reference to FIGS. 10A to 10D.

A multi-tone mask can achieve three levels of light exposure, an exposed portion, a half-exposed portion, and an unexposed portion, and one-time light exposure and development process allows a resist mask with regions of plural thicknesses (typically, two kinds of thicknesses) to be formed. Thus, the use of the multi-tone mask can reduce the number of photomasks.

Figure 10A:
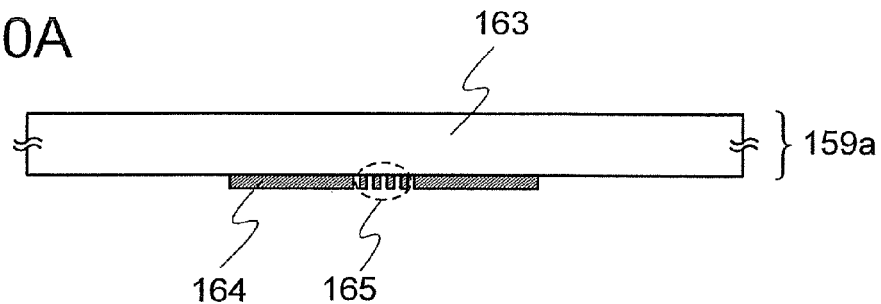
FIGS. 10A to 10D are diagrams illustrating a multi-tone mask applicable to the present invention.
Figure 10B:
Figure 10C:
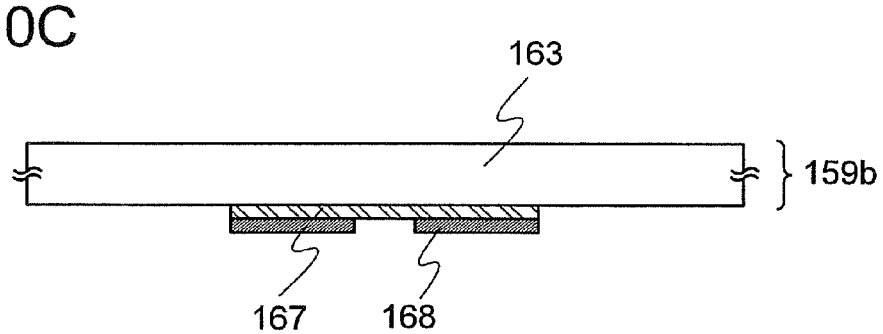

Typical examples of a multi-tone mask include a gray-tone mask 159a illustrated in FIG. 10A and a half-tone mask 159b illustrated in FIG. 10C.

As illustrated in FIG. 10A, the gray-tone mask 159a includes a light-transmitting substrate 163 provided with a light-blocking portion 164 and a diffraction grating 165. The light transmittance of the light-blocking portion 164 is 0%. The diffraction grating 165 has a light-transmitting portion in a slit form, a dot form, a mesh form, or the like with intervals which are less than or equal to the resolution limit of light used for the exposure; thus, the light transmittance can be controlled. The diffraction grating 165 can be in a slit form, a dot form, or a mesh form with regular intervals; or in a slit form, a dot form, or a mesh form with irregular intervals.

For the light-transmitting substrate 163, a substrate having a light-transmitting property, such as a quartz substrate, can be used. The light-blocking portion 164 and the diffraction grating 165 can be formed using a light-blocking material such as chromium or chromium oxide, which absorbs light.

When the gray-tone mask 159a is irradiated with light for exposure, a light transmittance 166 of the light-blocking portion 164 is 0% and that of a region where neither the light-blocking portion 164 nor the diffraction grating 165 is provided is 100%, as illustrated in FIG. 10B. The light transmittance of the diffraction grating 165 can be controlled in a range of from 10% to 70%. The light transmittance of the diffraction grating 165 can be controlled with an interval or a pitch of slits, dots, or meshes of the diffraction grating 165.

As illustrated in FIG. 10C, the half-tone mask 159b includes the light-transmitting substrate 163 provided with a semi-light-transmitting portion 167 and a light-blocking portion 168. MoSiN, MoSi, MoSiO, MoSiON, CrSi, or the like can be used for the semi-light-transmitting portion 167. The light-blocking portion 168 can be formed using a light-blocking material such as chromium or chromium oxide, which absorbs light.

Figure 10D:
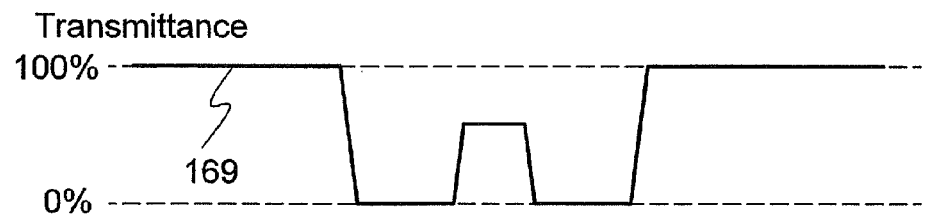

When the half-tone mask 159b is irradiated with light for exposure, a light transmittance 169 of the light-blocking portion 168 is 0% and that of a region where neither the light-blocking portion 168 nor the semi-light-transmitting portion 167 is provided is 100%, as illustrated in FIG. 10D. The light transmittance of the semi-light-transmitting portion 167 can be controlled in a range of from 10% to 70%. The light transmittance of the semi-light-transmitting portion 167 can be controlled with the material of the semi-light-transmitting portion 167.

Figure 9B:
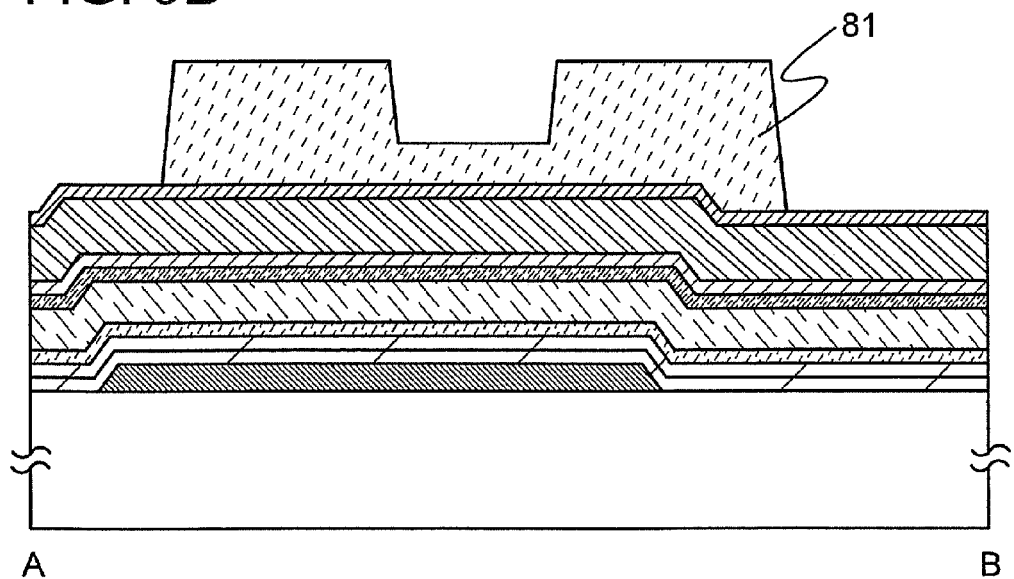

After the light exposure using the multi-tone mask is performed, development is carried out, whereby a resist mask 81 having regions with different thicknesses can be formed, as illustrated in FIG. 9B.

Figure 11A:
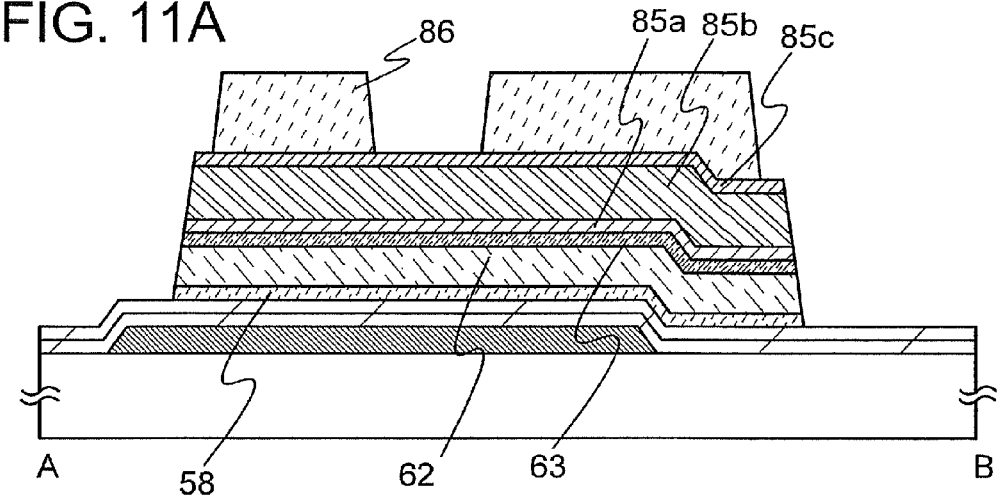
FIGS. 11A to 11C are cross-sectional views illustrating a method for manufacturing a thin film transistor of the present invention.

Next, with the resist mask 81, the microcrystalline semiconductor film 45, the buffer layer 54, the semiconductor film 55 to which the impurity element imparting one conductivity type is added, and the conductive films 65a to 65c are etched. As a result, the microcrystalline semiconductor film 58, the buffer layer 62, the semiconductor film 63 to which the impurity element imparting one conductivity type is added, and conductive films 85a to 85c can be formed, as illustrated in FIG. 11A. FIG. 11A illustrates a cross-sectional view taken along a line A-B in FIG. 15A (excluding the resist mask 81).

Next, ashing is conducted on the resist mask 81. As a result, the area and the thickness of the resist are reduced. At this time, the resist in a region with a small thickness (a region overlapping with part of the gate electrode 51) is removed to form a separated resist mask 86, as illustrated in FIG. 11A.

Figure 11B:
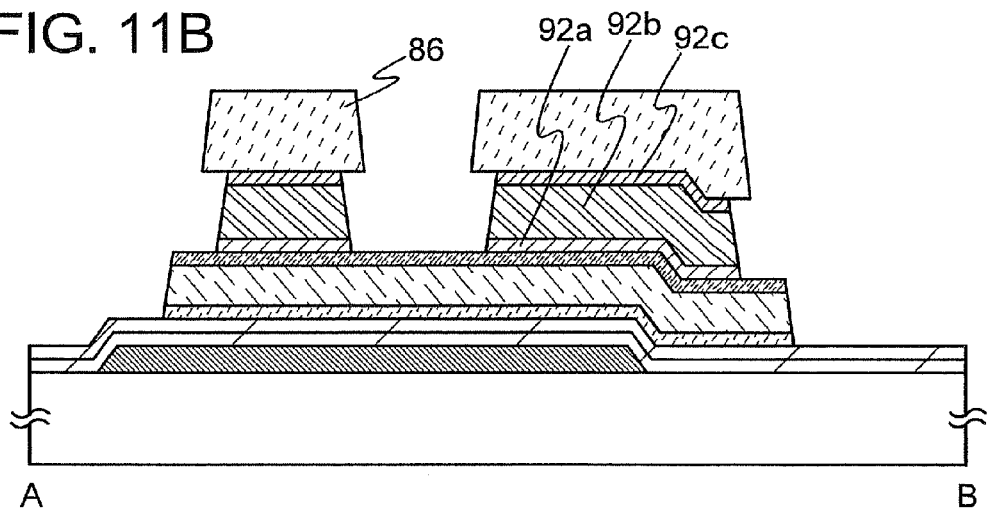

Next, the conductive films 85a to 85c are etched to be separated using the resist mask 86. As a result, pairs of wirings 92a to 92c can be formed as illustrated in FIG. 11B. Here, by wet etching of the conductive films 85a to 85c with the use of the resist mask 86, the conductive films 85a to 85c are isotropically etched. As a result, the wirings 92a to 92c with smaller areas than the resist mask 86 can be formed.

Next, the semiconductor film 63 to which the impurity element imparting one conductivity type is added is etched using the resist mask 86, so that a pair of source and drain regions 88 are formed. Note that, in this etching step, a part of the buffer layer 62 is also etched. The buffer layer which is partly etched is referred to as a buffer layer 87. The buffer layer 87 has a recessed portion. The source and drain regions and the recessed portion of the buffer layer can be formed in the same process. Here, the buffer layer 62 is partly etched with the use of the resist mask 86 having a smaller area than the resist mask 81, so that end portions of the buffer layer 87 are located outside those of the source and drain regions 88. In addition, the end portions of the wirings 92a to 92c are not aligned with those of the source and drain regions 88, and the end portions of the source and drain regions 88 are formed outside those of the wirings 92a to 92c. After that, the resist mask 86 is removed.

Next, dry etching may be performed under such a condition that the buffer layer which is exposed is not damaged and an etching rate with respect to the buffer layer is low. Through this dry etching process, an etching residue on the buffer layer between the source and drain regions, a residue of the resist mask, and a contamination source in the apparatus used for removal of the resist mask can be removed, whereby the source and drain regions can be certainly insulated. As a result, leakage of the thin film transistor can be reduced, so that a thin film transistor with small off current and high withstand voltage can be manufactured. A gas including chlorine, a gas including fluorine, or the like can be used for an etching gas, for example.

Figure 11C:
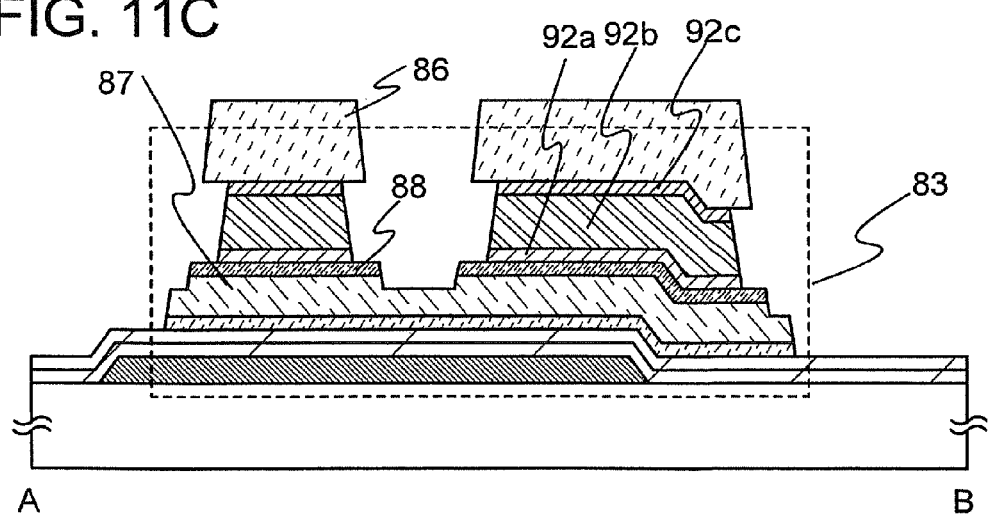

As illustrated in FIG. 11C, the end portions of the wirings 92a to 92c are not aligned with those of the source and drain regions 88, whereby the end portions of the wirings 92a to 92c can have a larger distance therebetween; thus, leakage or short-circuit between the wirings can be prevented. Accordingly, an inverted staggered thin film transistor can be manufactured.

Through the above process, a channel-etched thin film transistor 83 can be formed. In addition, the thin film transistor can be formed using two photomasks.

Figure 12A:
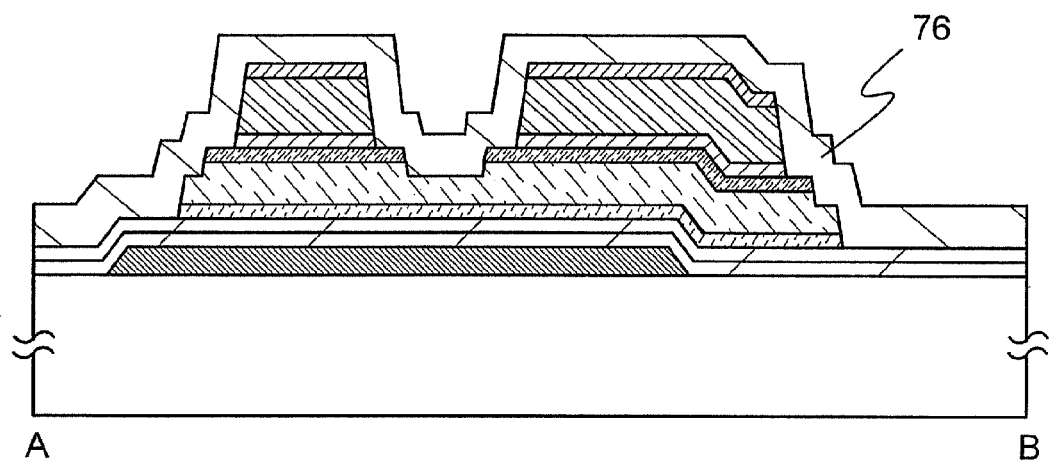
FIGS. 12A and 12B are cross-sectional views illustrating a method for manufacturing a thin film transistor of the present invention.

Next, as illustrated in FIG. 12A, the protective insulating film 76 is formed over the wirings 92a to 92c, the source and drain regions 88, the buffer layer 87, the microcrystalline semiconductor film 58, and the gate insulating film 52b.

Figure 12B:
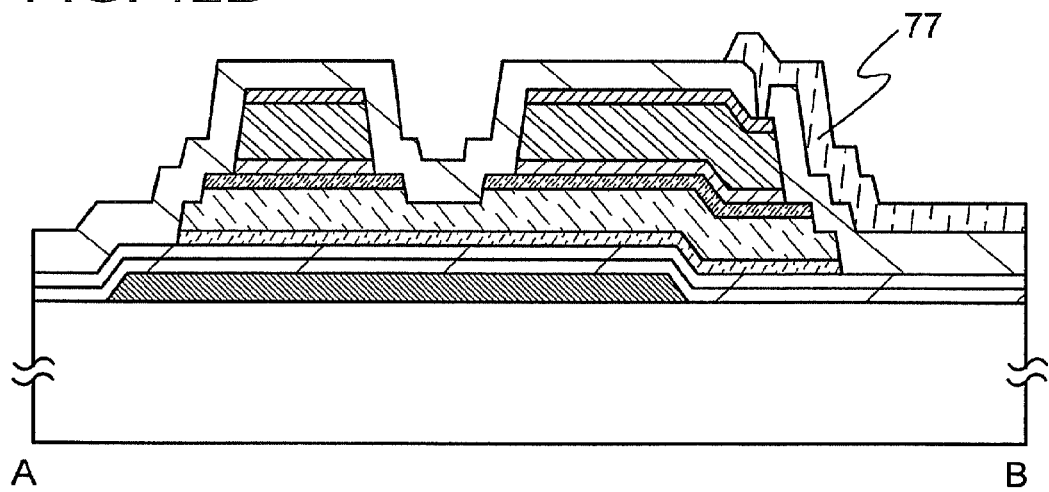

Next, a contact hole is formed in the protective insulating film 76 by partly etching the protective insulating film 76 using a resist mask formed using the third photomask. Then, the pixel electrode 77 that is in contact with the wiring 71c in the contact hole is formed. Here, the pixel electrode 77 is formed as follows: an ITO film is formed by a sputtering method, a resist is applied on the ITO film and exposed to light and developed using the fourth photomask, thereby forming a resist mask, and then the ITO film is etched using the resist mask. Note that FIG. 12B illustrates a cross-sectional view taken along a line A-B in FIG. 15C.

Through the above process, a thin film transistor and an element substrate which includes the thin film transistor and which can be used for a display device can be formed.

Next, a process in which a contact hole and a capacitor element can be formed with the use of only one photomask is described below. Here, a cross-sectional view taken along a line C-D in FIGS. 15A to 15C is illustrated.

Figure 13A:
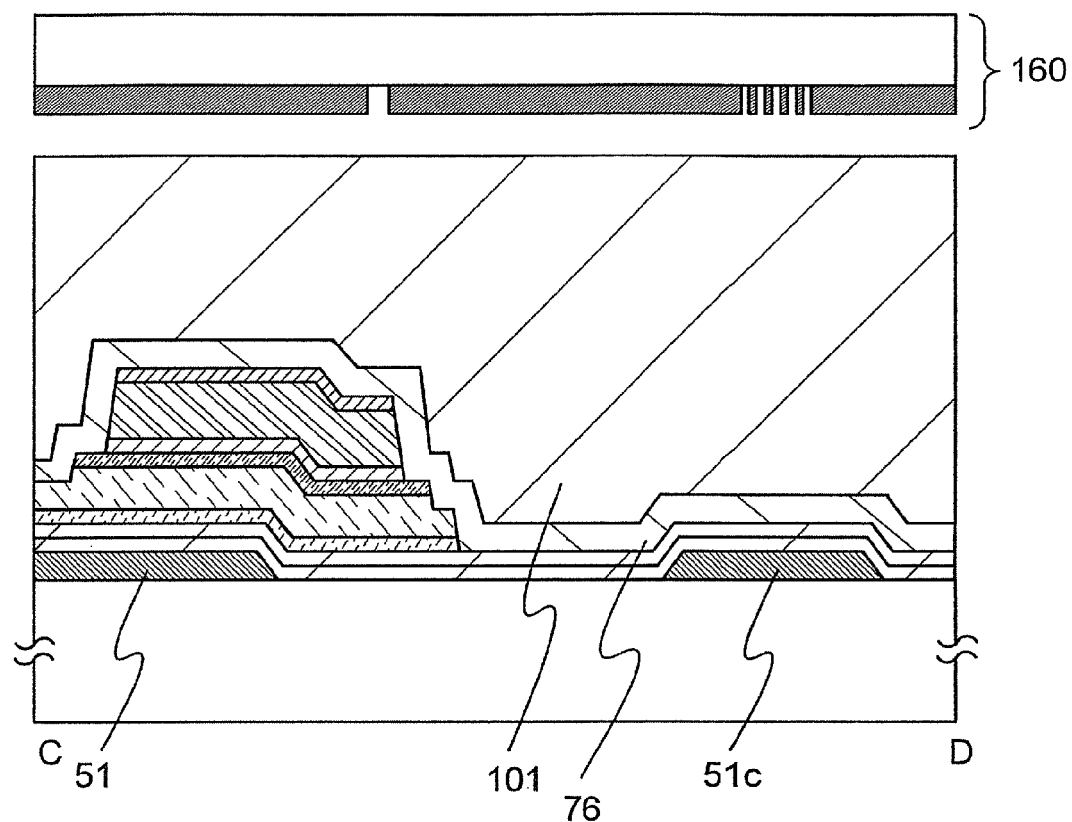
FIGS. 13A and 13B are cross-sectional views illustrating a method for manufacturing a thin film transistor of the present invention.
Figure 13B:
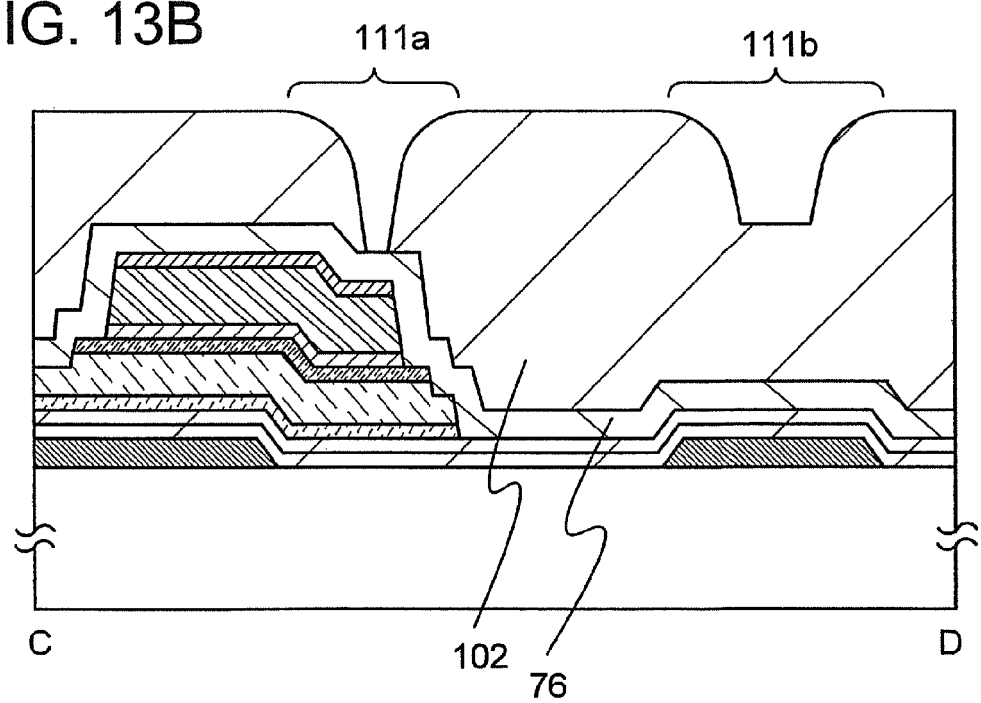

After the step illustrated in FIG. 12A, an insulating film 101 is formed over the protective insulating film 76 as illustrated in FIG. 13A. The insulating film 101 is formed using a photosensitive organic resin here. Then, the insulating film 101 is exposed to light using a multi-tone mask 160 and developed, whereby a recessed portion 111a which exposes the protective insulating film 76 covering the wiring of the thin film transistor and a recessed portion 111b over a capacitor wiring 51c are formed as illustrated in FIG. 13B. Here, by use of the multi-tone mask 160, the insulating film 101 can be exposed to 100% transmitting light over the wiring of the thin film transistor, and the insulating film 101 can be exposed to transmitting light which is attenuated to 10% to 70% over the capacitor wiring 51c.

Figure 14A:
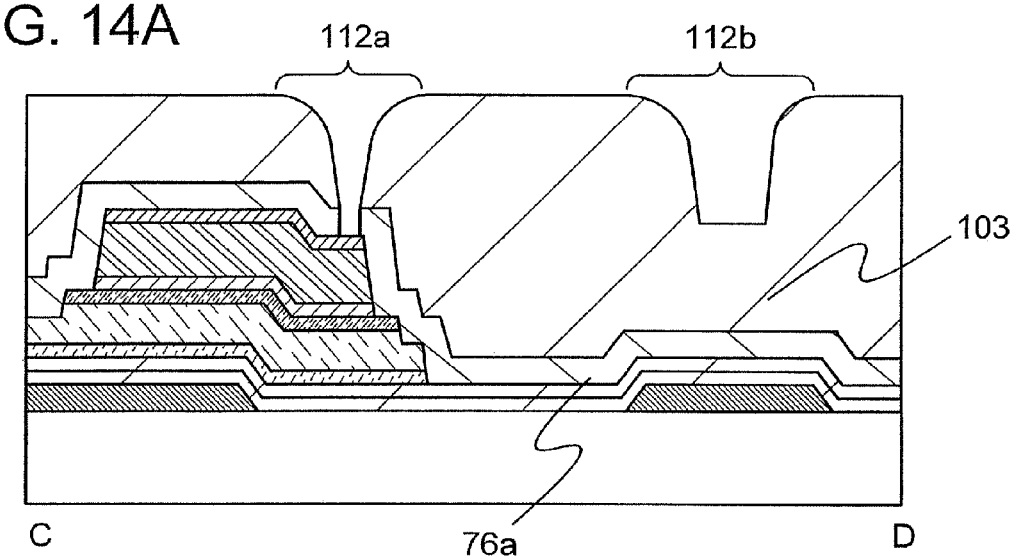
FIGS. 14A to 14C are cross-sectional views illustrating a method for manufacturing a thin film transistor of the present invention.
Figure 14B:
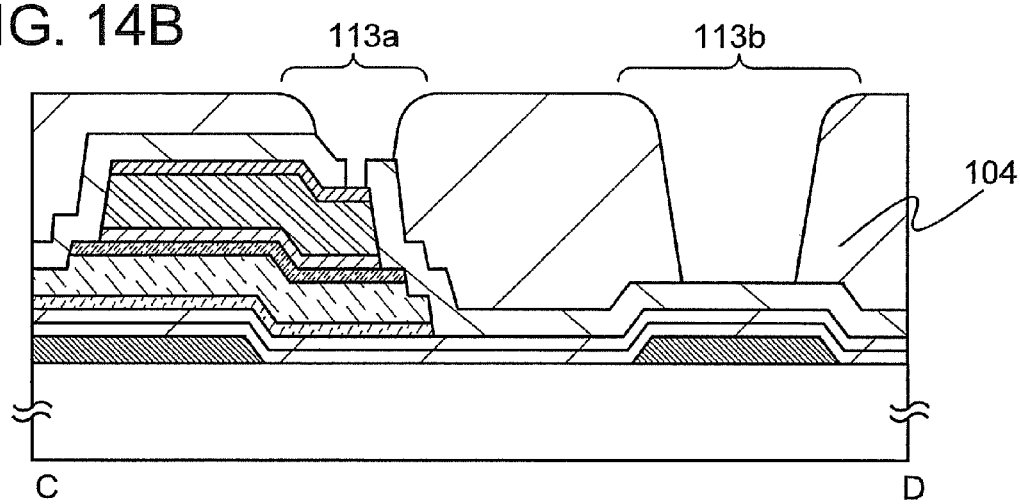
Figure 14C:
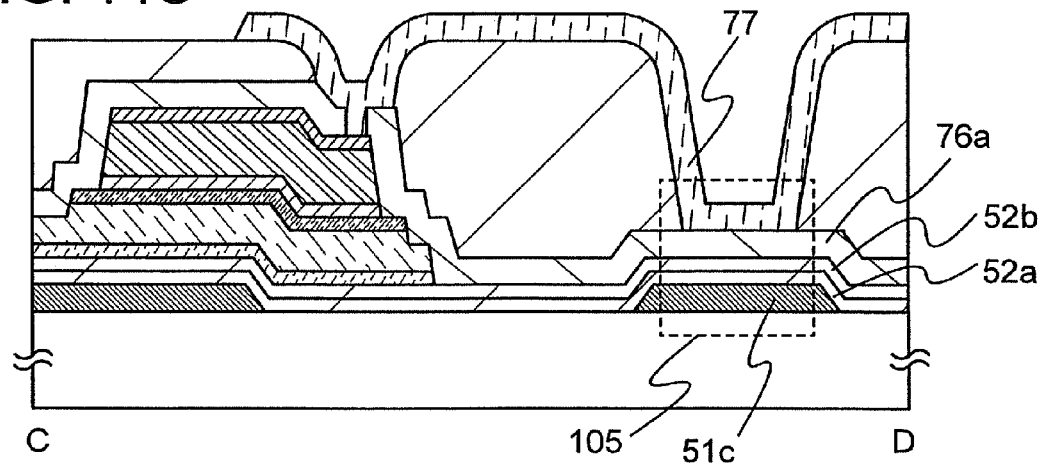

Next, the protective insulating film 76 and the insulating film 102 having the recessed portions are etched (etch back), then, a part of a protective insulating film 76a is etched. As a result, an insulating film 103 having a contact hole 112a which exposes the wiring and a recessed portion 112b over the capacitor wiring 51c is formed as illustrated in FIG. 14A.

Next, ashing is conducted on the insulating film 103, and the areas of the contact hole 112a and the recessed portion 112b are widened, so that an insulating film 104 having a contact hole 113a and a recessed portion 113b is formed. Since the protective insulating film 76 is not formed of a photosensitive organic resin but formed of an inorganic insulating film, it is not processed by ashing. Therefore, the contact hole 113a over the wirings has a top shape with double circles.

After that, the pixel electrode 77 is formed, and a capacitor element 105 including the capacitor wiring 51c, the gate insulating films 52a and 52b, the protective insulating film 76a, and the pixel electrode 77 can be formed.

Through the above process, the contact hole connecting the pixel electrode with the wiring, and the capacitor element can be formed by using only one multi-tone mask.

Figure 16:
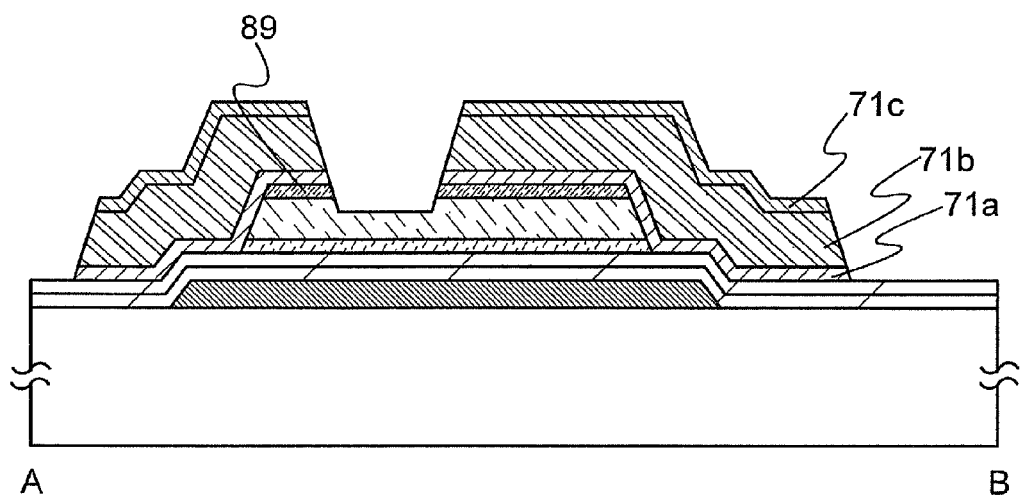
FIG. 16 is a cross-sectional view illustrating a method for manufacturing a thin film transistor of the present invention.

Further, after forming the wirings 71a to 71c in FIG. 5C or the wirings 92a to 92c in FIG. 11B, the resist mask 66 or the resist mask 86 may be removed, and the semiconductor film 63 to which the impurity element imparting one conductivity type is added may be etched using the wirings 71a to 71c or the wirings 92a to 92c as masks. As a result, a thin film transistor in which end portions of the wirings 71a to 71c or the wirings 92a to 92c are aligned with those of the source and drain regions 72 or the source and drain regions 88 can be formed. Here, after removing the resist mask 66 illustrated in FIG. 5C, the semiconductor film 63 to which the impurity element imparting one conductivity type is added is etched using the wirings 71a to 71c as masks, so that a thin film transistor in which end portions of the source and drain regions 89 are aligned with those of the wirings 71a to 71c can be formed as illustrated in FIG. 16.

Although this embodiment mode describes a channel-etched thin film transistor, a microcrystalline semiconductor film can also be used in a channel formation region of a channel protective thin film transistor.

Specifically, as illustrated in FIG. 4A, the gate electrode 51 is formed over the substrate 50, and the gate insulating films 52a and 52b are formed over the gate electrode 51. Then, the microcrystalline semiconductor film 45 is formed.

Figure 17:
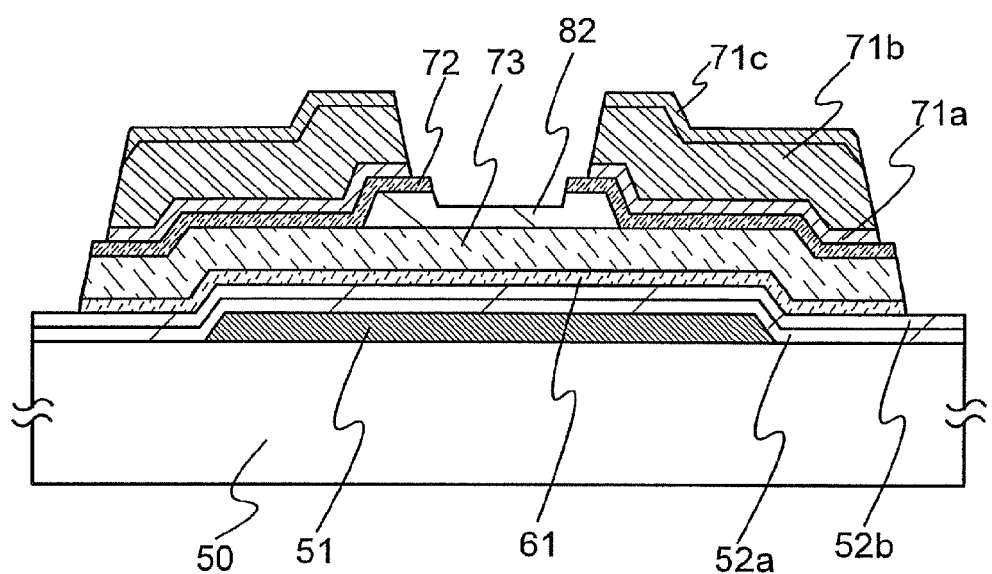
FIG. 17 is a cross-sectional view illustrating a method for manufacturing a thin film transistor of the present invention.

As illustrated in FIG. 4E, the buffer layer 54 is formed over the microcrystalline semiconductor film 45. Then, a channel protective film is formed in a region which is over the buffer layer 54 and which overlaps with the gate electrode 51. The channel protective film can be formed by forming a silicon nitride film, a silicon oxide film, a silicon nitride oxide film, or a silicon oxynitride film and selectively etching the film through a photolithography process. Alternatively, the channel protective film can be formed by discharging a composition including polyimide, acrylic, or siloxane and baking it. Next, a semiconductor film to which an impurity element imparting one conductivity type is added and conductive films are formed in this order. Then, using a resist mask which is formed through a photolithography process, the conductive films, the semiconductor film to which the impurity element imparting one conductivity type is added, the buffer layer, a microcrystalline semiconductor film not including the impurity element which serves as a donor, and a microcrystalline semiconductor film including the impurity element which serves as a donor are etched to be separated. Consequently, a microcrystalline semiconductor film 61, the buffer layer 73, the source and drain regions 72, and the wirings 71a to 71c which serve as source and drain electrodes are formed as illustrated in FIG. 17. Further, a channel protective film 82 having a recessed portion in a part thereof is formed.

Through the above process, a channel protective thin film transistor can be formed.

Figure 18:
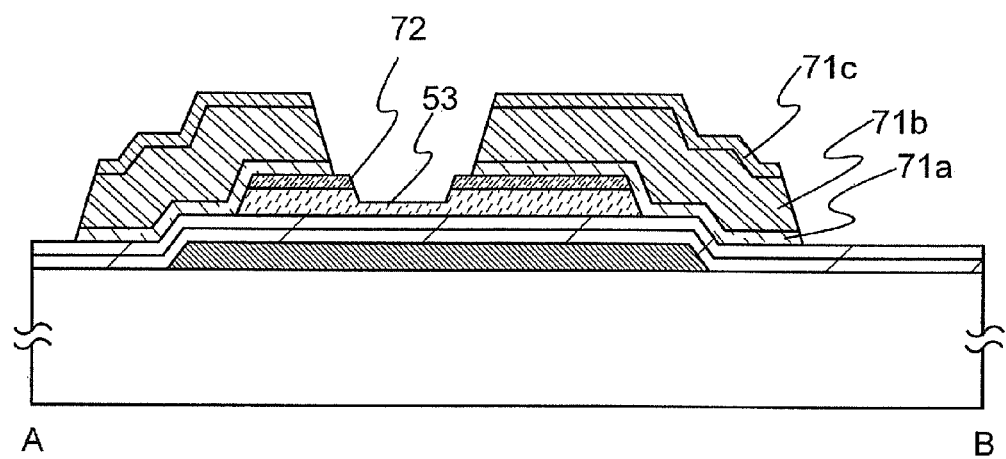
FIG. 18 is a cross-sectional view illustrating a method for manufacturing a thin film transistor of the present invention.

Although this embodiment mode describes a thin film transistor having a buffer layer formed over a microcrystalline semiconductor film, a thin film transistor having the source and drain regions 72 which are in contact with a microcrystalline semiconductor film 53 can be employed as illustrated in FIG. 18. In the case of the thin film transistor having the source and drain regions 72 which are in contact with the microcrystalline semiconductor film 53, the microcrystalline semiconductor film 53 has a recessed portion because the microcrystalline semiconductor film is partly etched when the source and drain regions 72, which are separated from each other, are formed.

Figure 19:
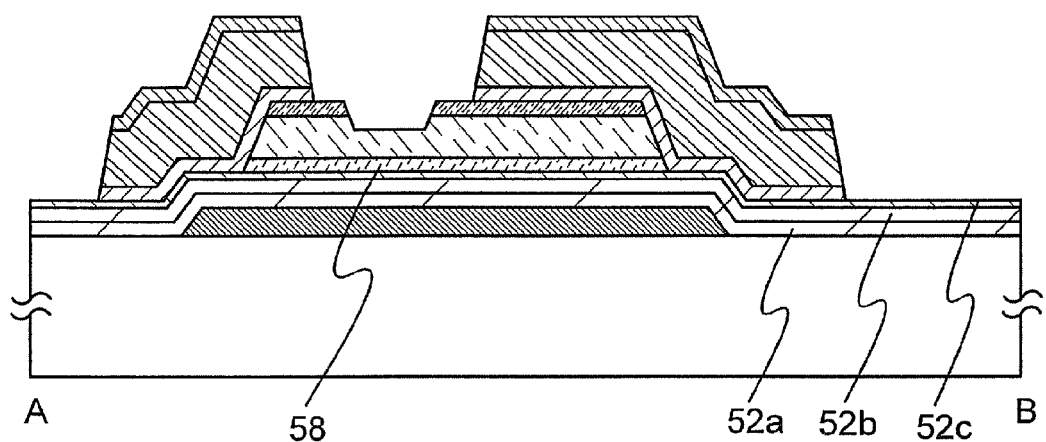
FIG. 19 is a cross-sectional view illustrating a method for manufacturing a thin film transistor of the present invention.

Instead of the gate insulating films 52a and 52b of the thin film transistor illustrated in FIG. 4A, three gate insulating films 52a, 52b, and 52c may be formed as illustrated in FIG. 19. As the gate insulating film 52c, which is a third layer, a silicon nitride film or a silicon nitride oxide film with a thickness of from 1 nm to 5 nm approximately can be formed.

When a silicon nitride film or a silicon nitride oxide film with a thickness of from 1 nm to 5 nm approximately is formed as the gate insulating film 52c, which is the third layer, a plasma CVD method can be employed. Further, it is also possible to have the gate insulating film 52b undergo a nitridation treatment with high-density plasma to form a silicon nitride layer over the surface of the gate insulating film 52b. By high-density plasma nitridation, a silicon nitride layer that includes nitrogen at a higher concentration can be obtained. The high-density plasma is generated by use of high-frequency microwaves, for example, microwaves with a frequency of 2.45 GHz. With high-density plasma, which has the characteristic of having low electron temperature, a layer can be formed with less plasma damage and fewer defects compared to a layer formed by a conventional plasma treatment because the kinetic energy of an active species is low. In addition, carrier mobility can be increased because the level of roughness of the surface of the gate insulating film 52b can be reduced.

Further, after the gate insulating films 52a and 52b are formed, a deposition gas including silicon or germanium is supplied into a reaction chamber of a film formation apparatus, and a source gas of the gate insulating films 52a and 52b, which is left in the reaction chamber, particularly, a gas including oxygen or nitrogen is preferably removed. Through the process, the oxygen concentration and the nitrogen concentration in the reaction chamber can be reduced, and the oxygen concentration and the nitrogen concentration in a microcrystalline semiconductor film to be formed later can be reduced. As a result, a microcrystalline semiconductor film which has fewer defects can be formed.

Furthermore, after the gate insulating films 52a and 52b are formed, a gas including an impurity element which serves as a donor is supplied into a reaction chamber of a film formation apparatus, whereby an impurity element which serves as a donor may be adsorbed onto an inner wall of the reaction chamber and a surface of the gate insulating film 52b. As a result, an impurity element which serves as a donor can be added to the gate insulating film 52c and the semiconductor film, which are formed later. That is, a microcrystalline semiconductor film including an impurity element which serves as a donor can be formed.

In addition, although, in this embodiment mode, as a method for forming a microcrystalline semiconductor film, the method described in Embodiment Mode 1 is employed, the method of Embodiment Mode 2 or 3 can be employed as appropriate.

For example, by using the microcrystalline semiconductor film including an impurity element which serves as a donor, which is described in Embodiment Mode 3, in a channel formation region, an accumulation-type thin film transistor can be manufactured and crystallinity at an interface between the gate insulating film 52b and the microcrystalline semiconductor film 58 can be improved.

Next, as an example of a plasma CVD apparatus to which the above reaction chamber is applied, a structure which is suitable for deposition of a gate insulating film and a microcrystalline semiconductor film is described.

Figure 8:
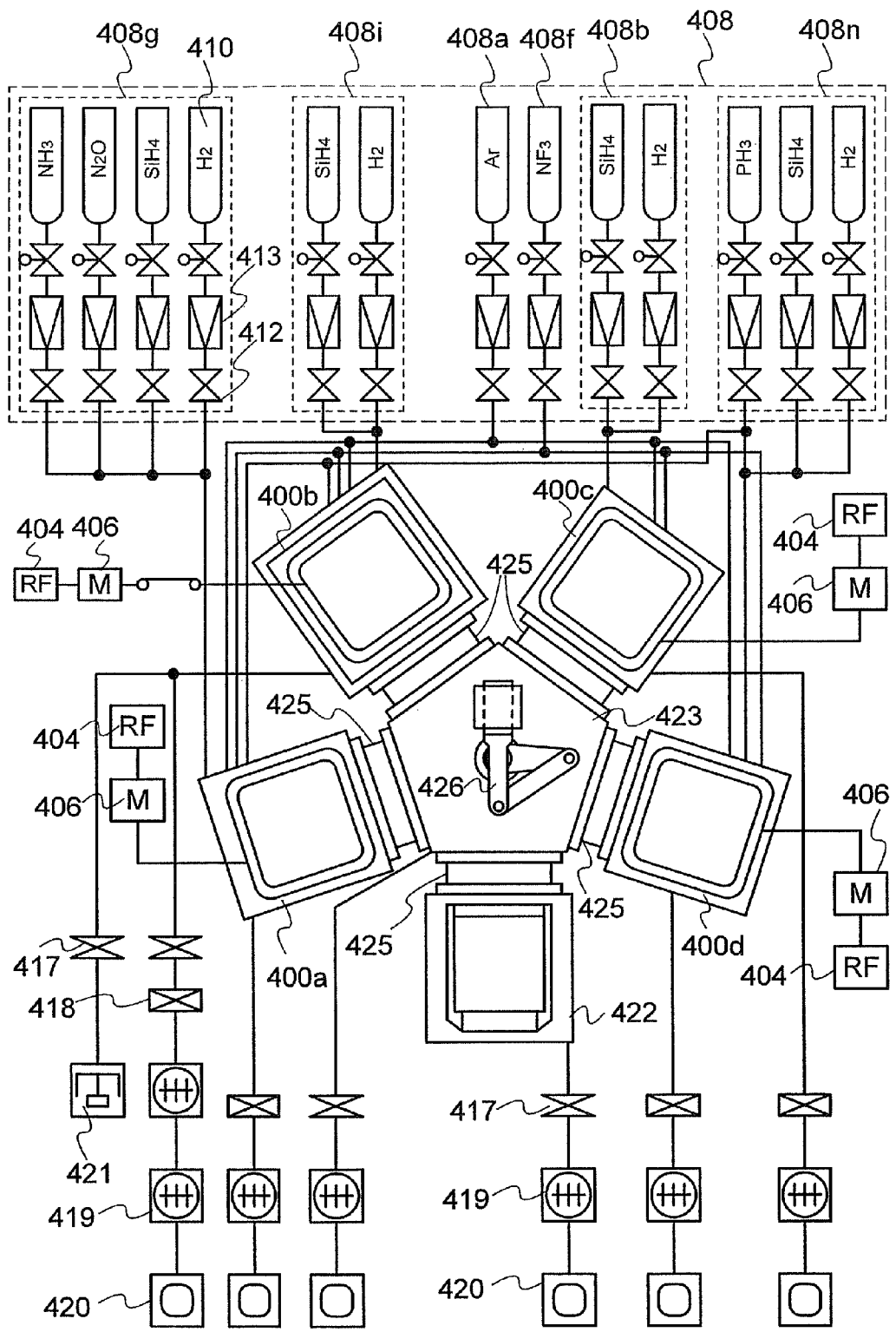
FIG. 8 is a diagram illustrating a structure of a plasma CVD apparatus applicable to the present invention.

FIG. 8 illustrates an example of a multi-chamber plasma CVD apparatus including a plurality of reaction chambers. The apparatus is provided with a common chamber 423, a load/unload chamber 422, a first reaction chamber 400*a*, a second reaction chamber 400*b*, a third reaction chamber 400*c*, and a fourth reaction chamber 400*d*. This apparatus is a single wafer-processing type in which a substrate set in a cassette in the load/unload chamber 422 is transferred to/from each reaction chamber by a transfer unit 426 in the common chamber 423. A gate valve 425 is provided between the common chamber 423 and each chamber such that treatments performed in different reaction chambers do not interfere with each other.

Each reaction chamber is used for a different purpose, depending on the kinds of thin films to be formed. For example, an insulating film such as a gate insulating film is formed in the first reaction chamber 400*a*, a microcrystalline semiconductor film which forms a channel is formed in the second reaction chamber 400*b*, a buffer layer is formed in the third reaction chamber 400*c*, and a semiconductor film to which an impurity element imparting one conductivity type is added and which forms a source and a drain is formed in the fourth reaction chamber 400*d*. Of course, the number of the reaction chambers is not limited to four, and can be increased or decreased as needed. One film may be formed in one reaction chamber, or a plurality of films may be formed in one reaction chamber.

A turbo-molecular pump 419 and a dry pump 420 are connected to each reaction chamber as exhaust units. The exhaust units are not limited to a combination of these vacuum pumps and can employ other vacuum pumps as long as they can evacuate the reaction chamber to a degree of vacuum of approximately from $10^{-1}$ Pa to $10^{-5}$ Pa. A butterfly valve 417 is provided between the exhaust units and each reaction chamber, which can interrupt vacuum evacuation, and a conductance valve 418 can control exhaust velocity to adjust the pressure in each reaction chamber.

Note that the second reaction chamber 400*b* in which a semiconductor film and a microcrystalline semiconductor film are formed may be connected to a cryopump 421 which performs vacuum evacuation to an ultra-high vacuum. By use of the cryopump 421, the reaction chamber can be evacuated to an ultra-high vacuum with a pressure of lower than $10^{-5}$ Pa. In this embodiment mode, with an ultra-high vacuum with a pressure of lower than $10^{-5}$ Pa in the reaction chamber, the oxygen concentration and the nitrogen concentration in the microcrystalline semiconductor film can be effectively reduced. Consequently, the oxygen concentration in the microcrystalline semiconductor film 45 can be set at less than or equal to $1 \times 10^{16}$ atoms/cm$^3$. With the reduced oxygen concentration and nitrogen concentration in the microcrystalline semiconductor film, defects in the film can be reduced, whereby crystallinity can be improved and thus carrier mobility can be improved.

A gas supply unit 408 includes a cylinder 410 filled with a gas used for the process, such as a rare gas or a semiconductor source gas typified by silane, a stop valve 412, a mass flow controller 413, or the like. A gas supply unit 408*g* is connected to the first reaction chamber 400*a* and supplies a gas for forming a gate insulating film. A gas supply unit 408*i* is connected to the second reaction chamber 400*b* and supplies a gas for forming a microcrystalline semiconductor film. A gas supply unit 408*b* is connected to the third reaction chamber 400*c* and supplies a gas for forming a buffer layer. A gas supply unit 408*n* is connected to the fourth reaction chamber 400*d* and supplies a gas for forming an n-type semiconductor film, for example. In addition, phosphine which is one of gases including an impurity element which serves as a donor may be also supplied into the first reaction chamber 400*a* and the second reaction chamber 400*b*. A gas supply unit 408*a* supplies argon, and a gas supply unit 408*f* supplies an etching gas used for cleaning of the inside of the reaction chambers. Thus, the gas supply units 408*a* and 408*f* are provided in common for each reaction chamber.

A high-frequency power supply unit for generating plasma is connected to each reaction chamber. The high-frequency power supply unit includes a high-frequency power source 404 and a matching box 406.

Each reaction chamber can be used for a different purpose, depending on the kinds of thin films to be formed. Since each thin film has an optimum temperature for being formed, each thin film is formed in a different reaction chamber, so that film formation temperatures can be easily controlled. Further, the same kind of films can be repeatedly formed, so that an influence of a residual impurity caused due to a film which has been formed can be eliminated. In particular, in the case where an impurity element which serves as a donor is included in a microcrystalline semiconductor film, it is possible to prevent the impurity element which serves as a donor from being mixed into the buffer layer. Consequently, the concentration of the impurity element in the buffer layer can be decreased, so that off current of the thin film transistor can be decreased.

A semiconductor film, a microcrystalline semiconductor film, a buffer layer, and a semiconductor film to which an impurity element imparting one conductivity type is added may be formed successively in one reaction chamber. Specifically, a substrate provided with a gate insulating film is carried into a reaction chamber, and a semiconductor film, a microcrystalline semiconductor film, a buffer layer, and a semiconductor film to which an impurity element imparting one conductivity type is added are formed therein successively. Then, after the substrate is taken out of the reaction chamber, the inside of the reaction chamber is preferably cleaned with fluorine radicals or the like.

In accordance with this embodiment mode, an inverted staggered thin film transistor having a microcrystalline semiconductor film with high crystallinity and an element substrate provided with the inverted staggered thin film transistor having the microcrystalline semiconductor film with high crystallinity can be manufactured.

This embodiment mode describes an inverted staggered thin film transistor as a thin film transistor, but the present invention is not limited thereto and can also be applied to a staggered thin film transistor, a top gate thin film transistor, and the like. Specifically, a microcrystalline semiconductor film and/or an insulating film serving as an underlined film is made to include an impurity element which serves as a donor, and a gate insulating film and a gate electrode are formed over the microcrystalline semiconductor film, whereby a thin film transistor having a microcrystalline semiconductor film with high crystallinity at the interface with the insulating film can be manufactured.

(Embodiment Mode 5)

This embodiment mode describes a structure of a thin film transistor which applies the process for forming a microcrystalline semiconductor film including an impurity element which serves as a donor, which is described in Embodiment Mode 3, to the process for forming the microcrystalline semiconductor film 45, which is described in Embodiment Mode 4.

In the case where a thin film transistor 74 illustrated in FIG. 6A has a microcrystalline semiconductor film including an impurity element which serves as a donor at high concentration, leakage is likely to be generated between the microcrystalline semiconductor film and the wirings 71a to 71c. Thus, a structure which can reduce leakage is described below.

Figure 29A:
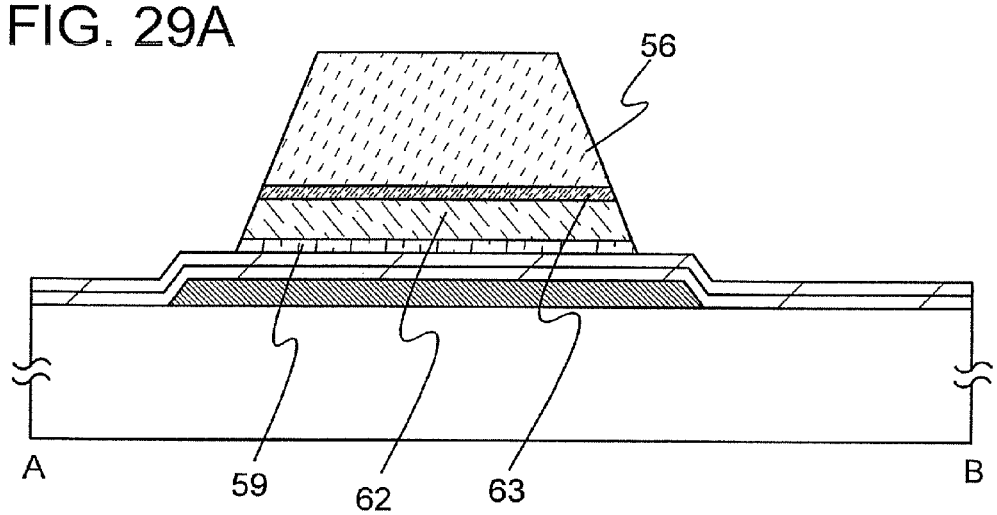
FIGS. 29A to 29C are cross-sectional views illustrating a method for manufacturing a thin film transistor of the present invention.

In a similar manner to Embodiment Mode 4, the gate electrode 51 and the gate insulating films 52a and 52b are formed over the substrate 50 as illustrated in FIG. 4A. Then, in a similar process to Embodiment Mode 3, a microcrystalline semiconductor film including an impurity element which serves as a donor is formed over the gate insulating films 52a and 52b, and the buffer layer 54 and the semiconductor film 55 to which the impurity element imparting one conductivity type is added are formed over the microcrystalline semiconductor film including an impurity element which serves as a donor, as illustrated in FIG. 4E. Next, the resist mask 56 is formed over the semiconductor film 55 to which the impurity element imparting one conductivity type is added, and then the semiconductor film to which the impurity element imparting one conductivity type is added, the buffer layer, and the microcrystalline semiconductor film including an impurity element which serves as a donor are etched, so that a microcrystalline semiconductor film 59 including an impurity element which serves as a donor, the buffer layer 62, and the semiconductor film 63 to which the impurity element imparting one conductivity type is added are formed as illustrated in FIGS. 29A to 29C.

Figure 29B:
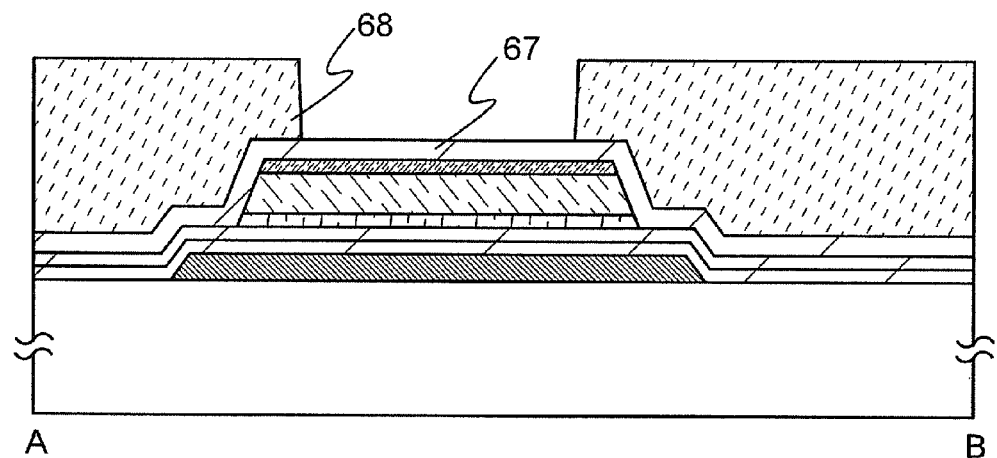

Then, as illustrated in FIG. 29B, an insulating film 67 is formed over the semiconductor film 63 to which the impurity element imparting one conductivity type is added and the gate insulating film 52b. The insulating film 67 can be formed using a material similar to the gate insulating films 52a and 52b as appropriate.

Next, a resist mask 68 is formed over the insulating film 67. The resist mask is used to partly etch the insulating film 67 and prevents a wiring to be formed later from being in contact with the microcrystalline semiconductor film 59 including an impurity element which serves as a donor. In addition, the resist mask is provided to form an insulating film in contact with the semiconductor film 63 to which the impurity element imparting one conductivity type is added. It is preferable that an area of a top surface of the resist mask be smaller than that of the semiconductor film 63 to which the impurity element imparting one conductivity type is added.

Figure 29C:
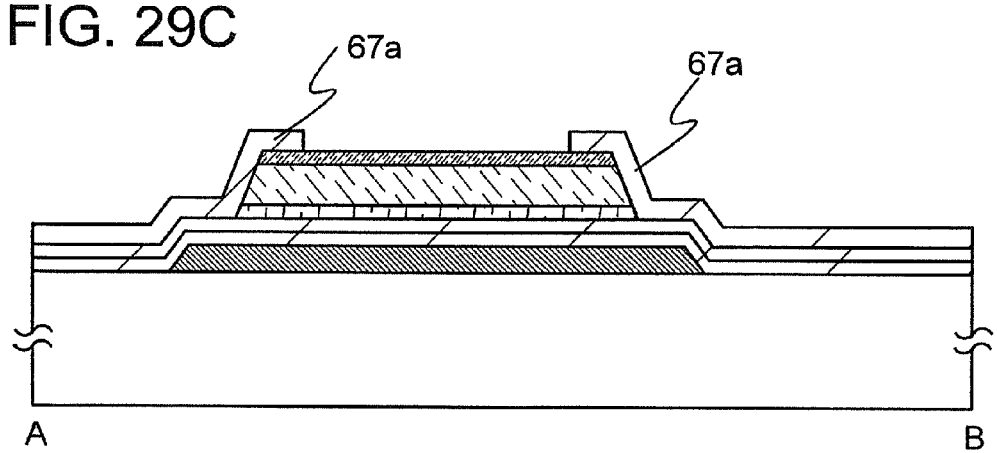

Then, as illustrated in FIG. 29C, the insulating film 67 is etched with the use of the resist mask 68 so that an insulating film 67a covering end portions of the semiconductor film 63 to which the impurity element imparting one conductivity type is added is formed.

Figure 30A:
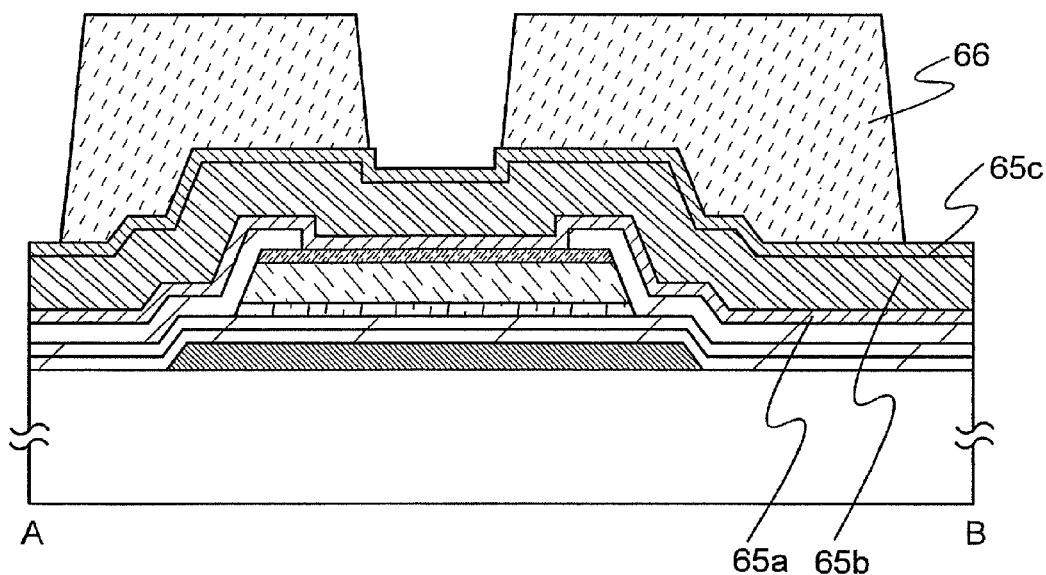
FIGS. 30A and 30B are cross-sectional views illustrating a method for manufacturing a thin film transistor of the present invention.

Next, as illustrated in FIG. 30A, the conductive films 65a to 65c are formed over the insulating film 67a and the semiconductor film 63 to which the impurity element imparting one conductivity type is added in a similar manner to that of Embodiment Mode 4, and then the resist mask 66 is formed over the conductive films 65a to 65c.

Figure 30B:
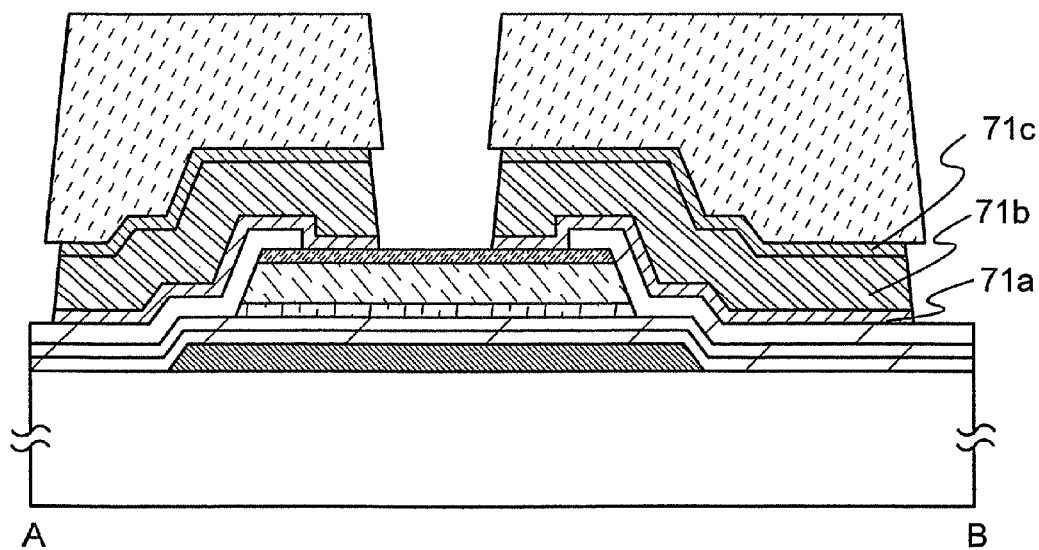

Then, as illustrated in FIG. 30B, the conductive films 65a to 65c are etched with the use of the resist mask 66 so that the wirings 71a to 71c are formed.

Figure 31A:
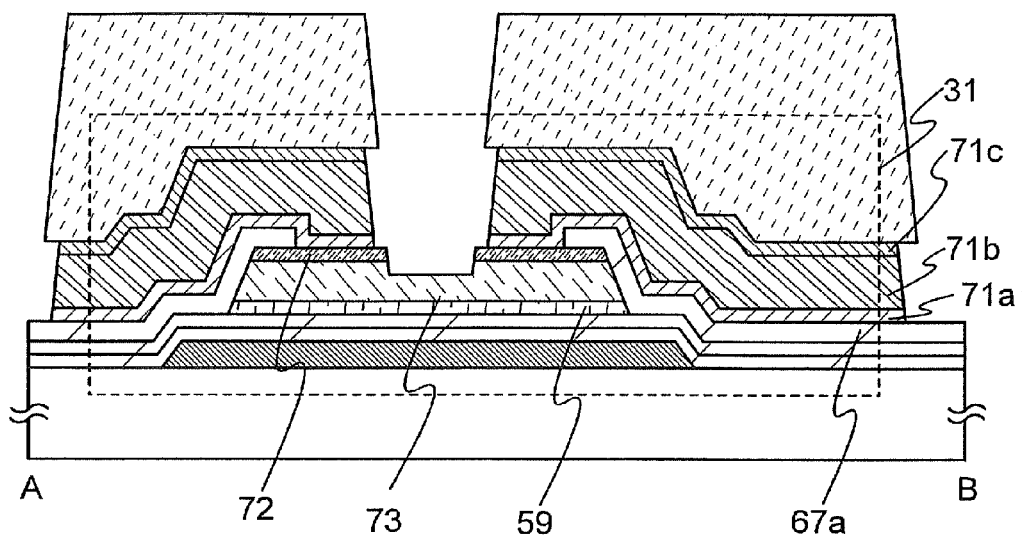
FIGS. 31A to 31C are cross-sectional views illustrating a method for manufacturing a thin film transistor of the present invention.
Figure 31B:
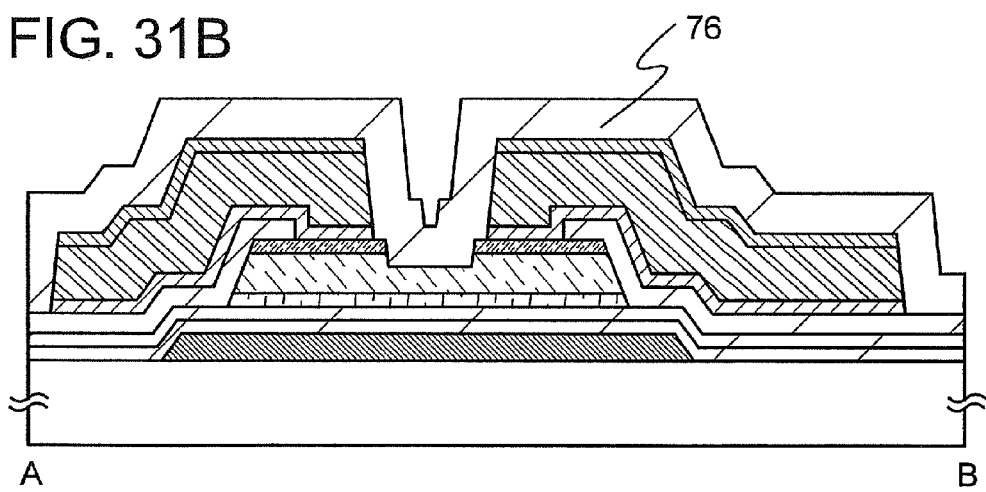

Subsequently, the semiconductor film 63 to which the impurity element imparting one conductivity type is added is etched to be separated with the use of the resist mask 66. As a result, a pair of the source and drain regions 72 can be formed as illustrated in FIG. 31A. Note that, in the etching process, the buffer layer 62 is also partly etched. The buffer layer which is partly etched and has a recessed portion is referred to as a buffer layer 73.

Through the above process, a channel etched thin film transistor 31 can be formed. The microcrystalline semiconductor film 59 including an impurity element which serves as a donor is insulated from the wirings 71a to 71c by the insulating film 67a. Thus, leakage generated between the microcrystalline semiconductor film 59 including an impurity element which serves as a donor and the wirings 71a to 71c can be reduced. Accordingly, a small off current thin film transistor can be formed.

Figure 31C:
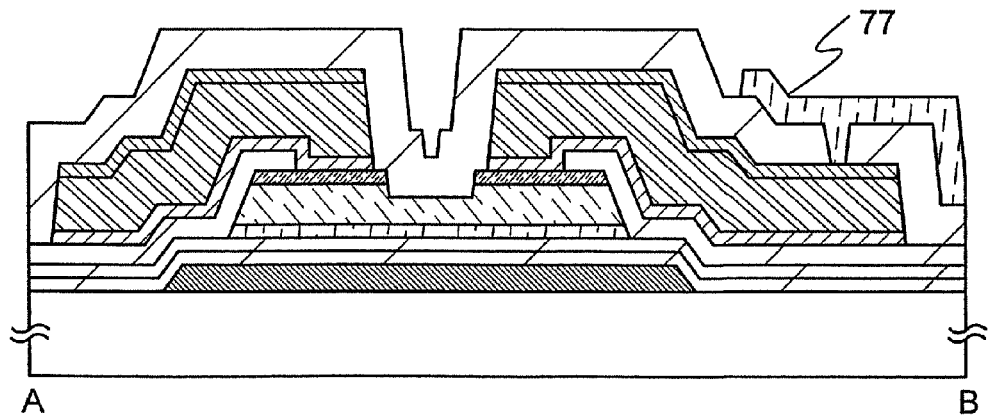

Then, the insulating film 76 is formed over the wiring 71c and the gate insulating film 52b in a similar manner to that of Embodiment Mode 4. Next, the insulating film 76 is partly etched so that a contact hole is formed and the wiring 71c is partly exposed. Subsequently, as illustrated in FIG. 31C, the pixel electrode 77 is formed in the contact hole in a similar manner to that of Embodiment Mode 4. Through the above process, a display substrate can be manufactured.

Through the above process, a display substrate having a small off current thin film transistor can be manufactured. Further, with the use of the display substrate having a small off current thin film transistor, a display device which has high contrast can be manufactured.

Then, a structure of a channel protective thin film transistor which can reduce leakage is described below as in the case of the thin film transistor 31.

In a similar manner to Embodiment Mode 4, the gate electrode 51 and the gate insulating films 52a and 52b are formed over the substrate 50 as illustrated in FIG. 4A. Next, through a process similar to Embodiment Mode 3, a microcrystalline semiconductor film including an impurity element which serves as a donor is formed over the gate insulating films 52a and 52b, and then the buffer layer 54 is formed over the microcrystalline semiconductor film including an impurity element which serves as a donor. Subsequently, a resist mask is formed over the buffer layer 54 so that the buffer layer and the microcrystalline semiconductor film including an impurity element which serves as a donor are etched, whereby the microcrystalline semiconductor film 59 including an impurity element which serves as a donor and the buffer layer 62 are formed.

Figure 32A:
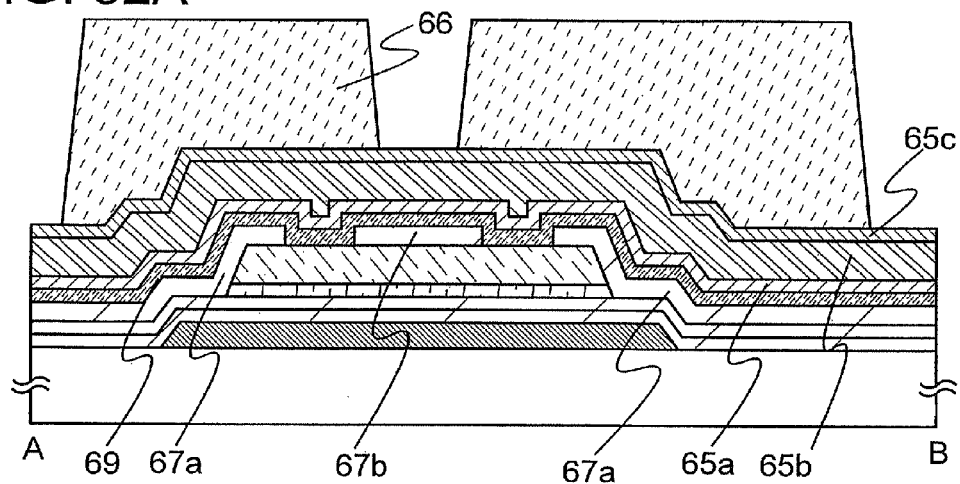
FIGS. 32A to 32C are cross-sectional views illustrating a method for manufacturing a thin film transistor of the present invention.

Next, as illustrated in FIG. 29B, the insulating film 67 is formed over the buffer layer 62 and the gate insulating film 52b. Then, a resist mask is formed over the insulating film 67, and then with the use of the resist mask, the insulating film 67 is etched, so that the insulating film 67a and an insulating film 67b are formed as illustrated in FIG. 32A. Here, there is a feature that the insulating film 67b which serves as a channel protective film of a thin film transistor to be formed later is formed over the buffer layer 62 in addition to the insulating film 67a covering end portions of the buffer layer 62.

Subsequently, a semiconductor film 69 to which the impurity element imparting one conductivity type is added is formed over the gate insulating film 52b, an exposed portion of the buffer layer 62, and the insulating films 67a and 67b. The semiconductor film 69 to which the impurity element imparting one conductivity type is added can be formed in a similar manner to the semiconductor film 55 to which the impurity element imparting one conductivity type is added, described in Embodiment Mode 4.

Next, the conductive films 65a to 65c are formed over the semiconductor film 69 to which the impurity element imparting one conductivity type is added. Then, the resist mask 66 is formed over the conductive films 65a to 65c.

Figure 32B:
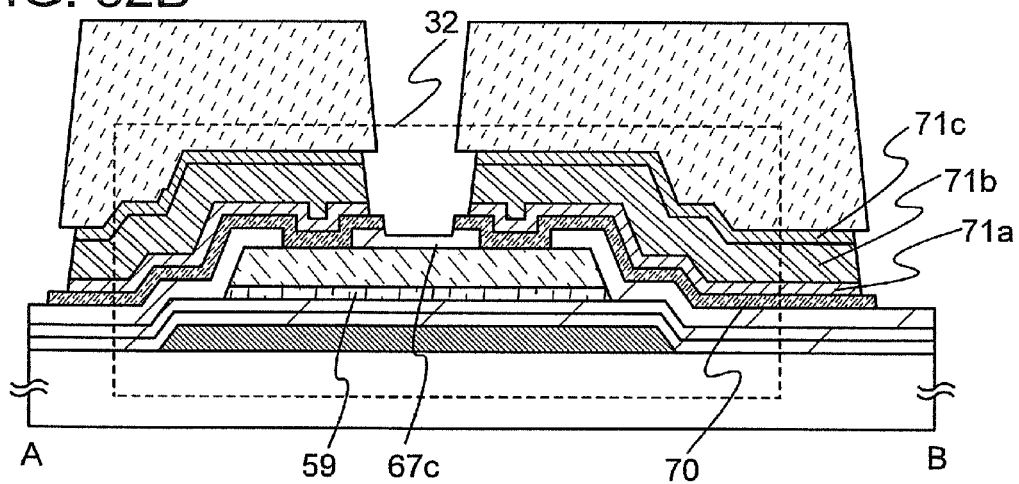

Next, as illustrated in FIG. 32B, the wirings 71a to 71c are formed by etching the conductive films 65a to 65c with the use of the resist mask 66. Subsequently, the semiconductor film 69 to which the impurity element imparting one conductivity type is added is etched to be separated with the use of the resist mask 66. As a result, a semiconductor film 70 which serves as a pair of the source and drain regions can be formed as illustrated in FIG. 32B. Note that, in the etching process, the insulating film 67b is also partly etched. The insulating film which is partly etched and has a recessed portion is referred to as a channel protective film 67c.

Through the above process, a channel-etched thin film transistor 32 can be formed. The microcrystalline semiconductor film 59 including an impurity element which serves as a donor is insulated from the semiconductor film 70 to which the impurity element imparting one conductivity type is added by the insulating film 67a. Thus, leakage generated between the microcrystalline semiconductor film 59 including an impurity element which serves as a donor and the semiconductor film 70 to which the impurity element imparting one conductivity type is added can be reduced. Accordingly, a small off current thin film transistor can be formed. Further, the channel protective film 67c can be formed in addition to the insulating film 67a which reduces leakage.

Figure 32C:
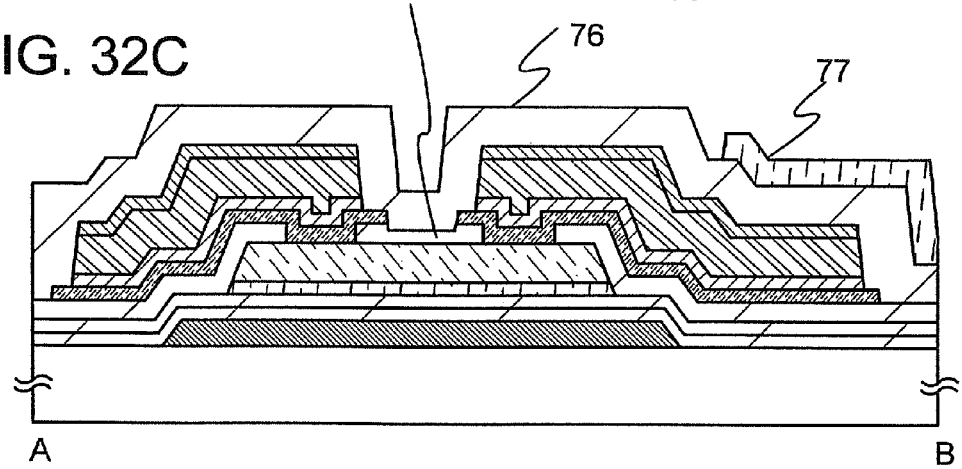

Then, as illustrated in FIG. 32C, the pixel electrode 77 which is in contact with the wiring 71c through the insulating film 76 having planarity is formed so that a display substrate can be manufactured.

Through the above process, a display substrate having a small off current thin film transistor can be manufactured. Further, with the use of the display substrate having a small off current thin film transistor, a display device which has high contrast can be manufactured.

(Embodiment Mode 6)

In this embodiment mode, a liquid crystal display device including the thin film transistor described in Embodiment Mode 3 is described below as one mode of a display device. Here, a vertical alignment (VA) liquid crystal display device is described with reference to FIG. 20, FIG. 21, and FIG. 22. The VA liquid crystal display device employs one mode for controlling alignment of liquid crystal molecules of a liquid crystal panel. The VA liquid crystal display device employs a mode in which liquid crystal molecules are vertical to a panel surface when voltage is not applied. In particular, in this embodiment mode, it is devised that a pixel is divided into several regions (sub-pixels) so that molecules are aligned in different directions in different regions. This is referred to as multi-domain or multi-domain design. In the following description, a liquid crystal display device with multi-domain design is described.

Figure 20:
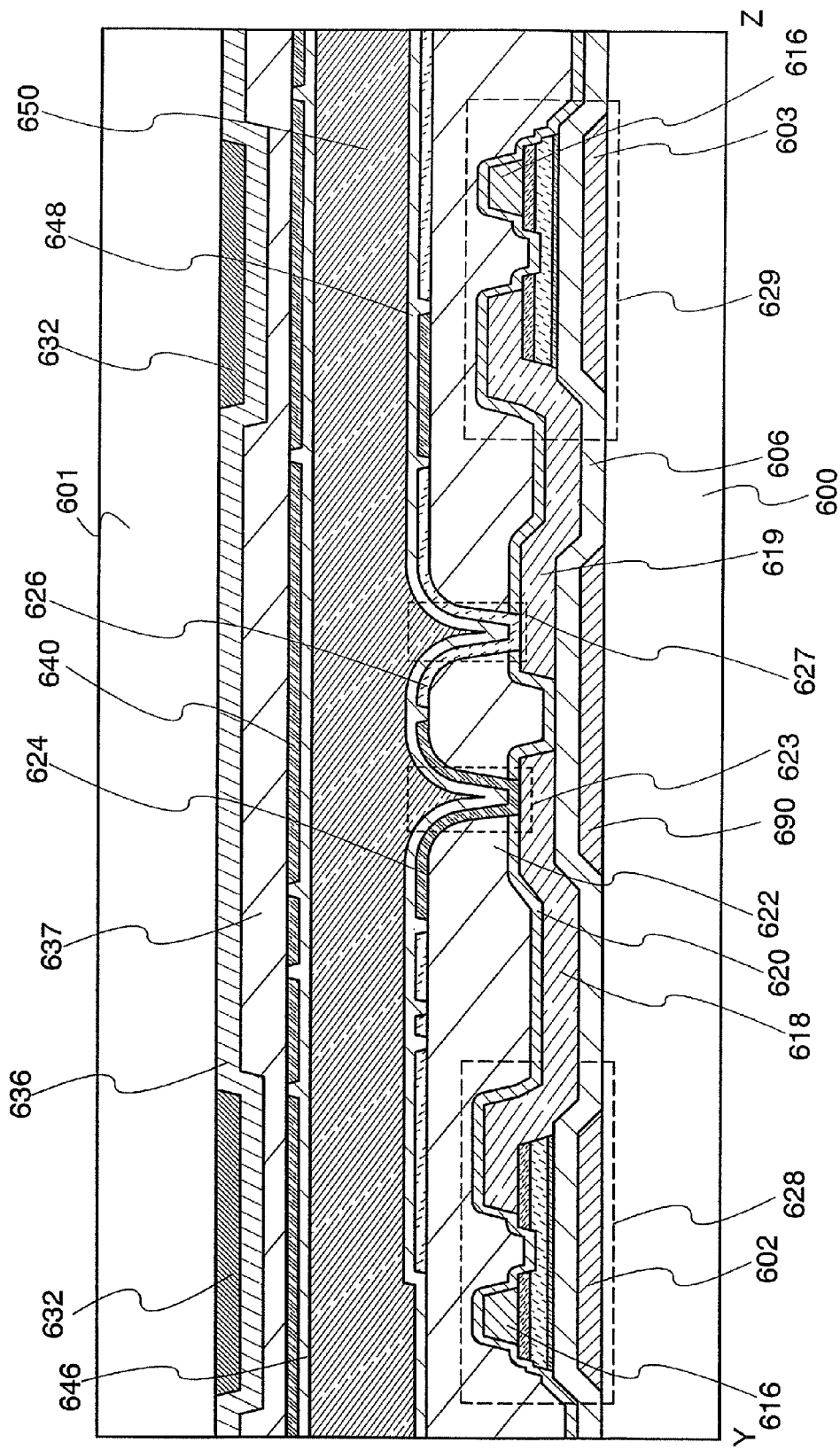
FIG. 20 is a cross-sectional view illustrating a display device to which a thin film transistor of the present invention can be applied.
Figure 21:
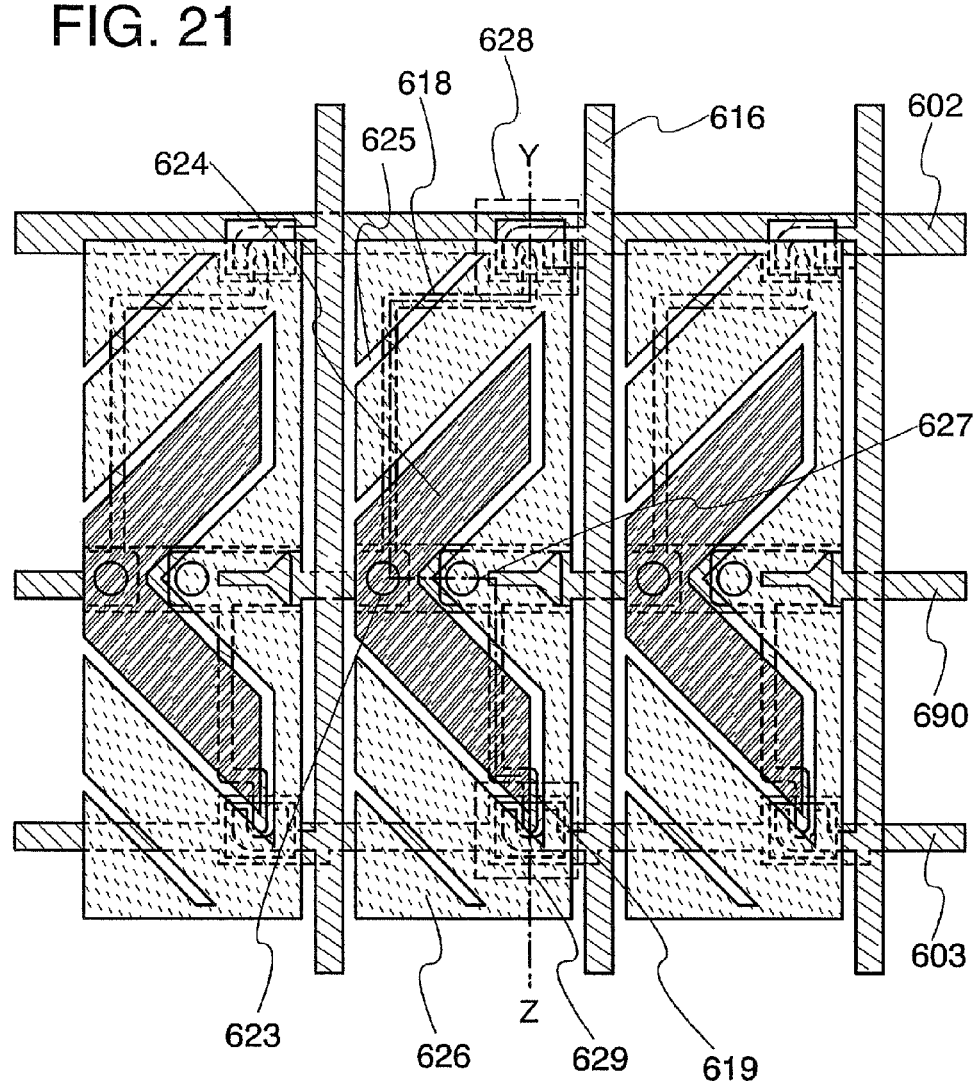
FIG. 21 is a top view illustrating a display device to which a thin film transistor of the present invention can be applied.
Figure 22:
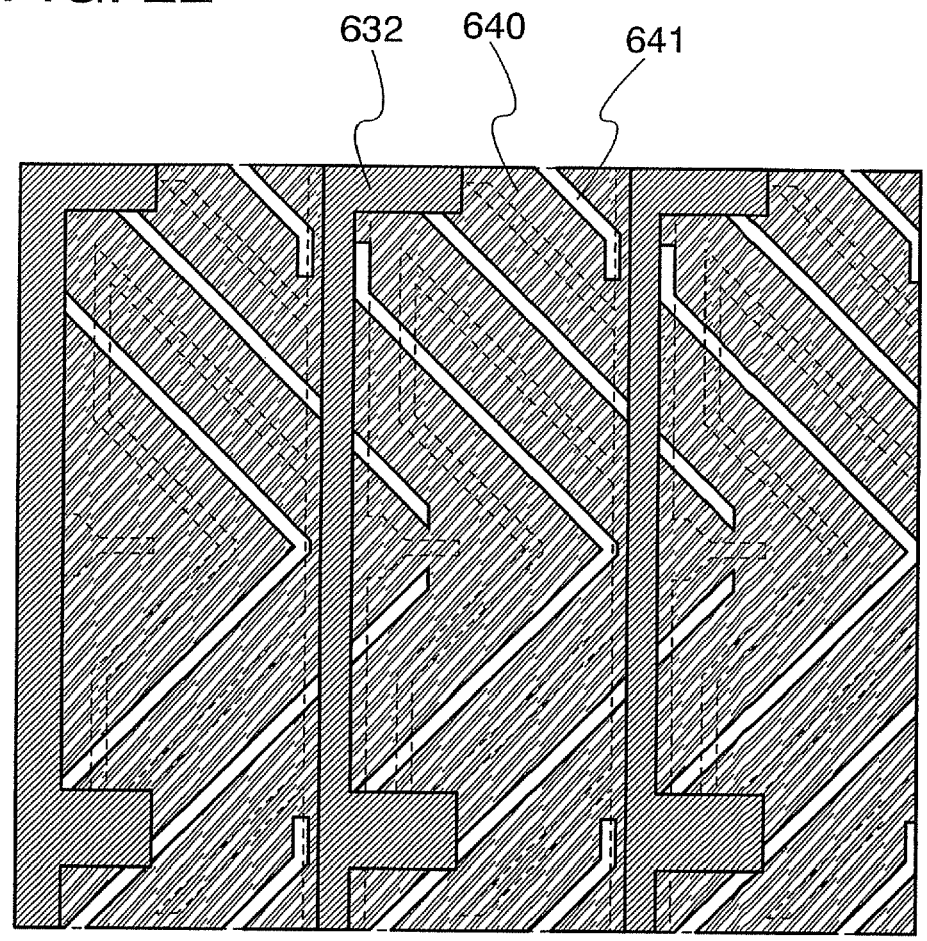
FIG. 22 is a top view illustrating a display device to which a thin film transistor of the present invention can be applied.

FIG. 20 and FIG. 21 illustrate a pixel structure of a VA liquid crystal panel. FIG. 21 is a plan view of a substrate 600. FIG. 20 illustrates a cross-sectional structure along a line Y-Z in FIG. 21. The following description is given with reference to FIG. 20 and FIG. 21.

In this pixel structure, a plurality of pixel electrodes is included in one pixel, and thin film transistors are connected to the pixel electrodes, respectively, through a planarization film 622. The thin film transistors are driven by different gate signals. That is, a pixel of multi-domain design has a structure in which a signal applied to each of the pixel electrodes is independently controlled.

A pixel electrode 624 is connected to a thin film transistor 628 through a wiring 618 in a contact hole 623. In a contact hole 627, a pixel electrode 626 is connected to a thin film transistor 629 through a wiring 619. A gate wiring 602 of the thin film transistor 628 and a gate wiring 603 of the thin film transistor 629 are separated so that different gate signals can be given thereto. In contrast, a wiring 616 serving as a data line is used in common for the thin film transistors 628 and 629. The thin film transistors 628 and 629 can be manufactured by the methods described in Embodiment Mode 3. Please note that reference numerals 606, 620 and 690 denote a gate insulating film, a protective insulating film and a capacitor wiring, respectively.

The pixel electrodes 624 and 626 have different shapes and are separated by a slit 625. The pixel electrode 626 surrounds the pixel electrode 624, which has a V-shape. Timings of voltage application are varied between the pixel electrode 624 and the pixel electrode 626 by the thin film transistor 628 and the thin film transistor 629, so that alignment of liquid crystals is controlled. When different gate signals are supplied to the gate wiring 602 and the gate wiring 603, operation timings of the thin film transistor 628 and the thin film transistor 629 can be varied. An alignment film 648 is formed over the pixel electrodes 624 and 626.

A counter substrate 601 is provided with a light-blocking film 632, a coloring film 636, and a counter electrode 640. In addition, a planarization film 637 is formed between the coloring film 636 and the counter electrode 640 so that alignment disorder of liquid crystals is prevented. Further, an alignment film 646 is formed on the counter electrode 640. FIG. 19 illustrates a structure of the counter substrate side. A slit 641 is formed in the counter electrode 640 which is used in common between different pixels. The slit 641 and the slit 625 on the side of the pixel electrodes 624 and 626 are alternately arranged in an engaging manner; thus, an oblique electric field is effectively generated, and the alignment of liquid crystals can be controlled. Accordingly, a direction of alignment of the liquid crystals can be made different depending on location and the viewing angle is widened.

The pixel electrode 624, a liquid crystal layer 650, and the counter electrode 640 overlap with each other to form a first liquid crystal element. Further, a second liquid crystal element is formed by overlapping of the pixel electrode 626, the liquid crystal layer 650, and the counter electrode 640. Furthermore, the multi-domain structure is employed in which the first liquid crystal element and the second liquid crystal element are provided for one pixel.

Although a vertical alignment (VA) liquid crystal display device is described here as a liquid crystal display device, the element substrate formed using the thin film transistor described in Embodiment Mode 1 can also be applied to an FFS mode liquid crystal display device, an IPS mode liquid crystal display device, a TN mode liquid crystal display device, and other modes of liquid crystal display devices.

The liquid crystal display device can be manufactured through the above process. Since an inverted staggered thin film transistor which has small off current and which uses a microcrystalline semiconductor film with high crystallinity in a channel formation region is used for the liquid crystal display device of this embodiment mode, the liquid crystal display device can have high contrast and high visibility.

(Embodiment Mode 7)

This embodiment mode describes a light-emitting display device including the thin film transistor described in Embodiment Mode 3 as one mode of a display device, and also describes a structure of a pixel included in the light-emitting display device. FIG. 23A illustrates one mode of a top view of a pixel. FIG. 23B illustrates one mode of a cross-sectional structure of the pixel along a line A-B in FIG. 23A.

A light-emitting device using a light-emitting element utilizing electroluminescence is described here. Light-emitting elements utilizing electroluminescence are classified according to whether a light-emitting material is an organic compound or an inorganic compound. In general, the former is referred to as an organic EL element, and the latter as an inorganic EL element. In this embodiment mode, the manufacturing process of the thin film transistor in accordance with Embodiment Mode 1 can be used.

In the case of an organic EL element, by applying voltage to a light-emitting element, electrons and holes are injected from a pair of electrodes into a layer including an organic compound with a light-emitting property to cause a current flow. Then, by recombination of these carriers (electrons and holes), the organic compound with a light-emitting property forms an excited state, and light is emitted when the excited state returns to a ground state. Due to such a mechanism, such a light-emitting element is called a current excitation type light-emitting element.

Inorganic EL elements are classified according to their element structures, into a dispersion type inorganic EL element and a thin-film type inorganic EL element. The dispersion type inorganic EL element has a light-emitting layer in which particles of a light-emitting material are dispersed in a binder. The mechanism of light emission of the dispersion type inorganic EL element is donor acceptor recombination light emission, which utilizes a donor level and an acceptor level. The thin-film type inorganic EL element has a structure in which a light-emitting layer is interposed between dielectric layers and the light-emitting layer interposed between the dielectric layers is further interposed between electrodes and adopts local emission in which inner shell electron transition of a metal ion is utilized. Note that the description is given here using an organic EL element as a light-emitting element. In addition, the description is given using channel-etched thin film transistors as a switching thin film transistor for controlling input of a signal to a pixel electrode and a driving thin film transistor which controls driving of a light-emitting element, but a channel protective thin film transistor can also be used as appropriate.

In FIGS. 23A and 23B, a first thin film transistor 74a is a switching thin film transistor for controlling input of a signal to a pixel electrode, and a second thin film transistor 74b is a driving thin film transistor for controlling current or voltage supply to a light-emitting element 94.

A gate electrode of the first thin film transistor 74a is connected to a scanning line 51a, one of a source and a drain is connected to the wirings 71a to 71c which serve as signal lines, and wirings 71d to 71f which are connected to the other of the source and the drain are connected to a gate electrode 51b of the second thin film transistor 74b. One of a source and a drain of the second thin film transistor 74b is connected to wirings 93a to 93c which serve as power source lines, and the other of the source and the drain is connected to a pixel electrode 79 of a display device. A gate electrode, a gate insulating film, and the wirings 93a to 93c which serve as power source lines of the second thin film transistor 74b form a capacitor element 96, and the other of the source and the drain of the first thin film transistor 74a is connected to the capacitor element 96.

The capacitor element 96 corresponds to a capacitor element for holding a voltage between the gate and the source or between the gate and the drain (hereinafter referred to as a gate voltage) of the second thin film transistor 74b when the first thin film transistor 74a is turned off, and is not necessarily provided.

In this embodiment mode, the first thin film transistor 74a and the second thin film transistor 74b can be each formed in accordance with Embodiment Mode 4. In addition, although each of the first thin film transistor 74a and the second thin film transistor 74b is an n-channel thin film transistor, the first thin film transistor 74a and the second thin film transistor 74b may also be an n-channel thin film transistor and a p-channel thin film transistor, respectively. Furthermore, both the first thin film transistor 74a and the second thin film transistor 74b may be p-channel thin film transistors.

The protective insulating film 76 is formed over the first thin film transistor 74a and the second thin film transistor 74b, and a planarization film 78 is formed over the protective insulating film 76, and then the pixel electrode 79 which serves as a cathode is formed to be connected to the wirings 93d to 93f in a contact hole formed in the planarization film 78 and the protective insulating film 76. The planarization film 78 is preferably formed using an organic resin such as acrylic, polyimide, or polyamide, or a siloxane polymer. Since the pixel electrode 79 which serves as the cathode is uneven in the contact hole, a partition wall 91 having an opening and covering the uneven portion of the pixel electrode 79 which serves as the cathode is provided. In the opening of a pixel electrode which serves as the partition wall 91, a light-emitting layer 92 is formed so as to be in contact with the pixel electrode 79 which serves as the cathode, and an electrode 97 which serves as an anode is formed so as to cover the light-emitting layer 92. A protective insulating film 95 is formed so as to cover the electrode 97 which serves as the anode and the partition wall 91.

The light-emitting element 94 having a top emission structure is described here as a light-emitting element. Note that the light-emitting element 94 having a top emission structure can emit light, even over the first thin film transistor 74a and the second thin film transistor 74b; thus, a light emission area can be increased. However, if an underlined film of the light-emitting layer 92 is uneven, the thickness is nonuniform due to unevenness, and the electrode 97 which serves as the anode and the pixel electrode 79 which serves as the cathode are short-circuited, so that a display defect is caused. Therefore, it is preferable to provide the planarization film 78.

The light-emitting element 94 corresponds to a region where the pixel electrode 79 which serves as the cathode and the electrode 97 which serves as the anode sandwich the light-emitting layer 92. In the case of the pixel illustrated in FIG. 23A, light from the light-emitting element 94 is emitted through the electrode 97 side which serves as the anode as illustrated by an outline arrow.

As the pixel electrode 79 which serves as the cathode, a known conductive film can be used as long as it has a low work function and reflects light. For example, Ca, Al, MgAg, AlLi, or the like is preferably used. The light-emitting layer 92 may be formed using a single layer or by stacking a plurality of layers. When the light-emitting layer 92 is formed using a plurality of layers, an electron-injecting layer, an electron-transporting layer, a light-emitting layer, a hole-transporting layer, and a hole-injecting layer are stacked in this order over the pixel electrode 79 which serves as the cathode. It is not necessary to form all of these layers. The electrode 97 which serves as the anode is formed using a light-transmitting conductive material such as a film of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

A light-emitting element having a top emission structure, in which light is extracted from a side opposite to a substrate, is described here; however, a light-emitting element having a bottom emission structure, in which light is extracted from the substrate side, or a light-emitting element having a dual emission structure, in which light is extracted from both the substrate side and the side opposite to the substrate, can also be employed as appropriate.

Although an organic EL element is described here as a light-emitting element, an inorganic EL element can also be provided as a light-emitting element.

Note that, in this embodiment mode, an example in which a thin film transistor for controlling the driving of a light-emitting element (the driving thin film transistor) is directly connected to the light-emitting element is described; however, a thin film transistor for controlling current may be connected between the driving thin film transistor and the light-emitting element.

Through the above process, a light-emitting display device can be manufactured. The light-emitting display device of this embodiment mode can have high contrast and high visibility because an inverted staggered thin film transistor which has small off current and which uses a microcrystalline semiconductor film with high crystallinity in a channel formation region is used.

(Embodiment Mode 8)

This embodiment mode describes a structure of a display panel, which is one mode of a display device of the present invention.

Figure 24A:
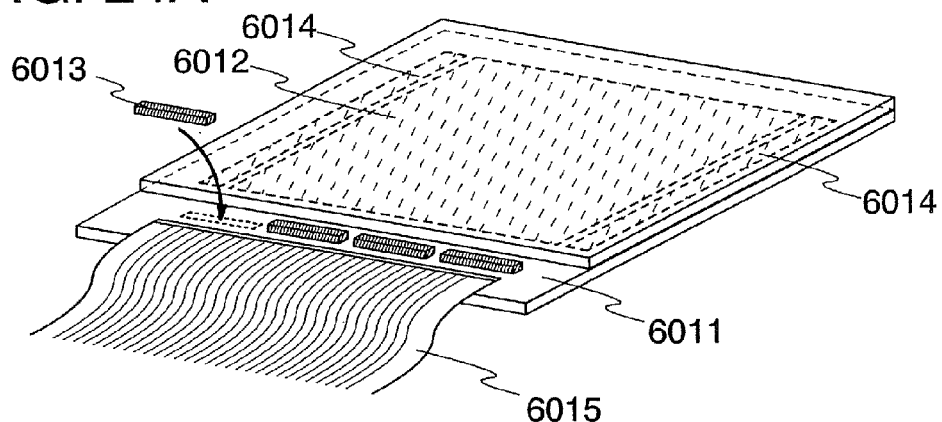
FIGS. 24A to 24C are perspective views illustrating display panels to which a thin film transistor of the present invention can be applied.

FIG. 24A illustrates a mode of a display panel in which a pixel portion 6012 formed over a substrate 6011 is connected to a signal line driver circuit 6013 which is only formed separately. The pixel portion 6012 and a scanning line driver circuit 6014 are each formed using a thin film transistor described in Embodiment Modes 1 and 2. By forming the signal line driver circuit using a transistor which has higher mobility than a thin film transistor in which a microcrystalline semiconductor film is used in a channel formation region, an operation of the signal line driver circuit which demands a higher driving frequency than the scanning line driver circuit can be stabilized. The signal line driver circuit 6013 may be formed using a transistor in which a single crystal semiconductor is used in a channel formation region, a thin film transistor in which a polycrystalline semiconductor is used in a channel formation region, or a transistor in which an SOI is used in a channel formation region. The pixel portion 6012, the signal line driver circuit 6013, and the scanning line driver circuit 6014 are each supplied with potential of a power source, a variety of signals, and the like through an FPC 6015. Further, a protection circuit may be provided between the signal line driver circuit 6013 and the FPC 6015 or between the signal line driver circuit 6013 and the pixel portion 6012. The protection circuit includes one or more elements selected from a thin film transistor described in Embodiment Mode 4, a diode, a resistor element, a capacitor element, and the like. For example, a diode obtained by diode-connecting the thin film transistor described in Embodiment Mode 1 or 2 can also be used as a diode.

Note that both the signal line driver circuit and the scanning line driver circuit may be formed over the same substrate as that of the pixel portion.

Figure 24B:
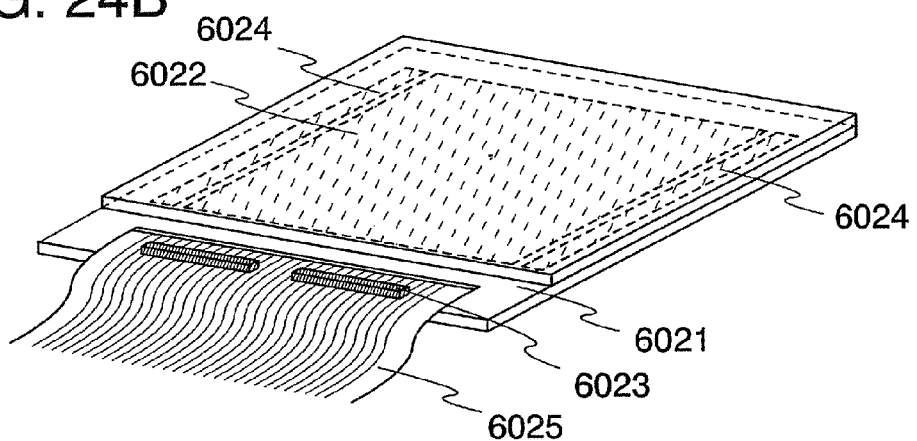

Also, when a driver circuit is separately formed, a substrate provided with the driver circuit is not always required to be attached to a substrate provided with a pixel portion, and may be attached to, for example, an FPC. FIG. 24B illustrates a mode of a display panel in which a signal line driver circuit 6023 is formed separately and is connected to a pixel portion 6022 and a scanning line driver circuit 6024 that are formed over a substrate 6021. The pixel portion 6022 and the scanning line driver circuit 6024 are each formed using a thin film transistor in which a microcrystalline semiconductor film is used in a channel formation region. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025. Further, a protection circuit may be provided between the signal line driver circuit 6023 and the FPC 6025 or between the signal line driver circuit 6023 and the pixel portion 6022.

Figure 24C:
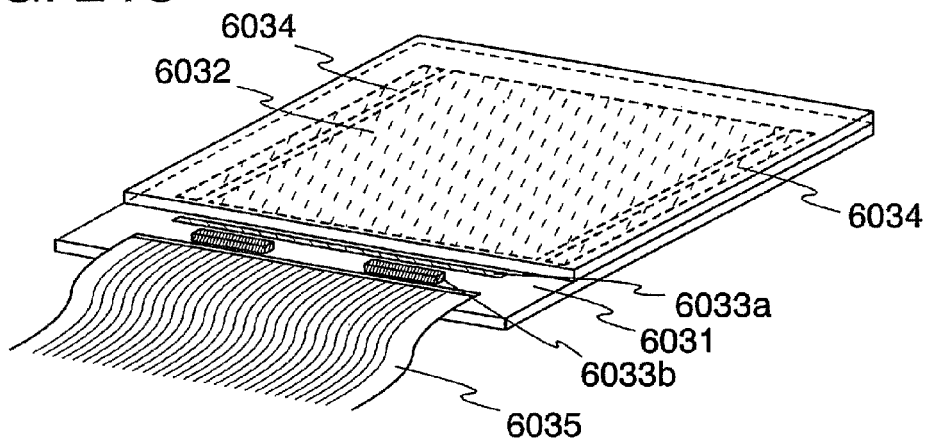

Furthermore, only a part of the signal line driver circuit or only a part of the scanning line driver circuit may be formed over the same substrate as that of the pixel portion with the use of a thin film transistor in which a microcrystalline semiconductor film is used in a channel formation region, and the rest may be formed separately and electrically connected to the pixel portion. FIG. 24C illustrates a mode of a display panel in which an analog switch 6033a included in a signal line driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are each formed using a thin film transistor in which a microcrystalline semiconductor film is used in a channel formation region. The shift register 6033b included in the signal line driver circuit is connected to the pixel portion 6032 through an FPC 6035. The pixel portion 6032, the signal line driver circuit, and the scanning line driver circuit 6034 are each supplied with potential of a power source, a variety of signals, and the like through the FPC 6035. Further, a protection circuit may be provided between the signal line driver circuit and the FPC 6035 or between the signal line driver circuit and the pixel portion 6032.

As illustrated in FIGS. 24A to 24C, in the display device of this embodiment mode, an entire driver circuit or a part thereof can be formed over the same substrate as that of a pixel portion, using a thin film transistor in which a microcrystalline semiconductor film is used in a channel formation region.

Note that there is no particular limitation on a connection method of the substrate which is formed separately, and a known method such as a COG method, a wire bonding method, or a TAB method can be used. Further, a connection position is not limited to the position illustrated in FIGS. 24A to 24C, as long as electrical connection is possible. Furthermore, a controller, a CPU, a memory, and/or the like may be formed separately and connected.

Note that the signal line driver circuit used in the present invention includes a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

(Embodiment Mode 9)

The display device obtained by the present invention and the like can be used for an active matrix display panel. That is, the present invention can be applied to all electronic devices in which the display panel is incorporated into a display portion.

Examples of such electronic devices include cameras such as video cameras and digital cameras, head-mounted displays (goggle-type displays), car navigation systems, projectors, car stereo sets, personal computers, and portable information terminals (e.g., mobile computers, mobile phones, e-book readers, and the like). Examples of these devices are illustrated in FIGS. 25A to 25C.

Figure 25A:
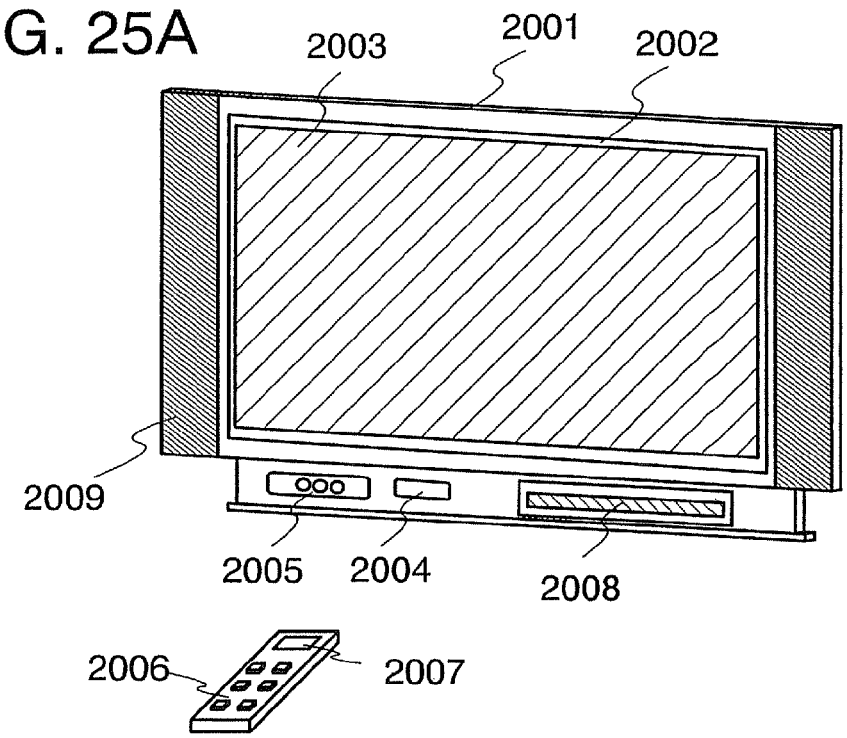
FIGS. 25A to 25C are perspective views illustrating electronic devices using a display device to which a thin film transistor of the present invention can be applied.
Figure 25C:
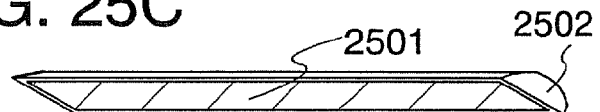
Figure 25B:
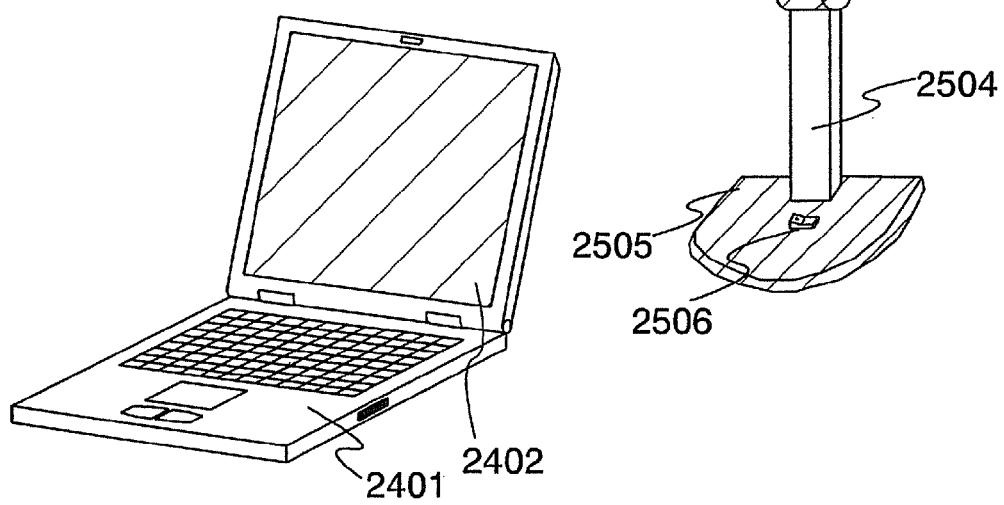

FIG. 25A illustrates a television device. The television device can be completed by incorporating a display panel into a housing as illustrated in FIG. 25A. A main screen 2003 is formed using the display panel, and a speaker portion 2009, operation switches, and the like are provided as other additional accessories. In such a manner, a television device can be completed.

As illustrated in FIG. 25A, a display panel 2002 using display elements is incorporated into a housing 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. Operation of the television device can be carried out using switches that are incorporated into the housing or by a remote control device 2006 provided separately. A display portion 2007 that displays information to be output may be provided for the remote control device 2006.

Further, the television device may include a sub-screen 2008 formed with a second display panel for displaying channels, volume, and the like, in addition to the main screen 2003. In this structure, the main screen 2003 may be formed with a liquid crystal display panel, and the sub-screen 2008 may be formed with a light-emitting display panel. In addition, the main screen 2003 and the sub-screen 2008 may be each formed with a light-emitting display panel and the sub-screen 2008 may be set to blink on and off.

Figure 26:
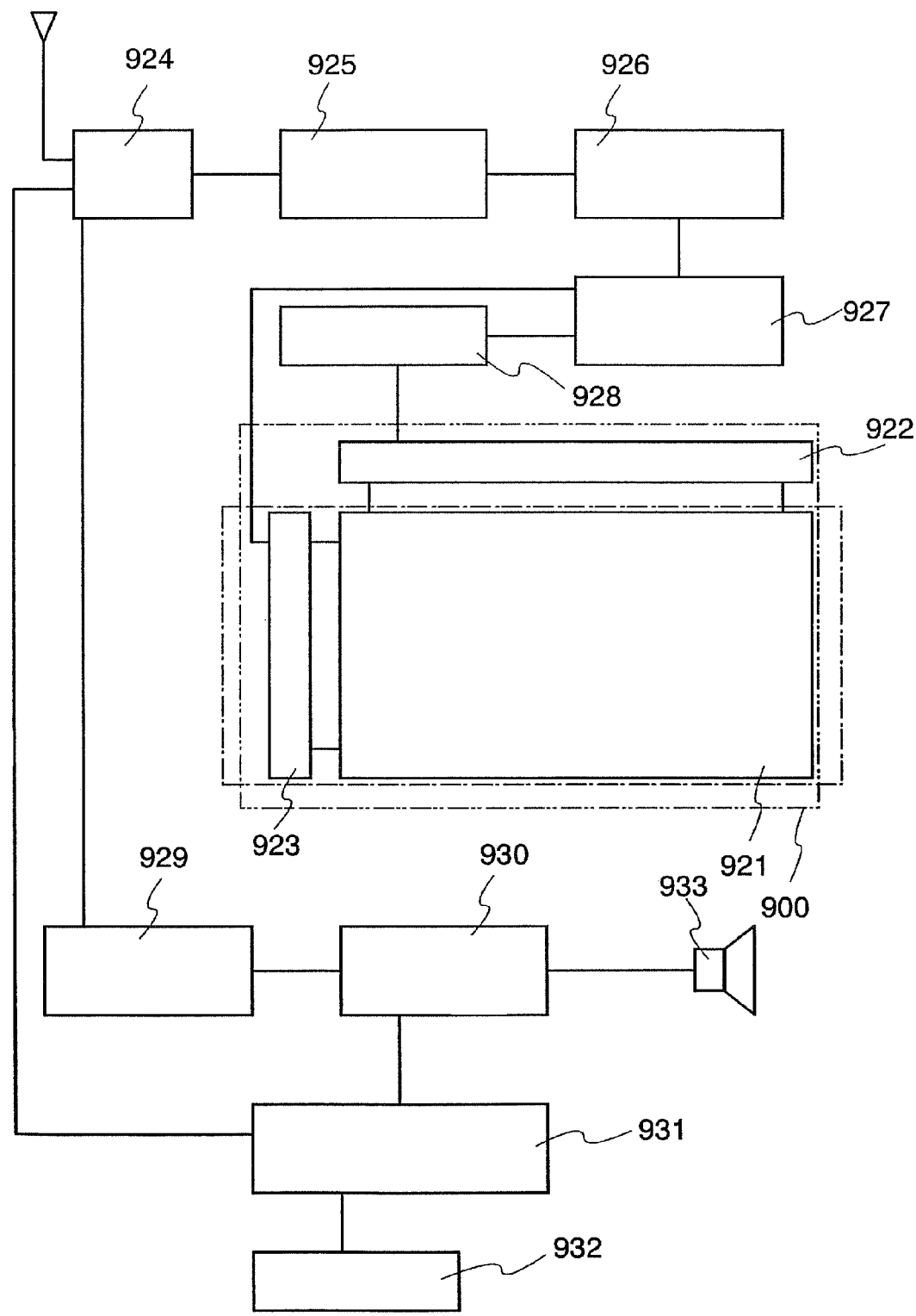
FIG. 26 is a diagram illustrating an electronic device using a display device to which a thin film transistor of the present invention can be applied.

FIG. 26 is a block diagram illustrating the main structure of a television device. A display panel 900 is provided with a pixel portion 921. A signal line driver circuit 922 and a scanning line driver circuit 923 may be mounted on the display panel 900 by a COG method.

As structures of other external circuits, a video signal amplifier circuit 925 amplifying a video signal among signals received by a tuner 924, a video signal processing circuit 926 converting signals output from the video signal amplifier circuit 925 into chrominance signals corresponding to red, green, and blue, a control circuit 927 for converting the video signal into a signal which meets input specifications of a driver IC, and the like are provided on an input side of the video signal. The control circuit 927 outputs signals to the scanning line side and the signal line side. When digital driving is performed, a structure may be adopted in which a signal dividing circuit 928 is provided on the signal line side and an input digital signal is divided into m signals to be supplied.

An audio signal among signals received by the tuner 924 is sent to an audio signal amplifier circuit 929, and output from the audio signal amplifier circuit 929 is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to a variety of uses, such as a monitor of a personal computer; or a large display medium such as an information display board at the train station, the airport, or the like, or an advertisement display board on the street.

The display device described in the above embodiment mode is applied to the main screen 2003 and the sub-screen 2008, so that mass productivity of the television device can be increased.

A portable computer illustrated in FIG. 25B includes a main body 2401, a display portion 2402, and the like. The display device described in the above embodiment mode is applied to the display portion 2402, so that mass productivity of the computer can be increased.

FIG. 25C illustrates a desk lamp including a lighting portion 2501, a shade 2502, an adjustable arm 2503, a support 2504, a base 2505, and a power source switch 2506. The desk lamp is manufactured using the light-emitting device described in the above embodiment mode for the lighting portion 2501. Note that the lighting equipment includes a ceiling light, a wall light, and the like. Use of the display device described in the above embodiment mode can increase mass productivity and provide inexpensive desk lamps.

Figure 27A:
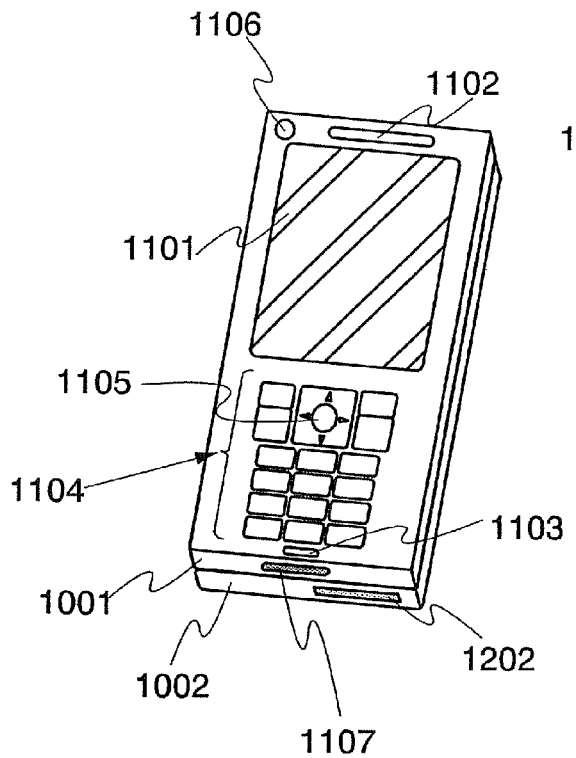
FIGS. 27A to 27C are diagrams illustrating electronic devices using a display device to which a thin film transistor of the present invention can be applied.
Figure 27B:
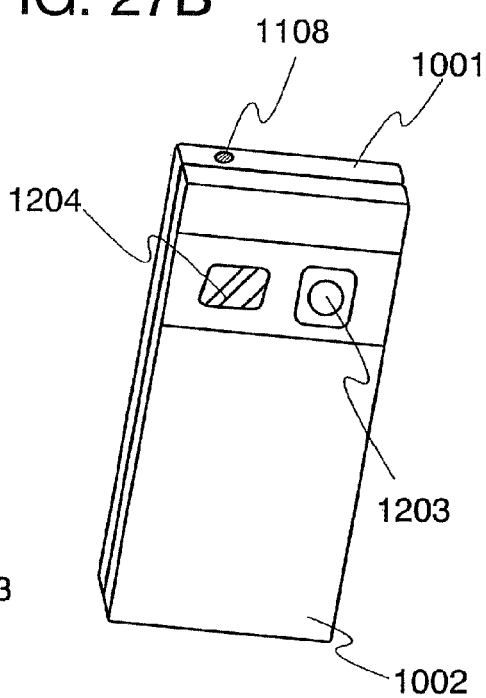
Figure 27C:
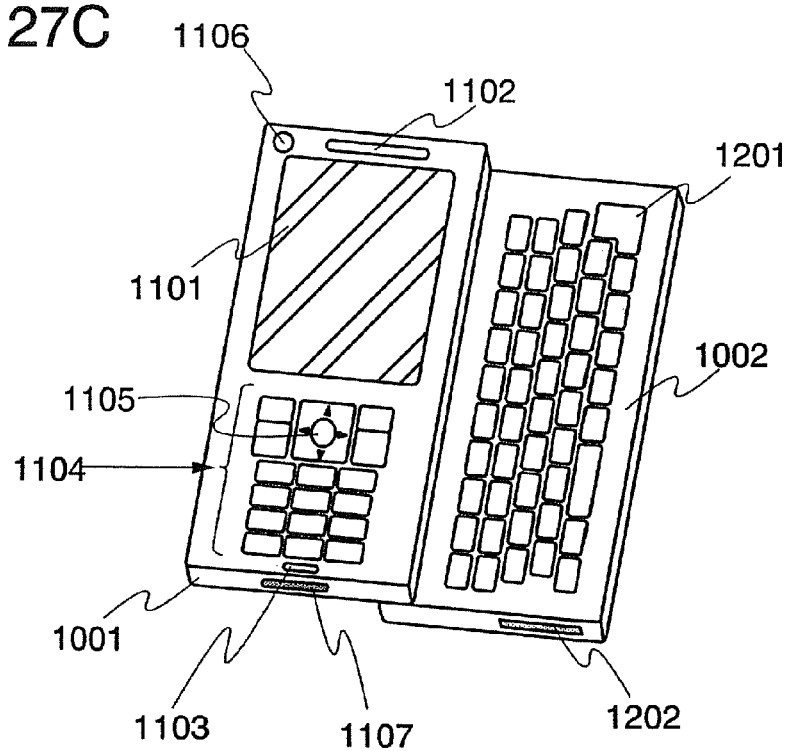

FIGS. 27A to 27C illustrate an example of a structure of a smartphone to which the present invention is applied. FIG. 27A is a front view, FIG. 27B is a rear view, and FIG. 27C is a front view in which two housings are slid. The smartphone 1000 has two housings 1001 and 1002. The smartphone 1000 has both a function of a mobile phone and a function of a portable information terminal, and incorporates a computer that is provided to conduct a variety of data processing in addition to verbal communication (voice calls); therefore, it is called a smartphone.

The smartphone 1000 has the two housings 1001 and 1002. The housing 1001 includes a display portion 1101, a speaker 1102, a microphone 1103, operation keys 1104, a pointing device 1105, a front camera lens 1106, a jack 1107 for an external connection terminal, an earphone terminal 1108, and the like, while the housing 1002 includes a keyboard 1201, an external memory slot 1202, a rear camera 1203, a light 1204, and the like. In addition, an antenna is incorporated in the housing 1001.

Further, in addition to the above structure, the smartphone may incorporate a non-contact IC chip, a small size memory device, or the like.

The housing 1001 and the housing 1002 which are put together to be lapped with each other (FIG. 27A) are developed by sliding as illustrated in FIG. 27C. In the display portion 1101, the display device described in the above embodiment mode can be incorporated, and a display direction can be changed freely depending on a use mode. Because the front camera lens 1106 is provided in the same plane as the display portion 1101, the smartphone can be used as a videophone. A still image and a moving image can be taken by the rear camera 1203 and the light 1204 by using the display portion 1101 as a viewfinder.

The speaker 1102 and the microphone 1103 can be used for videophone, recording, playback, and the like without being limited to verbal communication. With the use of the operation keys 1104, operation of incoming and outgoing calls, simple information input such as electronic mail, scrolling of a screen, cursor motion, and the like are possible.

If much information is needed to be treated, such as documentation, use as a portable information terminal, and the like, the use of the keyboard 1201 is convenient. When the housing 1001 and the housing 1002 which are put together to be lapped with each other (FIG. 27A) are developed by sliding as illustrated in FIG. 27C and the smartphone is used as a portable information terminal, smooth operation can be conducted by using the keyboard 1201 and the pointing device 1105. To the jack 1107 for an external connection terminal, an AC adaptor and various types of cables such as a USB cable can be connected, and charging and data communication with a personal computer or the like are possible. Moreover, by inserting a storage medium into the external memory slot 1202, a large amount of data can be stored and moved.

In the rear surface of the housing 1002 (FIG. 27B), the rear camera 1203 and the light 1204 are provided, and a still image and a moving image can be taken by using the display portion 1101 as a viewfinder.

Further, the smartphone may have an infrared communication function, a USB port, a function of receiving one segment television broadcast, a non-contact IC chip, an earphone jack, or the like, in addition to the above functions and structures.

By employing the display device described in the above embodiment mode, mass productivity of the smartphone can be increased.

(Embodiment Mode 10)

This embodiment mode describes a process for manufacturing a photoelectric conversion device using the microcrystalline semiconductor film described in Embodiment Modes 1 to 3 with reference to FIGS. 28A to 28C.

FIGS. 28A to 28C illustrate a process for manufacturing a photoelectric conversion device in which a plurality of photoelectric conversion unit cells is provided over a substrate having an insulating surface and the photoelectric conversion unit cells are connected to each other over the substrate. In FIG. 28A, a first electrode 12 is formed over a substrate 10. The first electrode 12 is separated into a plurality of insulated regions by openings $M_0$ to $M_n$. The openings $M_0$ to $M_n$ are formed by forming a conductive film over an entire surface of the substrate 10, and then etching the conductive film according to an opening pattern or directly processing the conductive film using an energy beam such as laser light.

As the substrate 10, a substrate which is given as an example of the substrate 40 in Embodiment Mode 1 can be used as appropriate. The first electrode 12 is formed of a transparent conductive material such as indium oxide, indium tin oxide, or zinc oxide. Further, in the case where the first electrode 12 is a reflecting electrode, the first electrode 12 is formed of a metal material such as aluminum, silver, titanium, or tantalum.

In the case where a conductive film, a semiconductor film, and an insulating film, which are formed over the substrate 10, are processed by laser processing, the processing is preferably performed by condensing laser light using an optical system for minute processing. In order to process a large-sized substrate efficiently, elongated opening patterns are formed by condensing laser light into a linear shape and performing irradiation with pulsed laser light one or plural times.

In FIG. 28A, after forming the openings $M_0$ to $M_n$ in the first electrode 12, a photoelectric conversion layer is formed. FIG. 28A illustrates the case in which a p-type semiconductor layer 14, an i-type semiconductor layer 16, and an n-type semiconductor layer 18 are formed in this order from the first electrode 12 side. When the p-type semiconductor layer 14, the i-type semiconductor layer 16, and the n-type semiconductor layer 18 are formed in a photoelectric conversion layer in accordance with Embodiment Modes 1 to 3, a p-type microcrystalline semiconductor film with high crystallinity, an i-type microcrystalline semiconductor film with high crystallinity, and an n-type microcrystalline semiconductor film with high crystallinity can be formed.

Next, as illustrated in FIG. 28B, openings $C_1$ to $C_n$ are formed in the photoelectric conversion layer. The openings $C_1$ to $C_n$ penetrate the p-type semiconductor layer 14, the i-type semiconductor layer 16, and the n-type semiconductor layer 18, and are formed so that top surfaces or side surfaces of the first electrodes 12 are exposed. The openings $C_1$ to $C_n$ are formed with a predetermined gap therebetween and are adjacent to the openings $M_0$ to $M_n$, respectively. This process can also be performed with laser processing.

Then, as illustrated in FIG. 28C, a second electrode 20 is formed. The second electrode 20 is separated by openings $S_1$ to $S_n$ and is electrically connected to the first electrode 12 through the openings $C_1$ to $C_n$. The openings $S_1$ to $S_n$ are formed with a predetermined gap therebetween and are adjacent to the openings $C_1$ to $C_n$. This process can also be performed with laser processing. In the case of performing laser processing, selective processing becomes easy when chromium having a sublimation property is used for the second electrode 20.

The second electrode 20 is formed of a metal material such as aluminum, silver, titanium, tantalum, or chromium. Note that in the case where light enters from the second electrode 20 side, the second electrode 20 is formed of a transparent conductive material.

Accordingly, an integrated structure in which a plurality of photoelectric conversion unit cells each having the photoelectric conversion layer between the first electrode 12 and the second electrode 20 is formed and photoelectric conversion unit cells are connected in series with the adjacent photoelectric conversion unit cells can be obtained.

After that, an extraction electrode 22 is provided over the second electrode 20 and is covered with a protective film 24. As described above, a photoelectric conversion device in which a plurality of photoelectric conversion unit cells is connected to each other over the substrates 10 can be obtained.

With the use of the microcrystalline semiconductor film with high crystallinity described in Embodiment Modes 1 to 3, a photoelectric conversion device in which deterioration in characteristics due to light hardly occurs can be obtained.

[Embodiment 1]

Figure 33:
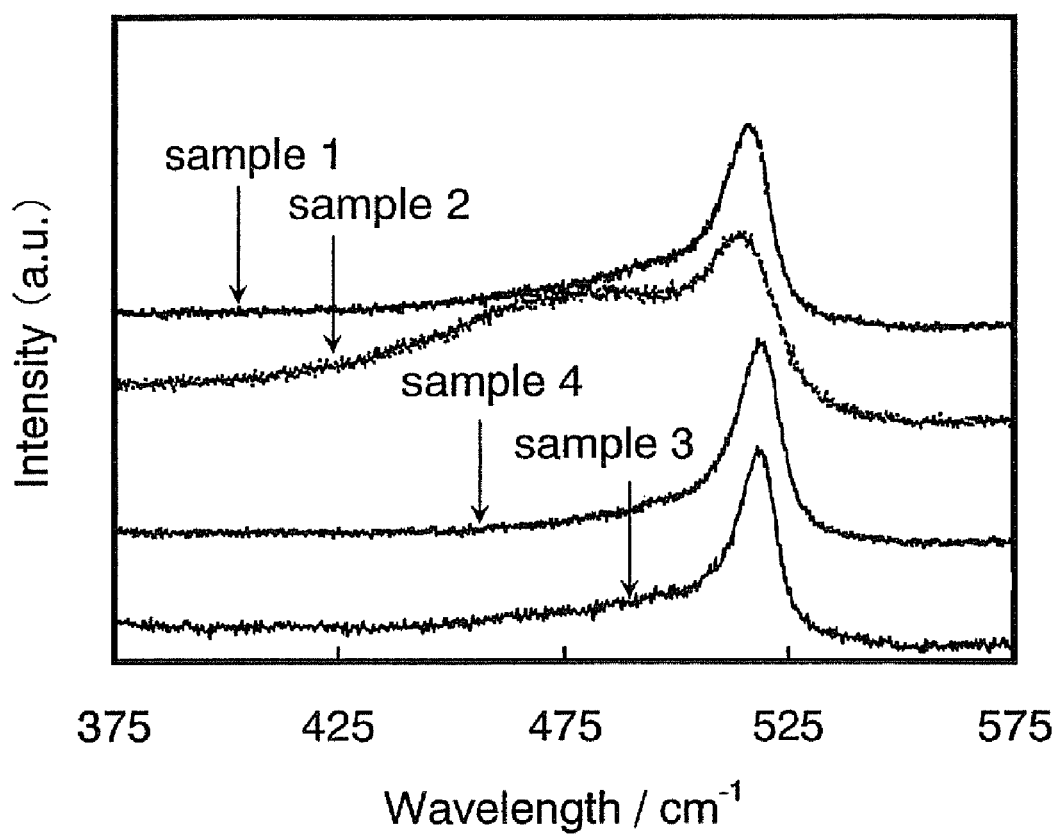
FIG. 33 is a diagram illustrating crystallinity of a microcrystalline semiconductor film of the present invention.

In this embodiment, a microcrystalline semiconductor film was formed, and FIG. 33 illustrates a result of measuring the crystallinity of the microcrystalline semiconductor film by Raman spectroscopy.

In this embodiment, as a sample 1, a sample in which a microcrystalline silicon film was formed over a silicon oxynitride film with a thickness of 100 nm formed over a glass substrate was manufactured.

Further, as a sample 2, a sample in which an amorphous silicon film was formed over a silicon oxynitride film with a thickness of 100 nm which was formed over a glass substrate and a microcrystalline silicon film was formed over the amorphous silicon film was manufactured.

Furthermore, as samples 3 and 4, samples in which an amorphous silicon film was formed over a silicon oxynitride film with a thickness of 100 nm which was formed over a glass substrate, the amorphous silicon film was exposed to fluorine plasma, and a microcrystalline silicon film was formed over the amorphous silicon film was manufactured. Note that the microcrystalline silicon film of the sample 3 was formed by a plasma CVD method using silane and hydrogen, and the microcrystalline silicon film of the sample 4 was formed by a plasma CVD method using silane, hydrogen, and fluorosilane.

In addition, the crystallinity of the microcrystalline silicon films of the samples was each measured by Raman spectroscopy.

(Film Formation Conditions for Sample 1)

The microcrystalline silicon film of the sample 1 was formed to a thickness of 50 nm by a plasma CVD method under film formation conditions where the RF power source frequency was 13.56 MHz, the film formation temperature was 280° C., the flow ratio of hydrogen to silane gas was 150:1, the pressure was 280 Pa, and the power of the RF power source was 50 W. FIG. 33 illustrates Raman scattering spectrum of the microcrystalline silicon film at this time.

The crystal peak position of the microcrystalline silicon film of the sample 1 was 516.7 cm$^{-1}$, the full width at half maximum (FWHM) was 10.2 cm$^{-1}$, and the crystalline/amorphous peak intensity ratio (Ic/Ia) was 3.5.

(Film Formation Conditions for Sample 2)

The amorphous silicon film of the sample 2 was formed to a thickness of 5 nm by a plasma CVD method under film formation conditions where the RF power source frequency was 13.56 MHz, the film formation temperature was 280° C., the flow ratio of hydrogen to silane gas was 15:14, the pressure was 170 Pa, and the power of the RF power source was 60 W.

Then, the microcrystalline silicon film was formed to a thickness of 50 nm by a plasma CVD method under film formation conditions where the RF power source frequency was 13.56 MHz, the film formation temperature was 280° C., the flow ratio of hydrogen to silane gas to fluorosilane was 200:1:10, the pressure was 280 Pa, and the power of the RF power source was 200 W. FIG. 33 illustrates Raman scattering spectrum of the microcrystalline silicon film at this time.

The crystal peak position of the microcrystalline silicon film of the sample 2 was 515.5 cm$^{-1}$, the full width at half maximum (FWHM) was 15.4 cm$^{-1}$, and the crystalline/amorphous peak intensity ratio (Ic/Ia) was 0.9.

(Film Formation Conditions for Sample 3)

The amorphous silicon film of the sample 3 was formed to a thickness of 5 nm by a plasma CVD method under film formation conditions where the RF power source frequency was 13.56 MHz, the film formation temperature was 280° C., the flow ratio of hydrogen to silane gas was 15:14, the pressure was 170 Pa, and the power of the RF power source was 60 W.

Next, plasma was generated in a reaction chamber of a plasma CVD apparatus under conditions where the flow ratio of hydrogen to fluorosilane was 200:1, the pressure was 280 Pa, and the power of the RF power source was 200 W, and then the amorphous silicon film was exposed to the plasma for 600 seconds.

Then, the microcrystalline silicon film was formed to a thickness of 50 nm by a plasma CVD method under film formation conditions where the RF power source frequency was 13.56 MHz, the film formation temperature was 280° C., the flow ratio of hydrogen to silane gas was 150:1, the pressure was 280 Pa, and the power of the RF power source was 50 W. FIG. 33 illustrates Raman scattering spectrum of the microcrystalline silicon film at this time.

The crystal peak position of the microcrystalline silicon film of the sample 3 was 517.9 cm$^{-1}$, the full width at half maximum (FWHM) was 9.5 cm$^{-1}$, and the crystalline/amorphous peak intensity ratio (Ic/Ia) was 4.4.

(Film Formation Conditions for Sample 4)

The amorphous silicon film of the sample 4 was formed to a thickness of 5 nm by a plasma CVD method under film formation conditions where the RF power source frequency was 13.56 MHz, the film formation temperature was 280° C., the flow ratio of hydrogen to silane gas was 15:14, the pressure was 170 Pa, and the power of the RF power source was 60 W.

Next, plasma was generated in a reaction chamber of a plasma CVD apparatus under conditions where the flow ratio of hydrogen to fluorosilane was 200:1, the pressure was 280 Pa, and the power of the RF power source was 200 W, and then the amorphous silicon film was exposed to the plasma for 600 seconds.

Then, the microcrystalline silicon film was formed to a thickness of 50 nm by a plasma CVD method under film formation conditions where the RF power source frequency was 13.56 MHz, the film formation temperature was 280° C., the flow ratio of hydrogen to silane gas and fluorosilane was 200:1:10, the pressure was 280 Pa, and the power of the RF power source was 200 W. FIG. 33 illustrates Raman scattering spectrum of the microcrystalline silicon film at this time.

The crystal peak position of the microcrystalline silicon film of the sample 4 was 517.5 cm$^{-1}$, the full width at half maximum (FWHM) was 11.2 cm$^{-1}$, and the crystalline/amorphous peak intensity ratio (Ic/Ia) was 5.2.

The sample 1 and the sample 4 were compared with each other. As a result, it was found that, as described in the present invention, when the microcrystalline silicon film was formed by a plasma CVD method using a deposition gas including silicon, which is silane here, a fluoride gas, which is fluorosilane here, and hydrogen after the amorphous silicon film was formed as a semiconductor film and then the amorphous silicon film was exposed to plasma, a microcrystalline silicon film with high crystallinity could be formed.

The sample 2 and the sample 4 were compared with each other. As a result, it was found that, as described in the present invention, when an amorphous silicon film was formed as a semiconductor film and then the amorphous silicon film was exposed to plasma, crystal nuclei with high crystallinity were formed and crystals grew based on the crystal nuclei, whereby a microcrystalline silicon film with high crystallinity could be formed.

The sample 3 and the sample 4 were compared with each other. As a result, it was found that, as described in the present invention, when a microcrystalline silicon film was formed based on crystal nuclei using a deposition gas including silicon, which is silane here, a fluoride gas, which is fluorosilane here, and hydrogen, a microcrystalline silicon film with high crystallinity could be formed.

That is, it was found that, according to the present invention, a microcrystalline silicon film with high crystallinity could be formed.

This application is based on Japanese Patent Application serial no. 2007-312670 filed with Japan Patent Office on Dec. 3, 2007, the entire contents of which are hereby incorporated by reference.

What is claimed is:

1. A method for manufacturing a microcrystalline semiconductor film comprising: forming a base film;
   exposing a surface of the base film to plasma, whereby an uneven surface with projections and depressions is formed at the surface of the base film;
   forming a semiconductor film on the uneven surface of the base film;
   etching a part of the semiconductor film by introducing at least one of fluorine, a fluoride gas, and hydrogen and by applying high-frequency power to form a plurality of crystal nuclei; and
   forming a microcrystalline semiconductor film from the plurality of crystal nuclei over the base film by introducing a gas including silicon or germanium, a fluoride gas, and hydrogen and by applying high-frequency power.

2. The method for manufacturing a microcrystalline semiconductor film according to claim 1, wherein the gas including silicon or germanium is $SiH_4$, $Si_2H_6$, $GeH_4$, or $Ge_2H_6$.

3. The method for manufacturing a microcrystalline semiconductor film according to claim 1, wherein the semiconductor film is an amorphous semiconductor film or a microcrystalline semiconductor film.

4. The method for manufacturing a microcrystalline semiconductor film according to claim 1, wherein the semiconductor film comprises an impurity element which serves as a donor.

5. The method for manufacturing a microcrystalline semiconductor film according to claim 4, wherein the impurity element is phosphorus, arsenic, or antimony.

6. The method for manufacturing a microcrystalline semiconductor film according to claim 4, wherein the semiconductor film comprising the impurity element is formed by introducing a gas including the impurity element and a gas including silicon or germanium and by applying high-frequency power.

7. The method for manufacturing a microcrystalline semiconductor film according to claim 1, wherein the part of the semiconductor film is an amorphous semiconductor component included in the semiconductor film.

8. The method for manufacturing a microcrystalline semiconductor film according to claim 1, wherein the fluoride gas which is introduced for forming the microcrystalline semiconductor film is $SiF_4$.

* * * * *